(12) United States Patent
Kato

(10) Patent No.: US 9,728,243 B2
(45) Date of Patent: Aug. 8, 2017

(54) SEMICONDUCTOR DEVICE OR ELECTRONIC COMPONENT INCLUDING THE SAME

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/149,291

(22) Filed: May 9, 2016

(65) Prior Publication Data

US 2016/0336055 A1  Nov. 17, 2016

(30) Foreign Application Priority Data

May 11, 2015  (JP) .................................. 2015-096294
May 12, 2015  (JP) .................................. 2015-097665

(51) Int. Cl.
*G11C 11/24* (2006.01)
*G11C 5/02* (2006.01)
(Continued)

(52) U.S. Cl.
CPC .............. *G11C 11/24* (2013.01); *G11C 5/025* (2013.01); *G11C 7/062* (2013.01);
(Continued)

(58) Field of Classification Search
CPC ....... G11C 11/24; G11C 11/565; G11C 11/56; G11C 11/4099; G11C 11/4094; G11C 7/062; G11C 7/14
See application file for complete search history.

(56) References Cited

U.S. PATENT DOCUMENTS 4,010,453 A * 3/1977 Lewis ................. G11C 11/4091
327/52
4,547,868 A * 10/1985 Childers ............. G11C 11/4099
327/57
(Continued)

FOREIGN PATENT DOCUMENTS

JP  2013-008431 A  1/2013
JP  2013-008936 A  1/2013

OTHER PUBLICATIONS

Ohmaru.T, "Eight-Bit CPU With Nonvolatile Registers Capable of Holding Data for 40 Days At 85° C. Using Crystalline In—Ga—Zn Oxide Thin Film Transistors", SSDM 2012 (Extended Abstracts of the 2012 International Conference on Solid State Devices and Materials), 2012, pp. 1144-1145.
(Continued)

*Primary Examiner* — Douglas King
(74) *Attorney, Agent, or Firm* — Fish & Richardson P.C.

(57) ABSTRACT

Provided is a semiconductor device including first to sixth capacitors, first to fourth wirings, first and second sense amplifiers, and a memory cell array over the first and second sense amplifiers. The first wiring is electrically connected to the memory cell array, one electrode of the first capacitor, the third wiring via a source and a drain of a first transistor, the fourth wiring via the fifth capacitor, and the second wiring via the first sense amplifier. The second wiring is electrically connected to one electrode of the second capacitor, the fourth wiring via a source and a drain of a second transistor, and the third wiring via the sixth capacitor. The third wiring is electrically connected to one electrode of the third capacitor, and the fourth wiring via the second sense amplifier. The fourth wiring is electrically connected to one electrode of the fourth capacitor.

13 Claims, 39 Drawing Sheets

(51) Int. Cl.
- H01L 29/786 (2006.01)
- H01L 27/12 (2006.01)
- G11C 11/4091 (2006.01)
- H01L 23/522 (2006.01)
- G11C 7/06 (2006.01)
- G11C 11/4094 (2006.01)
- G11C 11/4099 (2006.01)
- G11C 11/56 (2006.01)
- H01L 27/108 (2006.01)
- G11C 7/14 (2006.01)

(52) U.S. Cl.
CPC ...... *G11C 11/4091* (2013.01); *G11C 11/4094* (2013.01); *G11C 11/4099* (2013.01); *G11C 11/56* (2013.01); *G11C 11/565* (2013.01); *H01L 23/5223* (2013.01); *H01L 27/10814* (2013.01); *H01L 27/10817* (2013.01); *H01L 27/1207* (2013.01); *H01L 27/1225* (2013.01); *H01L 27/1255* (2013.01); *H01L 29/7869* (2013.01); *G11C 7/14* (2013.01)

(56) References Cited

U.S. PATENT DOCUMENTS

| | | | | |
|---|---|---|---|---|
| 6,337,824 | B1* | 1/2002 | Kono | G11C 11/406 257/E27.097 |
| 6,421,289 | B1* | 7/2002 | Lu | G11C 7/065 365/205 |
| 2007/0194323 | A1 | 8/2007 | Takano et al. | |
| 2012/0033483 | A1 | 2/2012 | Koyama | |
| 2012/0099368 | A1 | 4/2012 | Kamata | |
| 2012/0106226 | A1 | 5/2012 | Saito | |
| 2013/0070506 | A1* | 3/2013 | Kajigaya | G11C 7/18 365/51 |

OTHER PUBLICATIONS

Kobayashi.H et al., "Processor with 4.9-μs break-even time in power gating using crystalline In—Ga—Zn-oxide transistor", Cool Chips XVI, Apr. 17, 2013, pp. 1-3.

Sjokvist.N et al., "Zero Area Overhead State Retention Flip Flop Utilizing Crystalline In—Ga—Zn Oxide Thin Film Transistos with Simple Power Control Implemented in a 32-bit CPU", SSDM (Extended Abstracts of the 2013 International Conference on Solid State Devices and Materials), Sep. 24, 2013, pp. 1088-1089.

Tamura.H et al., "Embedded SRAM and Cortex-M0 Core with Backup Circuits Using a 60-nm Crystalline Oxide Semiconductor for Power Gating", IEEE Cool Chips XVII, Apr. 14, 2014, p. 3pages.

Isobe.A et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor", 2014 Symposium on VLSI Circuits Digest of Technical Papers, Jun. 10, 2014, pp. 49-50.

Atsumi.T et al., "DRAM Using Crystalline Oxide Semiconductor for Access Transistors and Not Requiring Refresh for More Than Ten Days", IMW 2012 (4th IEEE International Memory Workshop), 2012, pp. 99-102, IEEE.

Nagatsuka.S et al., "A 3bit/cell Nonvolatile Memory with Crystalline In—Ga—Zn—O TFT", IMW 2013 (5th IEEE International Memory Workshop), May 26, 2013, pp. 188-191.

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.

Matsuzaki.T et al., "A 128kb 4b/cell Nonvolatile Memory with Crystalline In—Ga—Zn Oxide FET Using Vt Cancel Write Method", ISSCC 2015 (Digest of Technical Papers. IEEE International Solid-State Circuits Conference), Feb. 22, 2015, pp. 306-308.

Kobayashi.Y et al., "Scaling to 100nm Channel Length of Crystalline In—Ga—Zn-Oxide Thin Film Transistors with Extremely Low Off-State Current", SSDM 2013 (Extended Abstracts of the 2013 International Conference on Solid State Devices and Materials), Sep. 24, 2013, pp. 930-931.

Yakubo.Y et al., "High-speed and Low-leakage Characteristics of 60-nm C-axis Aligned Crystalline Oxide Semiconductor FET with GHz-ordered Cutoff Frequency", SSDM 2014 (Extended Abstracts of the 2014 International Conference on Solid State Devices and Materials), Sep. 8, 2014, pp. 648-649.

Murotani.T et al., "A 4-level storage 4Gb DRAM", ISSCC 97 (Digest of Technical Papers. IEEE International Solid-State Circuits Conference), Feb. 6, 1997, pp. 74-75.

* cited by examiner 4 bit per 1 cell

1 Word

4th OS Layer NOSRAM | 3rd OS Layer NOSRAM | 2nd OS Layer NOSRAM | 1st OS Layer NOSRAM

6100

6000

4th OS Layer
3rd OS Layer
2nd OS Layer
1st OS Layer
Si CMOS Layer

TC3-2

1680

1680

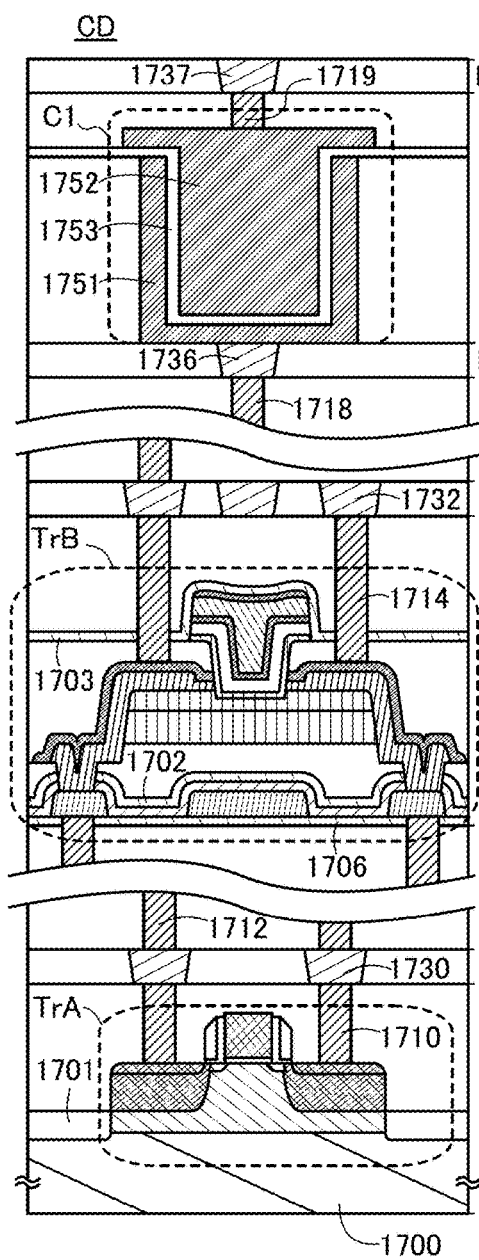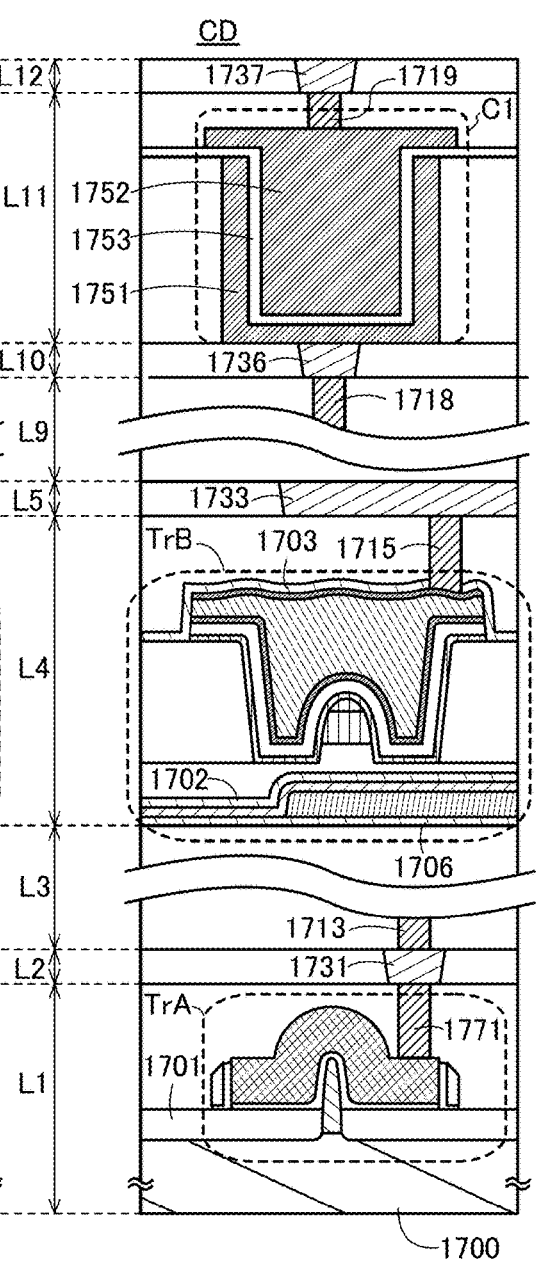

FIG. 32A  out-of-plane method
CAAC-OS
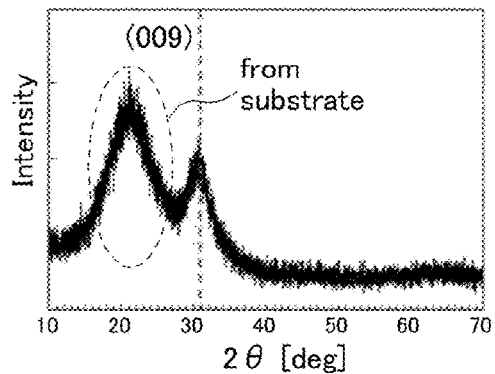
FIG. 32B  in-plane method
φ scan
CAAC-OS
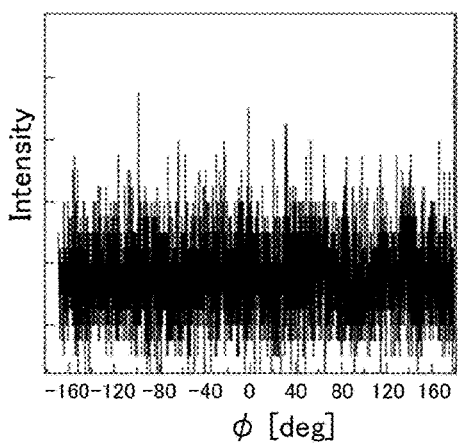
FIG. 32C  in-plane method
φ scan
single crystalOS
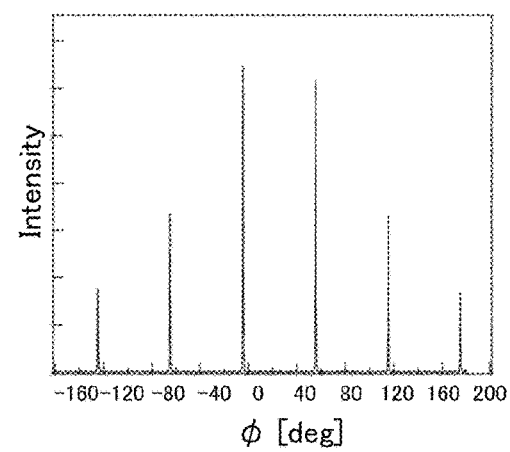
FIG. 32D
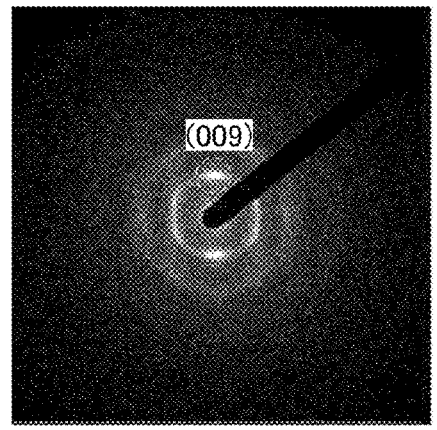
FIG. 32E
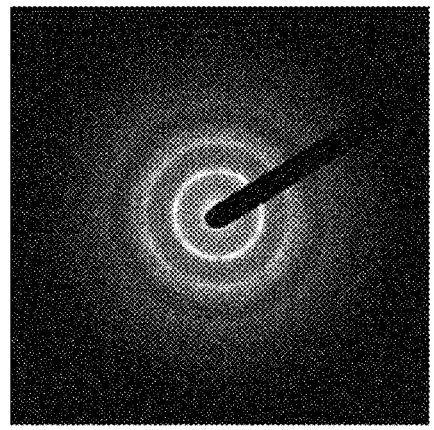

4000

4000

4000

4000

4000

4000

SEMICONDUCTOR DEVICE OR ELECTRONIC COMPONENT INCLUDING THE SAME

BACKGROUND OF THE INVENTION

1. Field of the Invention

One embodiment of the present invention relates to a semiconductor device or an electronic component including the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, and sensors have been used in various electronic devices, e.g., personal computers, smart phones, and digital cameras, and improvement thereof has been promoted for the sake of miniaturization, lower power consumption, and any other objective.

In particular, with a reduction in the size of electronic devices, semiconductor devices in the electronic devices have seen a need for miniaturization. In memory devices, for example, a memory cell employs a three-dimensional structure (stacked structure), or processes multilevel data.

REFERENCES

Patent Documents

[Patent Document 1] Japanese Published Patent Application No. 2013-8431

[Patent Document 2] Japanese Published Patent Application No. 2013-8936

[Non-Patent Document 1] T. Ohmaru et al., "Eight-bit CPU with Nonvolatile Registers Capable of Holding Data for 40 Days at 85° C. Using Crystalline In—Ga—Zn Oxide Thin Film Transistors," Ext. Abstr. Solid-State Devices and Materials, 2012, pp. 1144-1145.

[Non-Patent Document 2] H. Kobayashi et al., "Processor with 4.9-μs break-even time in power gating using crystalline In—Ga—Zn-oxide transistor," Cool Chips XVI, Session VI, 2013.

[Non-Patent Document 3] S. Niclas et al., "Zero Area Overhead State Retention Flip Flop Utilizing Crystalline In—Ga—Zn Oxide Thin Film Transistor with Simple Power Control Implemented in a 32-bit CPU," Ext. Abstr. Solid-State Devices and Materials, 2013, pp. 1088-1089.

[Non-Patent Document 4] H. Tamura et al., "Embedded SRAM and Cortex-M0 Core with Backup Circuits Using a 60-nm Crystalline Oxide Semiconductor for Power Gating," COOL Chips XVII, Session XII, 2014.

[Non-Patent Document 5] A. Isobe et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor," IEEE Symp. VLSI circuits, 2014, pp. 49-50.

[Non-Patent Document 6] T. Atsumi et al., "DRAM Using Crystalline Oxide Semiconductor for Access Transistors and not Requiring Refresh for More Than Ten Days," International Memory Workshop, 2012, pp. 99-102.

[Non-Patent Document 7] S. Nagatsuka et al., "A 3 bit/cell Nonvolatile Memory with Crystalline In—Ga—Zn—O TFT," International Memory Workshop, 2013, pp. 188-191.

[Non-Patent Document 8] T. Ishizu et al., "SRAM with C-Axis Aligned Crystalline Oxide Semiconductor: Power Leakage Reduction Technique for Microprocessor Caches," International Memory Workshop, 2014, pp. 103-106.

[Non-Patent Document 9] T. Onuki et al., "DRAM with Storage Capacitance of 3.9 fF using CAAC-OS Transistor with L of 60 nm and having More Than 1-h Retention Characteristics," Ext. Abstr. Solid-State Devices and Materials, 2014, pp. 430-431.

[Non-Patent Document 10] T. Matsuzaki et al., "A 128 kb 4 bit/cell nonvolatile memory with crystalline In—Ga—Zn oxide FET using Vt cancel write method," ISSCC Dig. Tech. Papers, pp. 306-307, February, 2015.

[Non-Patent Document 11] Y. Kobayashi et al., "Scaling to 100 nm Channel Length of Crystalline In—Ga—Zn-Oxide Thin Film Transistors with Extremely Low Off-State Current," Ext. Abstr. Solid-State Devices and Materials, 2013, pp. 930-931.

[Non-Patent Document 12] Y. Yakubo et al., "High-speed and Low-leakage Characteristics of 60-nm C-axis Aligned Crystalline Oxide Semiconductor FET with GHz-ordered Cutoff Frequency," Ext. Abstr. Solid-State Devices and Materials, 2014, pp. 648-649.

[Non-Patent Document 13] T. Murotani, I. Naritake, T. Matano, T. Ohsuki, N. Kasai, H. Koga, K. Koyama, K. Nakajima, H. Yamaguchi, H. Watanabe, and T. Okuda, "A 4-level storage 4Gb DRAM," Digest of Technical Papers. 43rd ISSCC, pp. 74-75.

SUMMARY OF THE INVENTION

A multilevel memory cell refers to a memory cell capable of processing three- or more-level data. For example, in a memory cell capable of processing four-level data, the amount of data to be processed is twice as large as that in a two-level memory cell, reducing the effective area of the memory cell to half.

To achieve a multilevel memory device, unlike in a two-level memory device, a high-level potential, a low-level potential, and another potential need to be handled. For example, a three-level memory device needs to handle potentials of three levels: a high level, a middle level, and a low level. For another example, an eight-level memory device needs to handle a high-level potential, a low-level potential, and six other potentials between the low-level potential and the high-level potential. An increased number of potentials to be handled reduces the difference between potentials of data to be written or read. Therefore, the potential that is handled in writing and reading operations should be maintained without any change.

The potential varies with some factors: for example, a maintained potential sometimes varies because of a leakage current in a memory cell; and the parasitic capacitance of a wiring sometimes causes a potential change in data writing and reading.

In the case of using a volatile memory, a method of constantly supplying power to a memory cell is employed in some cases in order to prevent a change in the potential held by the memory cell. When this method is employed, the power consumption might be increased.

A multilevel dynamic random access memory (DRAM) is considered below. As for the multilevel DRAM, a device structure (see Patent Document 1) and a driving method (see Patent Document 2) have been disclosed. In addition, a reading operation has also been reported (see Non-Patent Document 13).

In general, the reading operation of a DRAM includes the step of discharging a memory cell to read data (destructive read) and the step of charging the memory cell to refresh stored data. At this time, the capacitance (including parasitic capacitance or the like) of a wiring connected to the memory cell might cause a difference between the stored data in the reading step and that in the refreshing step. The multilevel DRAM particularly has a narrow range of potentials indicating information; a smaller difference in potentials is more likely to cause a difference between the stored data in the reading step and that in the refreshing step.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel memory device, a novel module, a novel electronic device, a novel system, and the like.

An object of one embodiment of the present invention is to provide a miniaturized semiconductor device. Another object of one embodiment of the present invention is to provide a semiconductor device capable of maintaining stored data without any change. Another object of one embodiment of the present invention is to provide a semiconductor device with low power consumption.

Note that the objects of one embodiment of the present invention are not limited to those listed above. The above objects do not exclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the above objects and the other objects.

(1) One embodiment of the present invention is a semiconductor device including a circuit and a first memory cell. The circuit includes a first transistor, a second transistor, first to sixth capacitors, first to fourth wirings, a first sense amplifier, and a second sense amplifier. The first sense amplifier includes a first input/output terminal and a second input/output terminal. The second sense amplifier includes a third input/output terminal and a fourth input/output terminal. Capacitance $C_1$ of the first capacitor, capacitance $C_2$ of the second capacitor, capacitance $C_3$ of the third capacitor, and capacitance $C_4$ of the fourth capacitor satisfy Formula (a1) below. Capacitance $C_5$ of the fifth capacitor and capacitance $C_6$ of the sixth capacitor satisfy Formula (a2) below. The first memory cell is positioned over the first sense amplifier and the second sense amplifier. The first wiring is electrically connected to a first electrode of the first capacitor, one of a source and a drain of the first transistor, a first electrode of the fifth capacitor, and the first input/output terminal. The second wiring is electrically connected to a first electrode of the second capacitor, one of a source and a drain of the second transistor, a first electrode of the sixth capacitor, and the second input/output terminal. The third wiring is electrically connected to a first electrode of the third capacitor, the other of the source and the drain of the first transistor, a second electrode of the sixth capacitor, and the third input/output terminal. The fourth wiring is electrically connected to a first electrode of the fourth capacitor, the other of the source and the drain of the second transistor, a second electrode of the fifth capacitor, and the fourth input/output terminal. The first memory cell is electrically connected to the first wiring.

$$C_1:C_2:C_3:C_4=2:2:1:1 \quad (a1)$$

$$C_5:C_6=1:1 \quad (a2)$$

(2) One embodiment of the present invention is the semiconductor device according to (1), further including a first dummy cell. The first dummy cell has the same structure as the first memory cell. The first dummy cell is positioned over the first sense amplifier and the second sense amplifier. The first dummy cell is electrically connected to the third wiring.

(3) One embodiment of the present invention is the semiconductor device according to (1), further including a second memory cell. The second memory cell has the same structure as the first memory cell. The second memory cell is positioned over the first sense amplifier and the second sense amplifier. The second memory cell is electrically connected to the third wiring.

(4) One embodiment of the present invention is the semiconductor device according to (3), further including a first dummy cell and a second dummy cell. The first dummy cell and the second dummy cell each have the same structure as the first memory cell. The first dummy cell and the second dummy cell are positioned over the first sense amplifier and the second sense amplifier. The first dummy cell is electrically connected to the third wiring. The second dummy cell is electrically connected to the first wiring.

(5) One embodiment of the present invention is the semiconductor device according to any one of (1) to (4), in which the first transistor and the second transistor are positioned over the first sense amplifier and the second sense amplifier and at least one of the first transistor and the second transistor includes an oxide semiconductor in a channel formation region.

(6) One embodiment of the present invention is the semiconductor device according to any one of (1) to (4), in which at least one of the first transistor and the second transistor includes silicon in a channel formation region.

(7) One embodiment of the present invention is the semiconductor device according to any one of (1) to (6), in which the first memory cell and the second memory cell each include a seventh capacitor and the first to seventh capacitors are positioned over the first sense amplifier and the second sense amplifier.

(8) One embodiment of the present invention is a semiconductor device including a circuit and first to third memory cells. The circuit includes first to fourth transistors, first to eighth capacitors, first to sixth wirings, a first sense amplifier, and a second sense amplifier. The first sense amplifier includes a first input/output terminal and a second input/output terminal. The second sense amplifier includes a third input/output terminal and a fourth input/output terminal. Capacitance $C_1$ of the first capacitor, capacitance $C_2$ of the second capacitor, capacitance $C_3$ of the third capacitor, capacitance $C_4$ of the fourth capacitor, capacitance $C_5$ of the fifth capacitor, and capacitance $C_6$ of the sixth capacitor satisfy Formula (a3) below. Capacitance $C_7$ of the seventh capacitor and capacitance $C_8$ of the eighth capacitor satisfy Formula (a4) below. The first to third memory cells are positioned over the first sense amplifier and the second sense amplifier. The first wiring is electrically connected to a first electrode of the first capacitor, one of a source and a drain of the first transistor, a first electrode of the seventh capacitor, and the first input/output terminal. The second wiring is electrically connected to a first electrode of the second capacitor, one of a source and a drain of the second transistor, a first electrode of the eighth capacitor, and the second input/output terminal. The third wiring is electrically connected to a first electrode of the third capacitor, the other of the source and the drain of the first transistor, and one of a source and a drain of the third transistor. The fourth wiring is electrically connected to a first electrode of the fourth capacitor, the other of the source and the drain of the second transistor, and one of a source and a drain of the fourth transistor. The fifth wiring is electrically connected to a first electrode of the fifth capacitor, the other of the source and the drain of the third transistor, a second electrode of the eighth capacitor, and the third input/output terminal. The sixth wiring is electrically connected to a first electrode of the sixth capacitor, the other of the source and the drain of the fourth transistor, a second electrode of the seventh capacitor, and the fourth input/output terminal. The first memory cell is electrically connected to the first wiring. The second memory cell is electrically connected to the third wiring. The third memory cell is electrically connected to the fifth wiring.

$$C_1:C_2:C_3:C_4:C_5:C_6=1:1:1:1:1:1 \quad (a3)$$

$$C_7:C_8=1:1 \quad (a4)$$

(9) One embodiment of the present invention is the semiconductor device according to (8), in which the first to fourth transistors are positioned over the first sense amplifier and the second sense amplifier and at least one of the first to fourth transistors includes an oxide semiconductor in a channel formation region

(10) One embodiment of the present invention is the semiconductor device according to (8), in which at least one of the first to fourth transistors includes silicon in a channel formation region.

(11) One embodiment of the present invention is the semiconductor device according to any one of (8) to (10), in which the first to third memory cells each include a ninth capacitor and the first to ninth capacitors are positioned over the first sense amplifier and the second sense amplifier.

(12) One embodiment of the present invention is the semiconductor device according to any one of (1) to (11), in which the first to third memory cells each include a fifth transistor and the fifth transistor includes an oxide semiconductor in a channel formation region.

(13) One embodiment of the present invention is an electronic component including the semiconductor device according to any one of (1) to (12) and a processor core.

FIG. 2C is a schematic view of a stacked-layer structure of a nonvolatile memory that is manufactured using transistors whose channel formation regions include an oxide semiconductor (hereinafter referred to as OS-FETs). Note that in the present specification, a nonvolatile memory using OS-FETs is sometimes referred to as a nonvolatile oxide semiconductor random access memory (NOSRAM).

FIGS. 2A and 2B are conceptual diagrams illustrating the case where NOSRAMs are stacked to provide a multi-level memory device. When a one-layer NOSRAM is a minimum unit of a memory cell, J-bit ($2^J$ values, where J is an integer of 1 or more) data is stored in one memory cell, and the memory cells are stacked in K layers (K is an integer of 2 or more), the NOSRAMs can retain J×K-bit ($2^{J \times K}$ values) data in total. FIG. 2B is a conceptual diagram illustrating the case where one memory cell stores 4-bit data (J=4). FIG. 2A is a conceptual diagram illustrating the case where the above memory cells are stacked in four layers (K=4) and 4×4=16 bits are assumed as one word.

The circuit diagram in FIG. 2D shows a configuration example of a memory cell 6100 that can retain the above J-bit data. The memory cell 6100 preferably includes a transistor OS1, a transistor OS2, and a capacitor C0. One of a source and a drain of the transistor OS1 is electrically connected to a gate of the transistor OS2. One terminal of the capacitor C0 is electrically connected to the gate of the transistor OS2.

The transistors OS1 and OS2 are preferably OS-FETs. An OS-FET has an extremely low off-state current; thus, data written in the gate of the transistor OS2 can be retained for a long time by turning off the transistor OS1.

Each of the transistors OS1 and OS2 preferably has a first gate and a second gate (BG). The first gate preferably includes a region which overlaps with the second gate with a channel formation region provided therebetween. When the transistors OS1 and OS2 each have a second gate, the threshold voltages of the transistors can be controlled. Moreover, on-state current of the transistors can be increased.

The schematic view in FIG. 2C illustrates a structure example of a memory device 6000. The memory device 6000 includes the memory cells 6100 that are stacked. The memory device 6000 includes a CMOS layer including Si transistors and first to fourth OS layers including OS-FETs. The first to fourth OS layers are formed over the CMOS layer. The first to fourth OS layers each include the memory cell 6100. The CMOS layer has a function of controlling the memory cells.

FIG. 3 illustrates detailed configuration examples of the first OS layer and the second OS layer in the memory device 6000. The left half of FIG. 3 shows circuit diagrams and the right half of FIG. 3 shows cross-sectional views corresponding to the circuit diagrams.

In the first OS layer, the gate of the transistor OS1 is electrically connected to a wiring WL1. The other of the source and the drain of the transistor OS1 is electrically connected to a wiring BL1. One of a source and a drain of the transistor OS2 is electrically connected to a wiring SL1. The other of the source and the drain of the transistor OS2 is electrically connected to a wiring RBL1. The other terminal of the capacitor C0 is electrically connected to a wiring CNODE1.

In the second OS layer, the gate of the transistor OS1 is electrically connected to a wiring WL2. The other of the source and the drain of the transistor OS1 is electrically connected to a wiring BL2. One of the source and the drain of the transistor OS2 is electrically connected to a wiring SL2. The other of the source and the drain of the transistor OS2 is electrically connected to a wiring RBL2. The other terminal of the capacitor C0 is electrically connected to a wiring CNODE2.

A structure similar to that shown in FIG. 3 is applicable to the third OS layer and the fourth OS layer.

A flash memory has a limit on the number of times of data rewriting and needs to erase old data when retained data is updated. The memory device 6000 does not have a limit on the number of times of data rewriting, and data can be rewritten $10^{12}$ times or more. In addition, new data can be written in the memory device 6000 without erasing old data. The memory device 6000 can write and read data at a lower voltage than a flash memory. Since OS-FETs can be easily stacked, the memory device 6000 can easily become a multi-level memory device.

Table 1 shows the technology node of the OS-FET included in the NOSRAM, the area occupied by the memory cell 6100 ($F^2$/cell, Cell area), and the area per bit of the memory cell 6100 ($F^2$/bit, Area per bit). Note that as the area per bit (hereinafter referred to as bit area), values obtained when the memory cells 6100 are stacked in four layers as illustrated in FIG. 2C are listed. Note that the technology node of an OS-FET primarily means the channel length of the OS-FET. Table 1 also shows, for comparison, values of a solid state drive (SSD) with 256 GB (gigabytes) fabricated using a three-dimensional NAND flash memory.

TABLE 1

| Technology node (Design rule) | $F^2$/cell | $F^2$/bit (4-layered) | Cell Area | Area per bit (4-layered) |
|---|---|---|---|---|
| 10 nm | ≥16.5 | ≥1.03 | 0.0016 μm² (1600 nm²) | 0.00010 μm² (100 nm²) |
| 15 nm | ≥16.5 | ≥1.03 | 0.0037 μm² (3700 nm²) | 0.00023 μm² (230 nm²) |
| 30 nm | ≥16.5 | ≥1.03 | 0.0150 μm² (15000 nm²) | 0.00095 μm² (950 nm²) |
| 3D-NAND | ≥5.2 | ≥2.6 | 0.0179 μm² (17900 nm²) | 0.00028 μm² (280 nm²) |

Next, the bit area as a function of the number of stacked layers of the memory cells 6100 is discussed. FIG. 4 is a graph whose vertical axis represents the bit area and whose horizontal axis represents the number of stacked layers of the memory cells 6100. From FIG. 4, the memory cells 6100 each of which is manufactured using an OS-FET with the 15-nm node and which are stacked in four layers have substantially the same bit area as a 256-GB SSD. Furthermore, the memory cells 6100 each of which is manufactured using an OS-FET with the 10-nm node and which are stacked in six layers have substantially the same bit area as a 1-TB (terabyte) SSD.

FIG. 5 shows a change in channel length of OS-FETs based on Non-Patent Documents 1 to 12. In FIG. 5, 1) to 12) respectively denote the channel lengths of OS-FETs disclosed in Non-Patent Documents 1 to 12. From FIG. 5, the scaling of OS-FETs is such that the channel length is reduced by half in six months. For comparison, FIG. 5 also shows an example of Si transistors (hereinafter referred to as Si-FETs). The OS-FETs are miniaturized in a shorter period than the Si-FETs. FIG. 5 also reveals that the channel length of OS-FETs can reach that of Si-FETs in 2016.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to another embodiment of the present invention, a novel memory device, a novel module, a novel electronic device, a novel system, and the like can be provided.

According to one embodiment of the present invention, a miniaturized semiconductor device can be provided. According to another embodiment of the present invention, a semiconductor device capable of maintaining stored data without any change can be provided. According to another embodiment of the present invention, a semiconductor device with low power consumption can be provided.

Note that the effects of one embodiment of the present invention are not limited to those listed above. The above effects do not exclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Hence, one embodiment of the present invention does not have the above effects in some cases.

BRIEF DESCRIPTION OF THE DRAWINGS

FIGS. 29A and 29B are cross-sectional views showing structure examples of a memory cell.

FIGS. 32A to 32E show structural analysis of a CAAC-OS and a single crystal oxide semiconductor by XRD and selected-area electron diffraction patterns of a CAAC-OS.

DETAILED DESCRIPTION OF THE INVENTION

In this specification, an oxide semiconductor is referred to as an OS in some cases. Thus, a transistor including an oxide semiconductor in a channel formation region is referred to as an OS transistor in some cases.

Embodiment 1

In this embodiment, a structure example and operation examples of a semiconductor device of one embodiment of the present invention are described.
<Structure Example 1>

Figure 1:
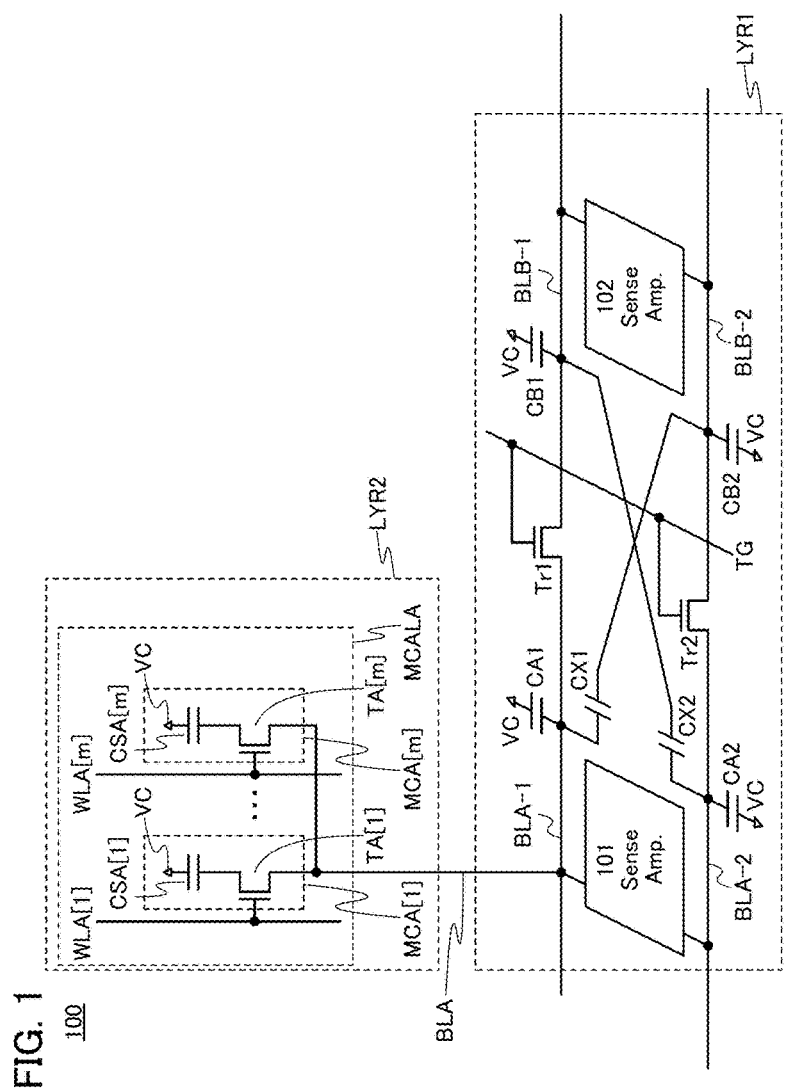
FIG. 1 is a circuit diagram showing an example of a semiconductor device.
Figure 2B:
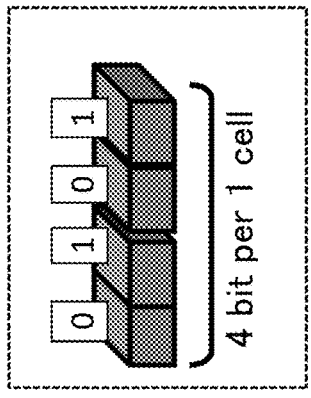
FIGS. 2A to 2D are conceptual diagrams, a schematic view, and a circuit diagram showing a configuration example of a memory device.
Figure 2A:
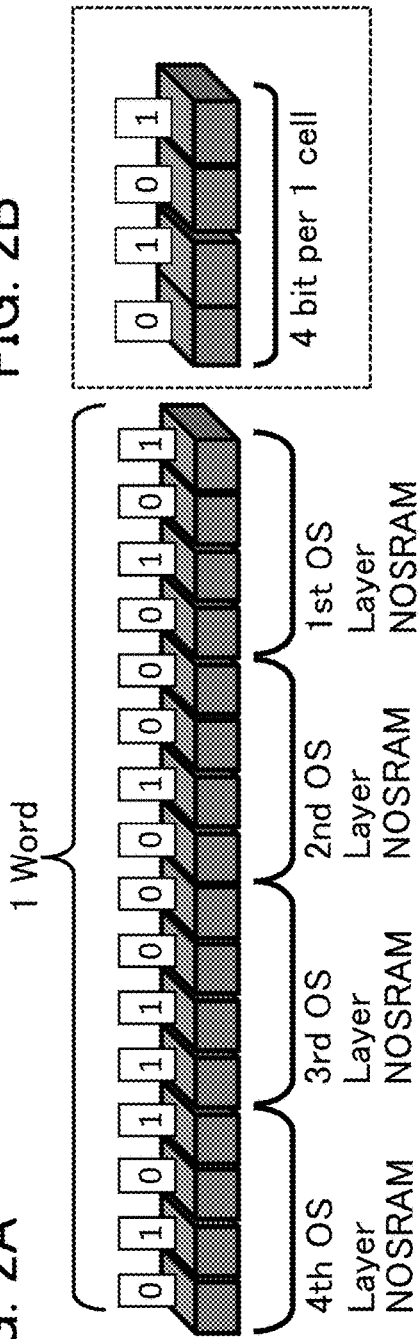
Figure 2D:
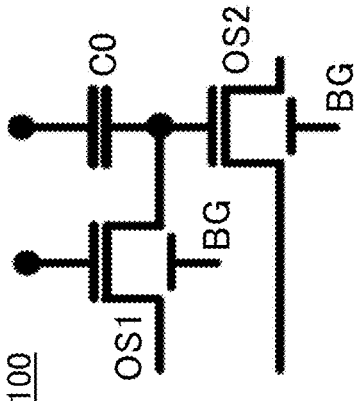
Figure 2C:
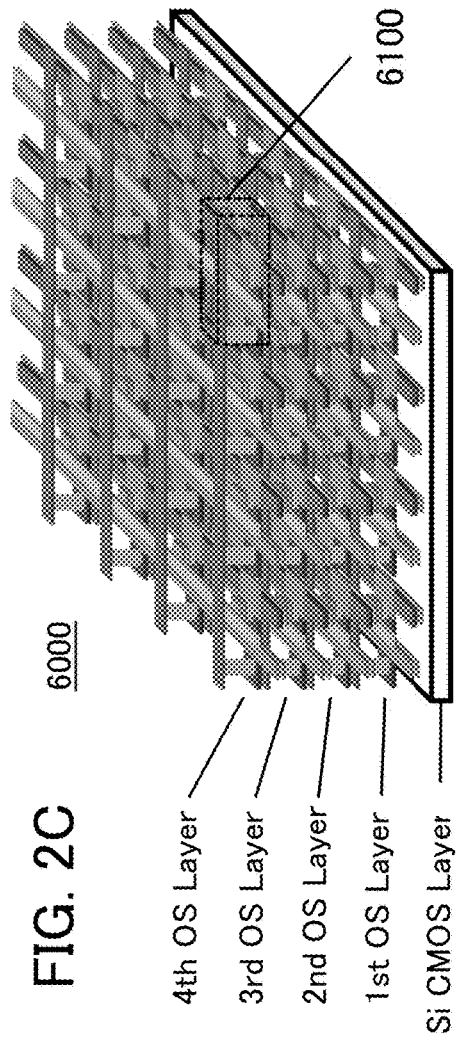
Figure 3:
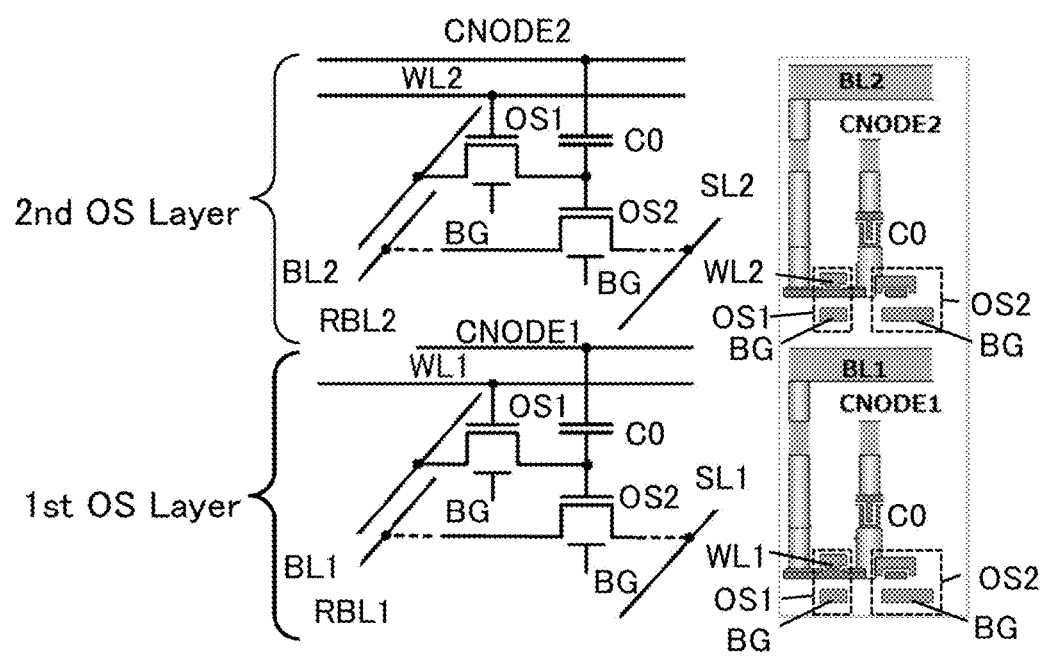
FIG. 3 shows circuit diagrams and cross-sectional views showing a configuration example of a memory device.
Figure 4:
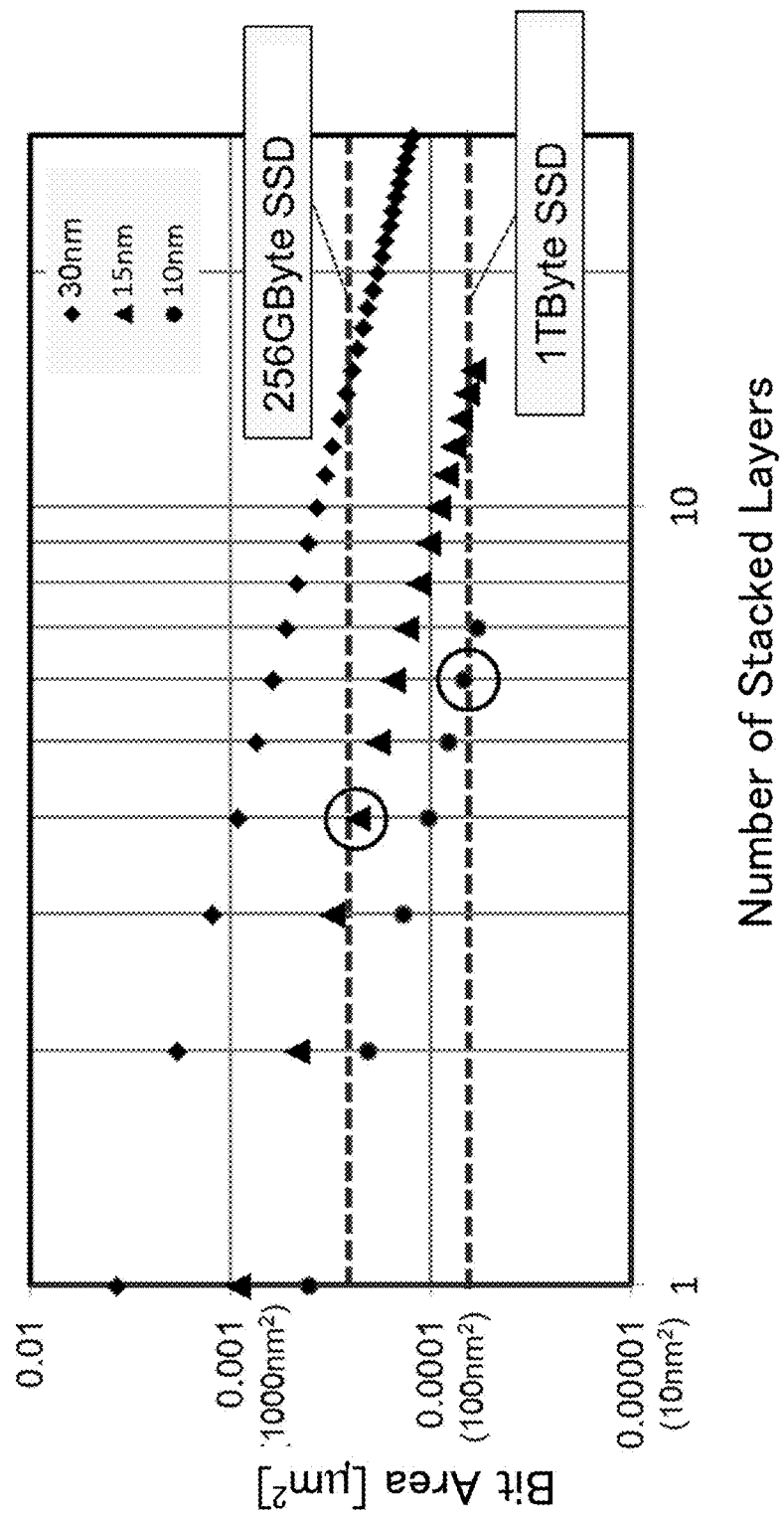
FIG. 4 shows a relation between the number of stacked layers of memory cells and bit area of a memory device.
Figure 5:
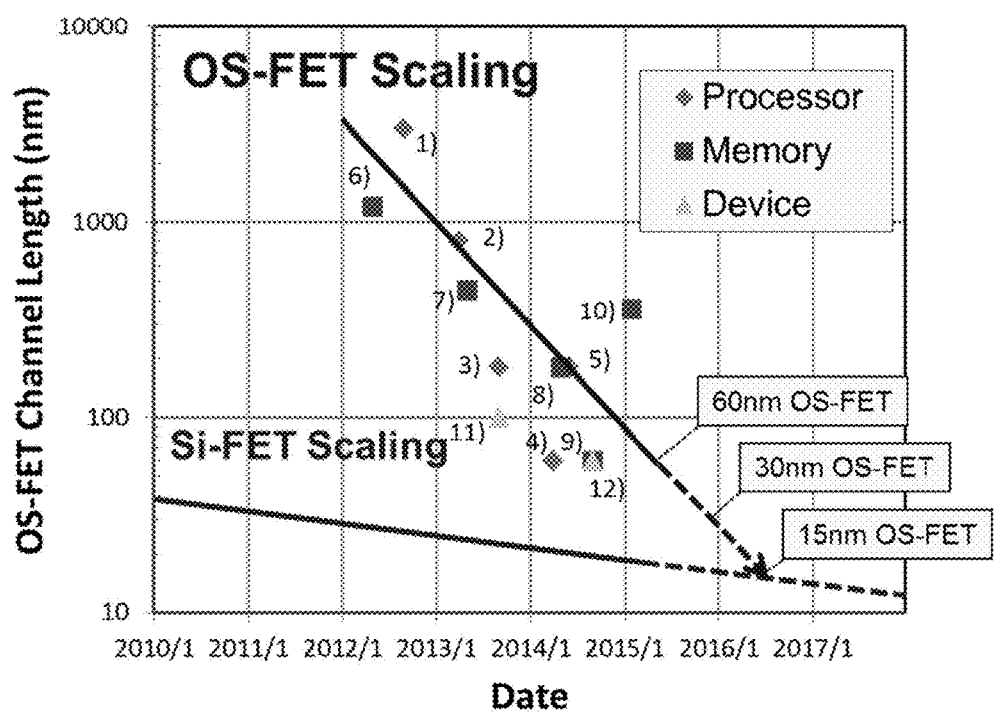
FIG. 5 shows changes in channel length of an OS-FET.
Figure 6:
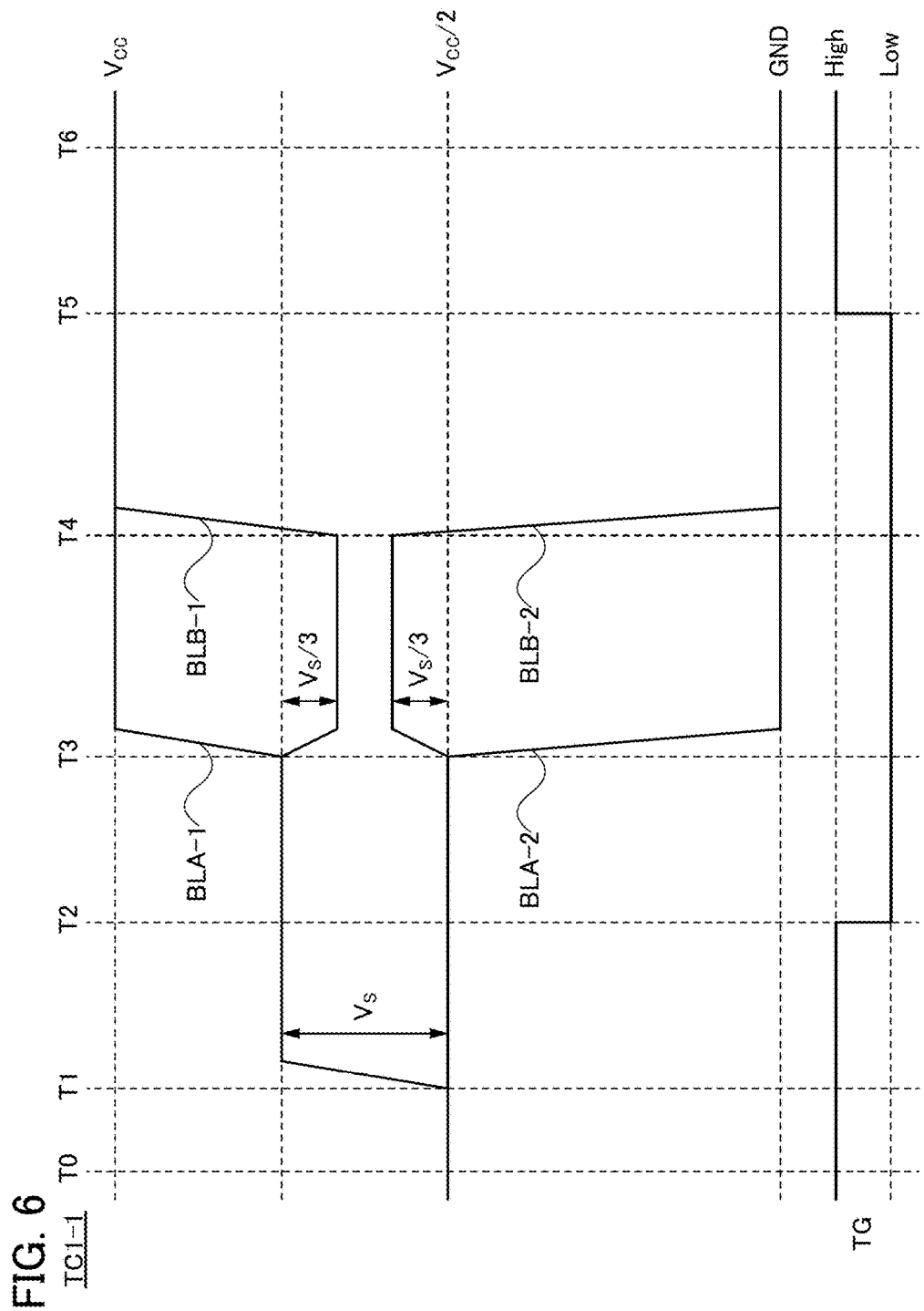
FIG. 6 is a timing chart showing an operation example of the semiconductor device shown in FIG. 1.
Figure 7:
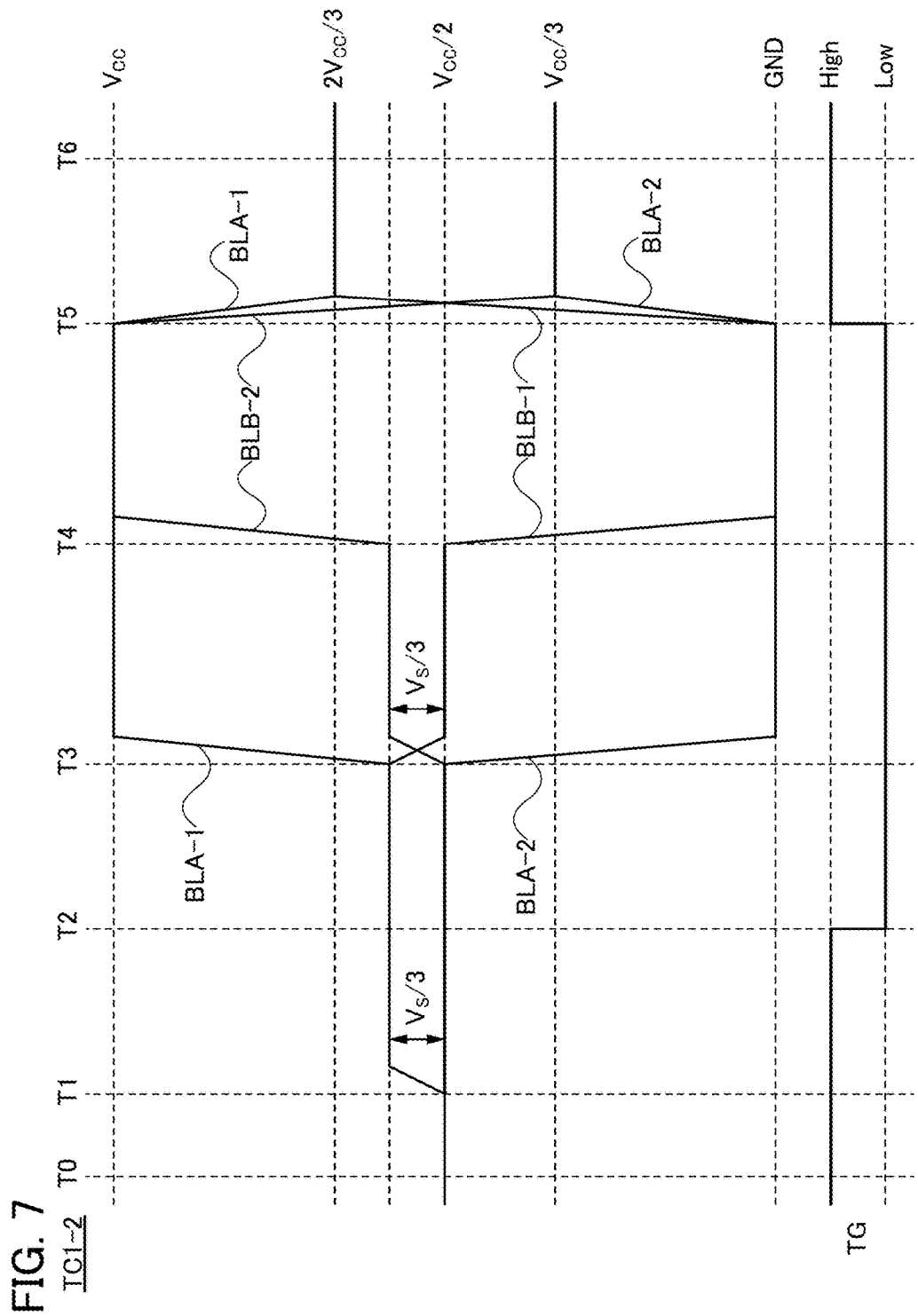
FIG. 7 is a timing chart showing an operation example of the semiconductor device shown in FIG. 1.
Figure 8:
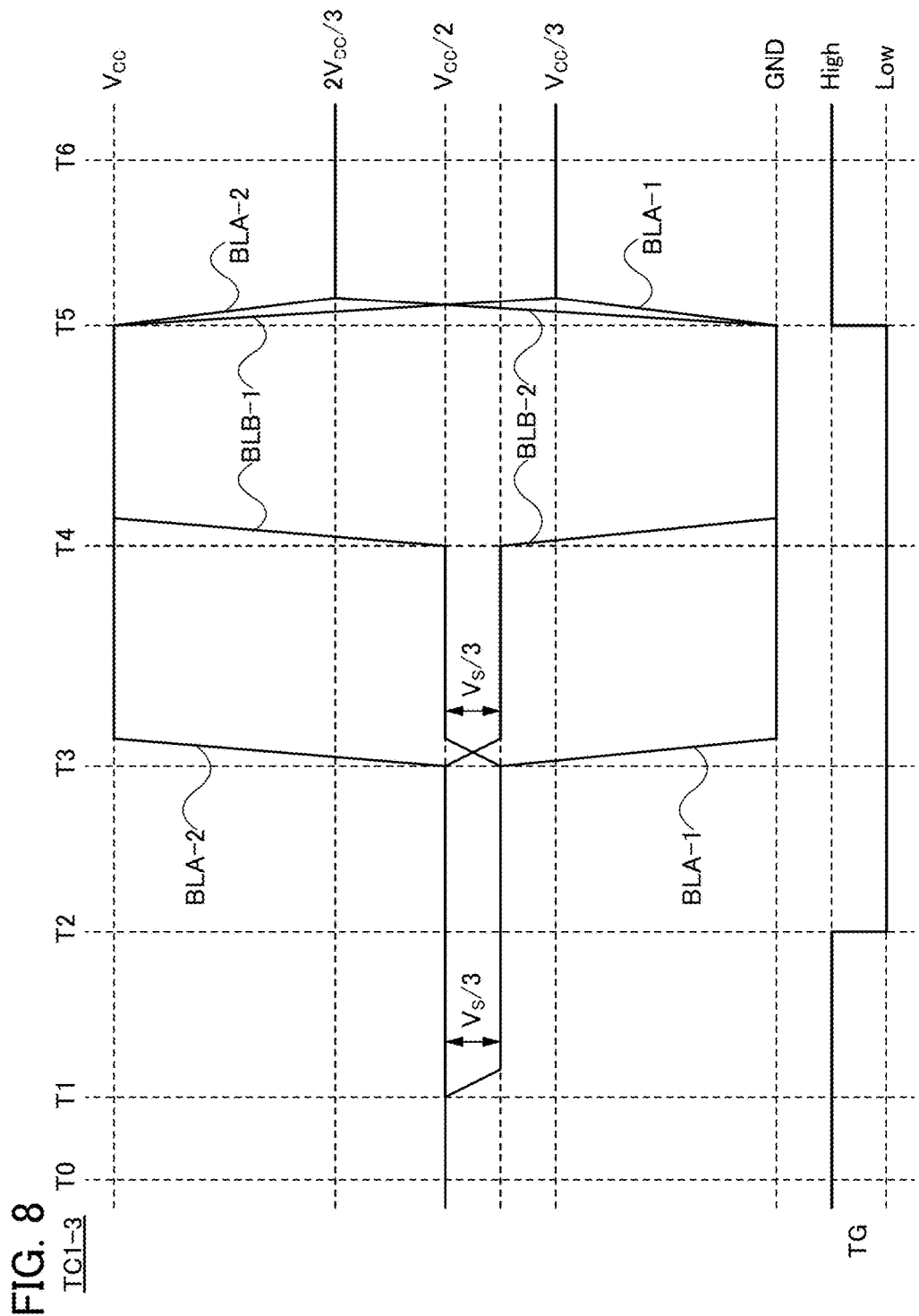
FIG. 8 is a timing chart showing an operation example of the semiconductor device shown in FIG. 1.
Figure 9:
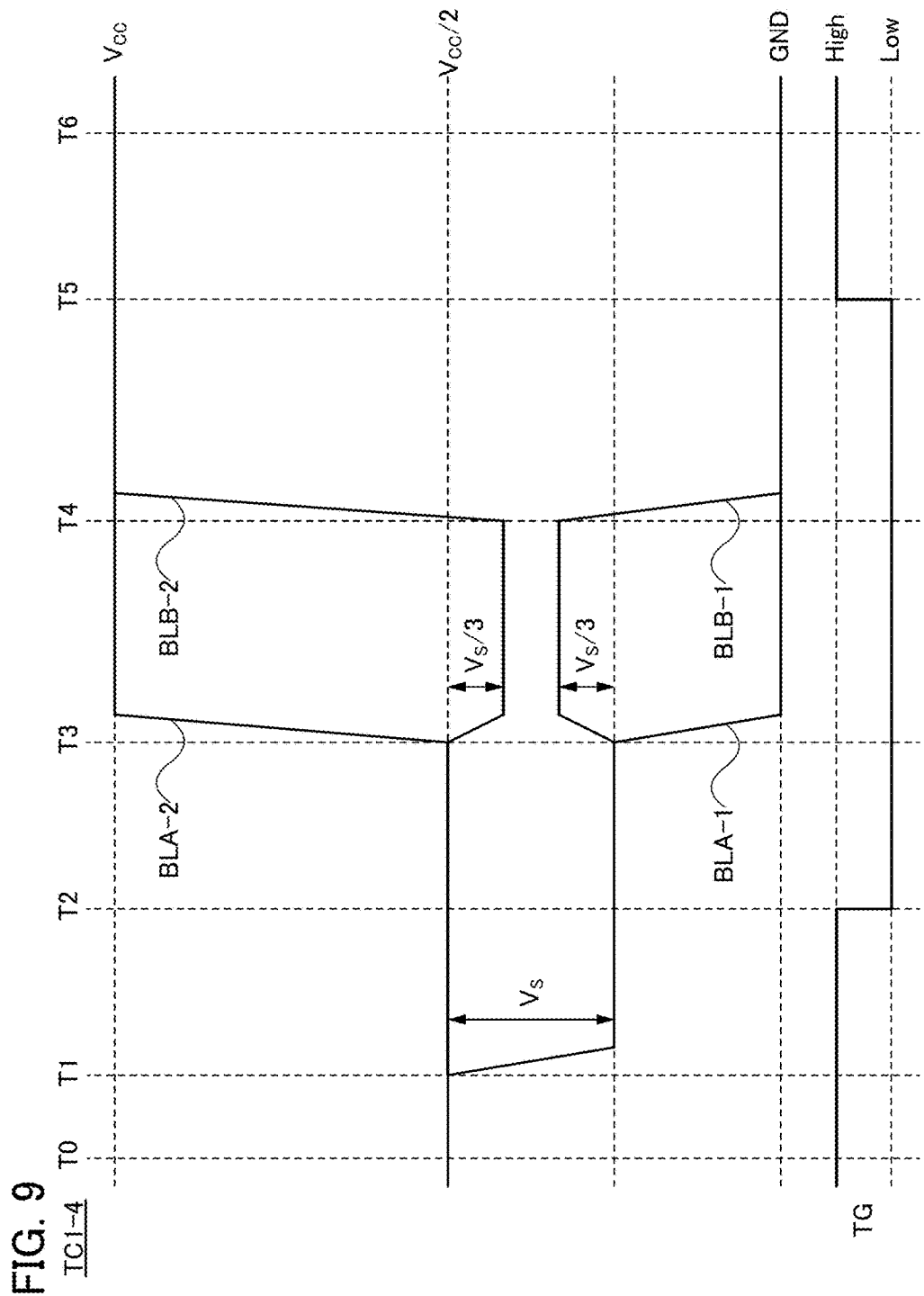
FIG. 9 is a timing chart showing an operation example of the semiconductor device shown in FIG. 1.

FIG. 1 shows the structure example of the semiconductor device of one embodiment of the present invention. A semiconductor device 100 is a memory device in which a memory cell array and a read circuit are stacked and includes a layer LYR1 and a layer LYR2. The layer LYR1 includes the read circuit. The layer LYR2 includes the memory cell array.

The read circuit includes a sense amplifier 101, a sense amplifier 102, a wiring BLA-1, a wiring BLA-2, a wiring BLB-1, a wiring BLB-2, a capacitor CA1, a capacitor CA2, a capacitor CB1, a capacitor CB2, a capacitor CX1, a capacitor CX2, a transistor Tr1, and a transistor Tr2. The read circuit is electrically connected to a wiring TG. Note that the capacitor CA1 and the capacitor CA2 have the same capacitance, the capacitor CB1 and the capacitor CB2 have the same capacitance, and the capacitor CX1 and the capacitor CX2 have the same capacitance. The capacitance of the capacitor CA1 is twice as large as the capacitance of the capacitor CB1. The capacitance of the capacitor CA2 is twice as large as the capacitance of the capacitor CB2.

The wiring BLA-1 is electrically connected to a first input/output terminal of the sense amplifier 101, a first electrode of the capacitor CA1, a first electrode of the capacitor CX1, and one of a source and a drain of the transistor Tr1. The wiring BLA-2 is electrically connected to a second input/output terminal of the sense amplifier 101, a first electrode of the capacitor CA2, a first electrode of the capacitor CX2, and one of a source and a drain of the transistor Tr2. The wiring BLB-1 is electrically connected to a first input/output terminal of the sense amplifier 102, a first electrode of the capacitor CB1, a second electrode of the capacitor CX2, and the other of the source and the drain of the transistor Tr1. The wiring BLB-2 is electrically connected to a second input/output terminal of the sense amplifier 102, a first electrode of the capacitor CB2, a second electrode of the capacitor CX1, and the other of the source and the drain of the transistor Tr2. The wiring TG is electrically connected to a gate of the transistor Tr1 and a gate of the transistor Tr2. A second electrode of the capacitor CA1 is electrically connected to a wiring VC. A second electrode of the capacitor CA2 is electrically connected to the wiring VC. A second electrode of the capacitor CB1 is electrically connected to the wiring VC. A second electrode of the capacitor CB2 is electrically connected to the wiring VC.

The layer LYR2 includes a memory cell array MCALA. The memory cell array MCALA includes memory cells MCA[1] to MCA[m] (m is an integer greater than or equal to 1). The memory cell array MCALA is electrically connected to wirings WLA[1] to WLA[m].

The memory cell MCA[i] (i is an integer greater than or equal to 1 and less than or equal to m) includes a transistor TA[i] and a capacitor CSA[i]. One of a source and a drain of the transistor TA[i] is electrically connected to a first electrode of the capacitor CSA[i]. A gate of the transistor TA[i] is electrically connected to the wiring WLA[i]. A second electrode of the capacitor CSA[i] is electrically connected to the wiring VC.

Note that in the memory cell array MCALA shown in FIG. 1, only the memory cell MCA[1], the memory cell MCA[m], the transistor TA[1], the transistor TA[m], the capacitor CSA[1], the capacitor CSA[m], the wiring WLA[1], the wiring WLA[m], and the wiring VC are shown. An element, a circuit, a wiring, a symbol, and the like other than those are not shown.

The read circuit is connected to the memory cell array MCALA through a wiring BLA. Specifically, the wiring BLA-1 is electrically connected to the other of the source and the drain of each of the transistors TA[1] to TA[m] via the wiring BLA.

The wiring VC is a wiring for supplying a potential to the second electrodes of the capacitors and is supplied with a GND potential. Note that in this specification, the GND potential is a reference potential.

<Operation Example 1>

Next, operation examples of the semiconductor device 100 are described with reference to FIG. 6 to FIG. 9.

FIG. 6 to FIG. 9 are timing charts each showing the operation of the semiconductor device 100. In the operation, data retained in the memory cell MCA[i] in the memory cell array MCALA is read.

Note that the level of data to be read is determined by comparing a read potential and a reference potential. For example, in the case of using binary data, when the read potential is higher than the reference potential, the read potential is determined to be "1", and when the read potential is lower than the reference potential, the read potential is determined to be "0". The reference potential described in operation examples in this specification is $V_{CC}/2$.

<<Operation Example 1-1>>

An example of the operation of the semiconductor device 100 when data "11" is retained in the memory cell MCA[i] is described. In a timing chart TC1-1 shown in FIG. 6, potential changes of the wiring BLA-1, the wiring BLA-2, the wiring BLB-1, the wiring BLB-2, and the wiring TG in a period of reading data "11" retained in the memory cell MCA[i] are shown.

At Time T0, a high-level potential is applied to the wiring TG, and the transistor Tr1 and the transistor Tr2 are turned on. In this state, the wiring BLA-1 and the wiring BLA-2 are precharged at a potential $V_{CC}/2$. That is, the potentials of the wiring BLA-1, the wiring BLA-2, the wiring BLB-1, and the wiring BLB-2 are each $V_{CC}/2$. Note that after the precharge, the wiring BLA-1, the wiring BLB-1, the wiring BLA-2, and the wiring BLB-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1 and BLB-1 is increased by Vs. After the data reading from the memory cell MCA[i] is finished, a low-level potential is applied to the wiring WLA[i], and the transistor TA[i] is turned off.

At Time T2, a low-level potential is applied to the wiring TG. Thus, the transistor Tr1 and the transistor Tr2 are turned off. At this time, the wiring BLA-1, the wiring BLA-2, the wiring BLB-1, and the wiring BLB-2 are held at the same potentials as before Time T2.

At Time T3, the sense amplifier 101 is made to operate. The sense amplifier 101 is a circuit which changes one of the potentials of the wirings BLA-1 and BLA-2 to Vcc and the other of the potentials of the wirings BLA-1 and BLA-2 to the GND potential. At this time, the potential of the wiring BLA-1 is amplified to Vcc because the potential of the wiring BLA-1 is higher than that of the wiring BLA-2. Meanwhile, the potential of the wiring BLA-2 is decreased to the GND potential. In this state, the high-order bit is read using the potential of the wiring BLA-1. Since the potential of the wiring BLA-1 is Vcc and higher than the reference potential, "1" can be read. Thus, the high-order bit can be read using the potential of the wiring BLA-1 between Time T3 and Time T4.

Furthermore, by the above-described operation of the sense amplifier, the potentials of the wirings BLB-1 and BLB-2 are changed through the cross-coupled capacitors CX1 and CX2. Specifically, the potential of the wiring BLB-2 electrically connected, via the capacitor CX1, to the wiring BLA-1 whose potential is increased to the potential Vcc is increased by $V_S/3$, and the potential of the wiring BLB-1 electrically connected, via the capacitor CX2, to the wiring BLA-2 whose potential is decreased to GND is decreased by $V_S/3$.

At Time T4, the sense amplifier 102 is made to operate. The sense amplifier 102 is a circuit which changes one of the potentials of the wirings BLB-1 and BLB-2 to Vcc and the other of the potentials of the wirings BLB-1 and BLB-2 to the GND potential. The potential of the wiring BLB-1 is amplified to Vcc because the potential of the wiring BLB-1 is higher than that of the wiring BLB-2. Meanwhile, the potential of the wiring BLB-2 is decreased to the GND potential. In this state, the low-order bit is read using the potential of the wiring BLB-1. Since the potential of the wiring BLB-1 is Vcc and higher than the reference potential, "1" can be read. Thus, the low-order bit can be read using the potential of the wiring BLB-1 between Time T4 and Time T5.

At Time T5, a high-level potential is applied to the wiring TG, and thus, the transistor Tr1 and the transistor Tr2 are turned on. After the transistor Tr1 is turned on, charges retained in the capacitor CA1 on the wiring BLA-1 side and charges retained in the capacitor CB1 on the wiring BLB-1 side are redistributed. The potentials of the wiring BLA-1 and the wiring BLB-1 after Time T5 become Vcc because the potentials of the wiring BLA-1 and the wiring BLB-1 are both Vcc immediately before Time T5. After the transistor Tr2 is turned on, charges are redistributed also between the wiring BLA-2 and the wiring BLB-2. The potentials of the wiring BLA-2 and the wiring BLB-2 after Time T5 become GND because the potentials of the wiring BLA-2 and the wiring BLB-2 are both GND immediately before Time T5.

After Time T6 at which the charge redistribution between the wiring BLA-1 and the wiring BLB-1 has been finished, a high-level potential is applied to the wiring WLA[i] in order to write the potentials of the wiring BLA-1 and the wiring BLB-1 to a data retention portion of the memory cell MCA[i]. Thus, the transistor TA[i] is turned on, and the potentials of the wiring BLA-1 and the wiring BLB-1, i.e., Vcc, are written.

By the above-described operation from Time T0 to Time T6, the data "11" retained in the memory cell MCA[i] can be read.

<<Operation Example 1-2>>

An example of the operation of the semiconductor device 100 when data "10" is retained in the memory cell MCA[i] is described. In a timing chart TC1-2 shown in FIG. 7, potential changes of the wiring BLA-1, the wiring BLA-2, the wiring BLB-1, the wiring BLB-2, and the wiring TG in a period of reading data "10" retained in the memory cell MCA[i] are shown.

At Time T0, a high-level potential is applied to the wiring TG, and the transistor Tr1 and the transistor Tr2 are turned on. In this state, the wiring BLA-1 and the wiring BLA-2 are precharged at the potential $V_{CC}/2$. That is, the potentials of the wiring BLA-1, the wiring BLA-2, the wiring BLB-1, and the wiring BLB-2 are each $V_{CC}/2$. Note that after the precharge, the wiring BLA-1, the wiring BLB-1, the wiring BLA-2, and the wiring BLB-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1 and BLB-1 is increased by $V_S/3$. After the data reading from the memory cell MCA[i] is finished, a low-level potential is applied to the wiring WLA[i], and the transistor TA[i] is turned off.

At Time T2, a low-level potential is applied to the wiring TG. Thus, the transistor Tr1 and the transistor Tr2 are turned off. At this time, the wiring BLA-1, the wiring BLA-2, the wiring BLB-1, and the wiring BLB-2 are held at the same potentials as before Time T2.

At Time T3, the sense amplifier 101 is made to operate. The sense amplifier 101 is a circuit which changes one of the potentials of the wirings BLA-1 and BLA-2 to Vcc and the other of the potentials of the wirings BLA-1 and BLA-2 to the GND potential. At this time, the potential of the wiring BLA-1 is amplified to Vcc because the potential of the wiring BLA-1 is higher than that of the wiring BLA-2. Meanwhile, the potential of the wiring BLA-2 is decreased to the GND potential. In this state, the high-order bit is read using the potential of the wiring BLA-1. Since the potential of the wiring BLA-1 is Vcc and higher than the reference potential, "1" can be read. Thus, the high-order bit can be read using the potential of the wiring BLA-1 between Time T3 and Time T4.

Furthermore, by the above-described operation of the sense amplifier, the potentials of the wirings BLB-1 and BLB-2 are changed through the cross-coupled capacitors CX1 and CX2. Specifically, the potential of the wiring BLB-2 electrically connected, via the capacitor CX1, to the wiring BLA-1 whose potential is increased to the potential Vcc is increased by $V_S/3$, and the potential of the wiring BLB-1 electrically connected, via the capacitor CX2, to the wiring BLA-2 whose potential is decreased to GND is decreased by $V_S/3$.

At Time T4, the sense amplifier 102 is made to operate. The sense amplifier 102 is a circuit which changes one of the potentials of the wirings BLB-1 and BLB-2 to Vcc and the other of the potentials of the wirings BLB-1 and BLB-2 to the GND potential. The potential of the wiring BLB-2 is amplified to Vcc because the potential of the wiring BLB-2 is higher than that of the wiring BLB-1. Meanwhile, the potential of the wiring BLB-1 is decreased to the GND potential. In this state, the low-order bit is read using the potential of the wiring BLB-1. Since the potential of the wiring BLB-1 is the GND potential and lower than the reference potential, "0" can be read. Thus, the low-order bit can be read using the potential of the wiring BLB-1 between Time T4 and Time T5.

At Time T5, a high-level potential is applied to the wiring TG, and thus, the transistor Tr1 and the transistor Tr2 are turned on. After the transistor Tr1 is turned on, charges are redistributed between the wiring BLA-1 and the wiring BLB-1. The potentials of the wiring BLA-1 and the wiring BLB-1 after Time T5 become $2V_{CC}/3$ because the potential of the wiring BLA-1 is Vcc and the potential of the wiring BLB-1 is GND immediately before Time T5. After the transistor Tr2 is turned on, charges are redistributed also between the wiring BLA-2 and the wiring BLB-2. The potentials of the wirings BLA-2 and BLB-2 after Time T5 become $V_{CC}/3$ because the potential of the wiring BLA-2 is GND and the potential of the wiring BLB-2 is Vcc immediately before Time T5.

After Time T6 at which the charge redistribution between the wiring BLA-1 and the wiring BLB-1 has been finished, a high-level potential is applied to the wiring WLA[i] in order to write the potentials of the wiring BLA-1 and the wiring BLB-1 to the data retention portion of the memory cell MCA[i]. Thus, the transistor TA[i] is turned on, and the potentials of the wiring BLA-1 and the wiring BLB-1, i.e., $2V_{CC}/3$, are written.

By the above-described operation from Time T0 to Time T6, the data "10" retained in the memory cell MCA[i] can be read.

<<Operation Example 1-3>>

An example of the operation of the semiconductor device 100 when data "01" is retained in the memory cell MCA[i] is described. In a timing chart TC1-3 shown in FIG. 8, potential changes of the wiring BLA-1, the wiring BLA-2, the wiring BLB-1, the wiring BLB-2, and the wiring TG in a period of reading data "01" retained in the memory cell MCA[i] are shown.

At Time T0, a high-level potential is applied to the wiring TG, and the transistor Tr1 and the transistor Tr2 are turned on. In this state, the wiring BLA-1 and the wiring BLA-2 are precharged at the potential $V_{CC}/2$. That is, the potentials of the wiring BLA-1, the wiring BLA-2, the wiring BLB-1, and the wiring BLB-2 are each $V_{CC}/2$. Note that after the precharge, the wiring BLA-1, the wiring BLB-1, the wiring BLA-2, and the wiring BLB-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1 and BLB-1 is decreased by $V_S/3$. After the data reading from the memory cell MCA[i] is finished, a low-level potential is applied to the wiring WLA[i], and the transistor TA[i] is turned off.

At Time T2, a low-level potential is applied to the wiring TG. Thus, the transistor Tr1 and the transistor Tr2 are turned off. At this time, the wiring BLA-1, the wiring BLA-2, the wiring BLB-1, and the wiring BLB-2 are held at the same potentials as before Time T2.

At Time T3, the sense amplifier 101 is made to operate. The sense amplifier 101 is a circuit which changes one of the potentials of the wirings BLA-1 and BLA-2 to Vcc and the other of the potentials of the wirings BLA-1 and BLA-2 to the GND potential. At this time, the potential of the wiring BLA-2 is amplified to Vcc because the potential of the wiring BLA-2 is higher than that of the wiring BLA-1. Meanwhile, the potential of the wiring BLA-1 is decreased to the GND potential. In this state, the high-order bit is read using the potential of the wiring BLA-1. Since the potential of the wiring BLA-1 is the GND potential and lower than the reference potential, "0" can be read. Thus, the high-order bit can be read using the potential of the wiring BLA-1 between Time T3 and Time T4.

Furthermore, by the above-described operation of the sense amplifier, the potentials of the wirings BLB-1 and BLB-2 are changed through the cross-coupled capacitors CX1 and CX2. Specifically, the potential of the wiring BLB-1 electrically connected, via the capacitor CX2, to the wiring BLA-2 whose potential is increased to the potential Vcc is increased by $V_S/3$, and the potential of the wiring BLB-2 electrically connected, via the capacitor CX2, to the wiring BLA-1 whose potential is decreased to the GND potential is decreased by $V_S/3$.

At Time T4, the sense amplifier 102 is made to operate. The sense amplifier 102 is a circuit which changes one of the potentials of the wirings BLB-1 and BLB-2 to Vcc and the other of the potentials of the wirings BLB-1 and BLB-2 to the GND potential. The potential of the wiring BLB-1 is amplified to Vcc because the potential of the wiring BLB-1 is higher than that of the wiring BLB-2. Meanwhile, the potential of the wiring BLB-2 decreases to the GND potential. In this state, the low-order bit is read using the potential of the wiring BLB-1. Since the potential of the wiring BLB-1 is Vcc and higher than the reference potential, "1" can be read. Thus, the low-order bit can be read using the potential of the wiring BLB-1 between Time T4 and Time T5.

At Time T5, a high-level potential is applied to the wiring TG, and thus, the transistor Tr1 and the transistor Tr2 are turned on. After the transistor Tr1 is turned on, charges are redistributed between the wiring BLA-1 and the wiring BLB-1. The potentials of the wiring BLA-1 and the wiring BLB-1 after Time T5 become $V_{CC}/3$ because the potential of the wiring BLA-1 is GND and the potential of the wiring BLB-1 is Vcc immediately before Time T5. After the transistor Tr2 is turned on, charges are redistributed also between the wiring BLA-2 and the wiring BLB-2. The potentials of the wiring BLA-2 and the wiring BLB-2 after Time T5 become $2V_{CC}/3$ because the potential of the wiring BLA-2 is Vcc and the potential of the wiring BLB-2 is GND immediately before Time T5.

After Time T6 at which the charge redistribution between the wiring BLA-1 and the wiring BLB-1 has been finished, a high-level potential is applied to the wiring WLA[i] in order to write the potentials of the wiring BLA-1 and the wiring BLB-1 to the data retention portion of the memory cell MCA[i]. Thus, the transistor TA[i] is turned on, and the potentials of the wiring BLA-1 and the wiring BLB-1, i.e., $V_{CC}/3$, are written.

By the above-described operation from Time T0 to Time T6, the data "01" retained in the memory cell MCA[i] can be read.

<<Operation Example 1-4>>

An example of the operation of the semiconductor device 100 when data "00" is retained in the memory cell MCA[i] is described. In a timing chart TC1-4 shown in FIG. 9, potential changes of the wiring BLA-1, the wiring BLA-2, the wiring BLB-1, the wiring BLB-2, and the wiring TG in a period of reading data "00" retained in the memory cell MCA[i] are shown.

At Time T0, a high-level potential is applied to the wiring TG, and the transistor Tr1 and the transistor Tr2 are turned on. In this state, the wiring BLA-1 and the wiring BLA-2 are precharged at the potential $V_{CC}/2$. That is, the potentials of the wiring BLA-1, the wiring BLA-2, the wiring BLB-1, and the wiring BLB-2 are each $V_{CC}/2$. Note that after the precharge, the wiring BLA-1, the wiring BLB-1, the wiring BLA-2, and the wiring BLB-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1 and BLB-1 is decreased by Vs. After the data reading from the memory cell MCA[i] is finished, a low-level potential is applied to the wiring WLA[i], and the transistor TA[i] is turned off.

At Time T2, a low-level potential is applied to the wiring TG. Thus, the transistor Tr1 and the transistor Tr2 are turned off. At this time, the wiring BLA-1, the wiring BLA-2, the wiring BLB-1, and the wiring BLB-2 are held at the same potentials as before Time T2.

At Time T3, the sense amplifier 101 is made to operate. The sense amplifier 101 is a circuit which changes one of the potentials of the wirings BLA-1 and BLA-2 to Vcc and the other of the potentials of the wirings BLA-1 and BLA-2 to the GND potential. At this time, the potential of the wiring BLA-2 is amplified to Vcc because the potential of the wiring BLA-2 is higher than that of the wiring BLA-1. Meanwhile, the potential of the wiring BLA-1 is decreased to the GND potential. In this state, the high-order bit is read using the potential of the wiring BLA-1. Since the potential of the wiring BLA-1 is the GND potential and lower than the reference potential, "0" can be read. Thus, the high-order bit can be read using the potential of the wiring BLA-1 between Time T3 and Time T4.

Furthermore, by the above-described operation of the sense amplifier, the potentials of the wirings BLB-1 and BLB-2 are changed through the cross-coupled capacitors CX1 and CX2. Specifically, the potential of the wiring BLB-1 electrically connected, via the capacitor CX2, to the wiring BLA-2 whose potential is increased to the potential Vcc is increased by $V_S/3$, and the potential of the wiring BLB-2 electrically connected, via the capacitor CX1, to the wiring BLA-1 whose potential is decreased to the GND potential is decreased by $V_S/3$.

At Time T4, the sense amplifier 102 is made to operate. The sense amplifier 102 is a circuit which changes one of the potentials of the wirings BLB-1 and BLB-2 to Vcc and the other of the potentials of the wirings BLB-1 and BLB-2 to the GND potential. The potential of the wiring BLB-2 is amplified to Vcc because the potential of the wiring BLB-2 is higher than that of the wiring BLB-1. Meanwhile, the potential of the wiring BLB-1 is decreased to the GND potential. In this state, the low-order bit is read using the potential of the wiring BLB-1. Since the potential of the wiring BLB-1 is the GND potential and lower than the reference potential, "0" can be read. Thus, the low-order bit can be read using the potential of the wiring BLB-1 between Time T4 and Time T5.

At Time T5, a high-level potential is applied to the wiring TG, and thus, the transistor Tr1 and the transistor Tr2 are turned on. After the transistor Tr1 is turned on, charges are redistributed between the wiring BLA-1 and the wiring BLB-1. The potentials of the wiring BLA-1 and the wiring BLB-1 after Time T5 become GND because the potentials of the wiring BLA-1 and the wiring BLB-1 are both GND immediately before Time T5. After the transistor Tr2 is turned on, charges are redistributed also between the wiring BLA-2 and the wiring BLB-2. The potentials of the wiring BLA-2 and the wiring BLB-2 after Time T5 become Vcc because the potentials of the wiring BLA-2 and the wiring BLB-2 are both Vcc immediately before Time T5.

After Time T6 at which the charge redistribution between the wiring BLA-1 and the wiring BLB-1 has been finished, a high-level potential is applied to the wiring WLA[i] in order to write the potentials of the wiring BLA-1 and the wiring BLB-1 to the data retention portion of the memory cell MCA[i]. Thus, the transistor TA[i] is turned on, and the potentials of the wiring BLA-1 and the wiring BLB-1, i.e., GND, are written.

By the above-described operation from Time T0 to Time T6, the data "00" retained in the memory cell MCA[i] can be read.

<Modification Example 1 of Structure>

The structure example and the operation examples of the semiconductor device 100 are described above, but one embodiment of the present invention is not limited thereto. For example, a read operation may be performed using a structure in which a memory cell array different from the memory cell array MCALA is connected to the wiring BLB-1 and the number of memory cells is increased.

The above-described structure in which the number of memory cells is increased is described with reference to FIG. 10. A semiconductor device 110 is different from the semiconductor device 100 in that a memory cell array MCALB is provided in the layer LYR2. The memory cell array MCALB includes memory cells MCB[1] to MCB[n] (n is an integer greater than or equal to 1). The memory cell array MCALB is electrically connected to wirings WLB[1] to WLB[n].

The memory cell MCB[j] (j is an integer greater than or equal to 1 and less than or equal to n) includes a transistor TB[j] and a capacitor CSB[j]. One of a source and a drain of the transistor TB [j] is electrically connected to a first electrode of the capacitor CSB[j], and a gate of the transistor TB[j] is electrically connected to the wiring WLB[j]. A second electrode of the capacitor CSB[j] is electrically connected to the wiring VC. The wiring BLB-1 is electrically connected to the other of the source and the drain of each of transistors TB[1] to TB[n].

With the above-described structure, data reading from the memory cell MCB[j] in the memory cell array MCALB can be performed in a manner similar to data reading from the memory cell array MCALA of Structure example 1 shown in FIG. 1. The data reading from the memory cell MCB[j] in the memory cell array MCALB can be performed in a manner similar to that from the memory cell MCA[i] in the memory cell array MCALA described in Operation example 1.

This embodiment is not limited to the above-described structure. For example, the capacitors CA1, CA2, CB1, and CB2 need not be provided in the case where the parasitic capacitance of the wiring BLA-1, the parasitic capacitance of the wiring BLA-2, the parasitic capacitance of the wiring BLB-1, and the parasitic capacitance of the wiring BLB-2 are equal to the capacitance of the capacitor CA1, the capacitance of the capacitor CA2, the capacitance of the capacitor CB1, and the capacitance of the capacitor CB2, respectively, in the semiconductor device 100 and the semiconductor device 110. That is, when the parasitic capacitance of the wiring is taken into consideration and a circuit configuration using the parasitic capacitance of the wiring instead of using the capacitor is employed, the circuit area of the semiconductor device can be reduced.

In the above description in this embodiment, regarding the capacitors used in the semiconductor device 100 and the semiconductor device 110, the capacitor CA1 and the capacitor CA2 have the same capacitance, the capacitor CB1 and the capacitor CB2 have the same capacitance, the capacitor CX1 and the capacitor CX2 have the same capacitance, the capacitance of the capacitor CA1 is twice as large as the capacitance of the capacitor CB1, and the capacitance of the capacitor CA2 is twice as large as the capacitance of the capacitor CB2. However, one embodiment of the present invention is not limited thereto. For example, a structure may be employed in which the capacitor CA1 and the capacitor CA2 have the same capacitance, the capacitor CB1 and the capacitor CB2 have the same capacitance, the capacitance of the capacitor CB1 is twice as large as the capacitance of the capacitor CA1, and the capacitance of the capacitor CB2 is twice as large as the capacitance of the capacitor CA2. Alternatively, the capacitance of the capacitor CA1, the capacitance of the capacitor CA2, the capacitance of the capacitor CB1, the capacitance of the capacitor CB2, the capacitance of the capacitor CX1, and the capacitance of the capacitor CX2 may each be changed to an appropriate value to form a circuit in consideration of the influence of the storage capacitance of the memory cell subjected to data reading, the parasitic capacitance of the wiring, and the parasitic capacitance of the transistor, for example.

The transistors TA[1] to TA[m] and the transistors TB[1] to TB[n] used in the semiconductor device 100 and the semiconductor device 110 are preferably OS transistors. In particular, oxide semiconductors included in their channel formation regions each preferably include indium, gallium, and zinc. The transistors including the oxide semiconductors have characteristics of an extremely low off-state current, and therefore, data degradation due to the leakage of current can be suppressed.

The transistor Tr1 and the transistor Tr2 in the semiconductor device 100 and the semiconductor device 110 can also be OS transistors. In that case, the movement of charges between the wiring BLA-1 and the wiring BLB-1 and the movement of charges between the wiring BLA-2 and the wiring BLB-2 can be suppressed.

Figure 10:
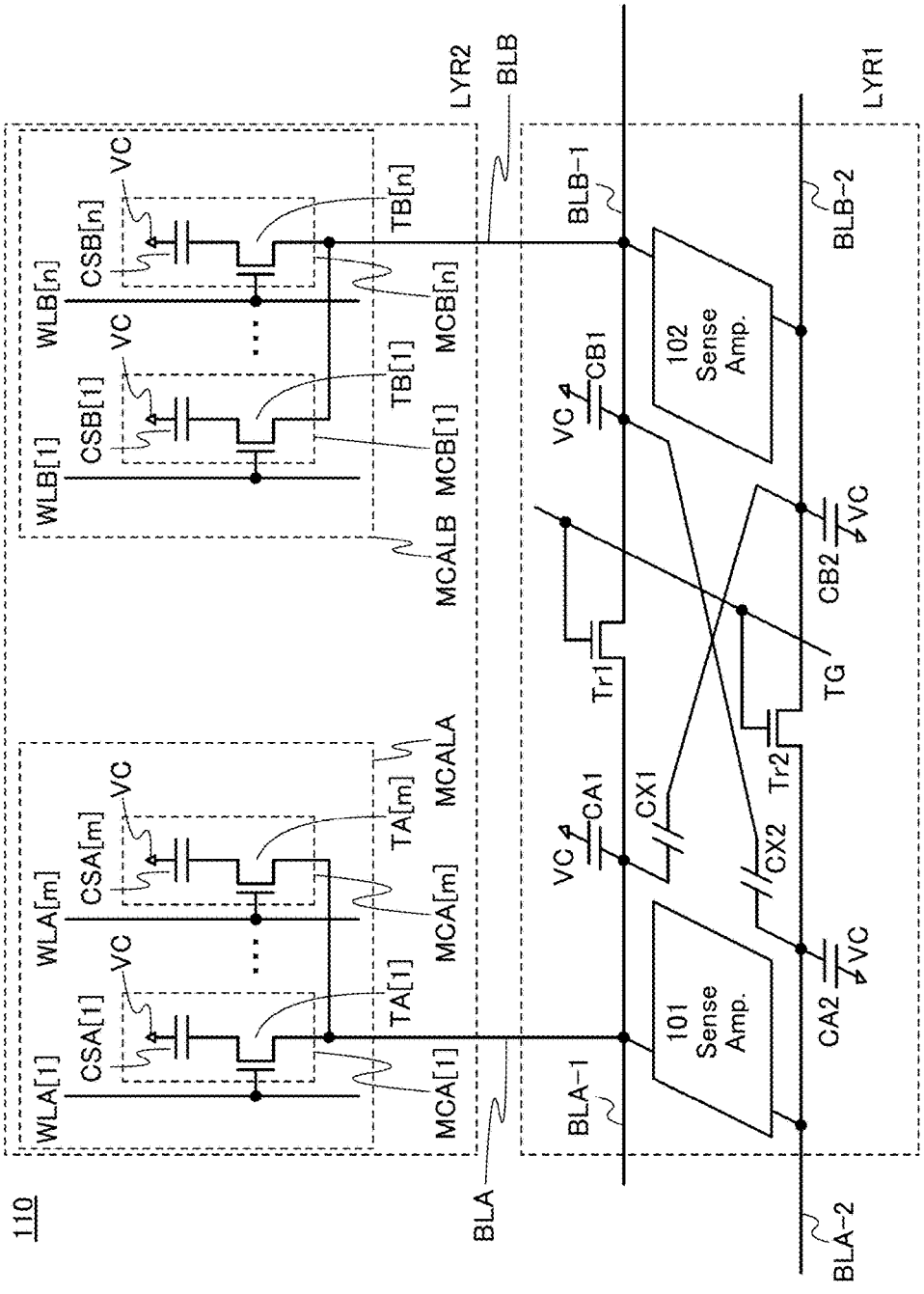
FIG. 10 is a circuit diagram showing an example of a semiconductor device.

Note that the structure of this embodiment is not limited to FIG. 1 or FIG. 10. The capacitors CA1, CA2, CB1, CB2, CX1, and CX2 in the layer LYR1 and the capacitors CSA[1] to CSA[m] and the capacitors CSB[1] to CSB[n] in the layer LYR2 may be provided in a layer over the layer LYR2, for example. When such a structure is used, a manufacturing process of the semiconductor device 100 or the semiconductor device 110 can be made simpler, and the circuit area thereof can be reduced.

The capacitors CA1, CA2, CB1, CB2, CX1, and CX2 may be provided between the layer LYR1 and the layer LYR2 whereas the capacitors CSA[1] to CSA[m] and the capacitors CSB[1] to CSB[n] are provided in a layer over the layer LYR2, for example. When such a structure is used, the circuit area of the semiconductor device 100 or the semiconductor device 110 can be reduced.

In the case where the channel formation regions of the transistors TA[1] to TA[m] and the transistors TB[1] to TB[n] and channel formation regions of the transistors Tr1 and Tr2 are formed using the same material, the transistor Tr1 and the transistor Tr2 may be provided in the layer LYR2, for example. When such a structure is used, a manufacturing process of the semiconductor device 110 can be made simpler.

In this embodiment, one embodiment of the present invention has been described. Other embodiments of the present invention will be described in other embodiments. Note that one embodiment of the present invention is not limited thereto. In other words, various embodiments of the invention are described in this embodiment and the other embodiments, and one embodiment of the present invention is not limited to a particular embodiment. For example, one embodiment of the present invention shows, but is not limited to, an example in which a channel formation region, a source region, a drain region, or the like of a transistor includes an oxide semiconductor. Depending on the circumstances or case, a variety of semiconductors may be used for transistors in one embodiment of the present invention, the channel formation regions of the transistors, the source and drain regions of the transistors, and the like. Depending on the circumstances or case, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

In this embodiment, a structure example and operation examples that are different from those in Embodiment 1 are described.

<Structure Example 2>

Figure 11:
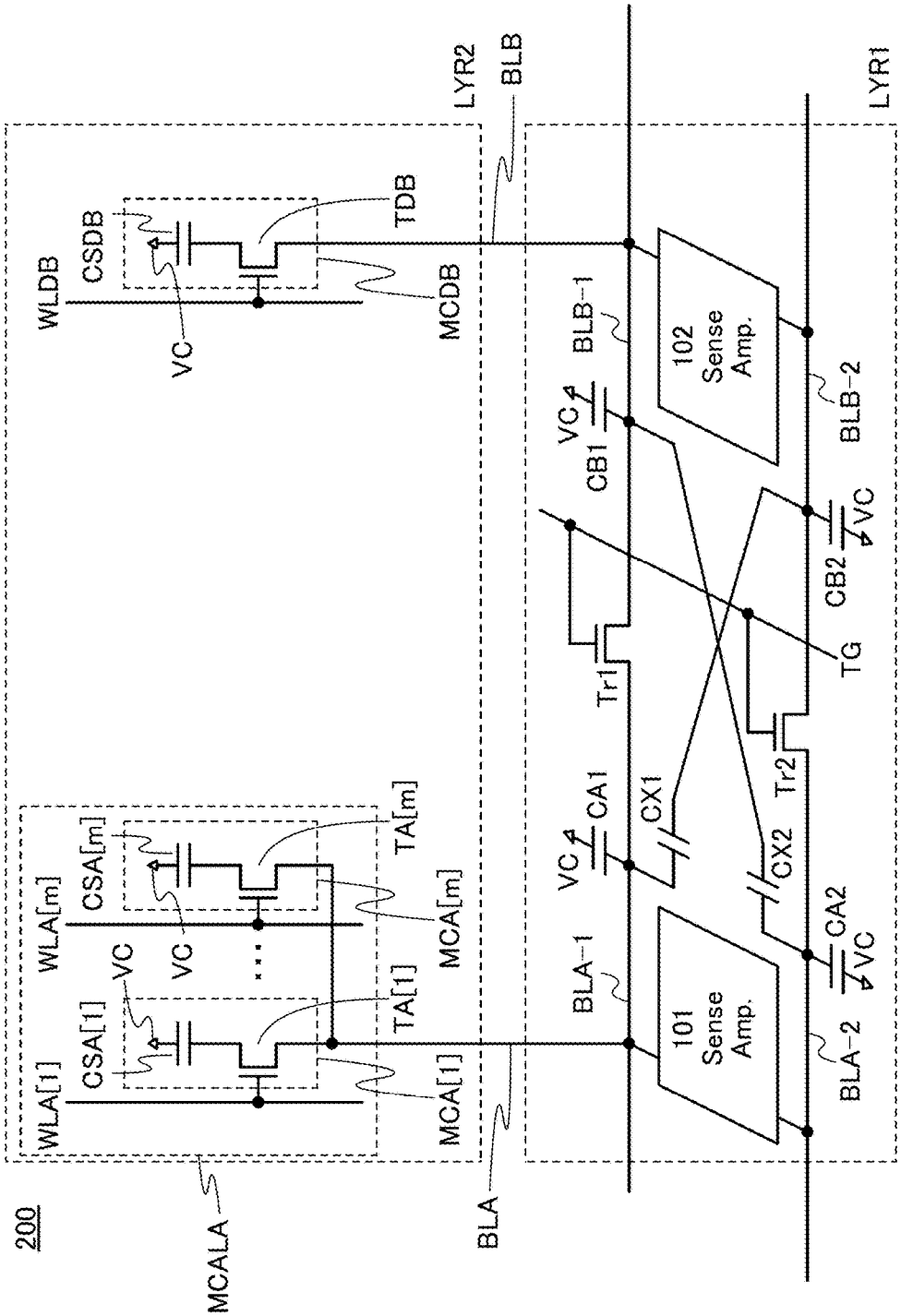
FIG. 11 is a circuit diagram showing an example of a semiconductor device.

FIG. 11 shows a structure example of a semiconductor device of one embodiment of the present invention. A semiconductor device 200 is a memory device in which a memory cell array and a read circuit are stacked and includes the layer LYR1 and the layer LYR2. The layer LYR1 includes the read circuit. The layer LYR2 includes the memory cell array.

The semiconductor device 200 is different from the semiconductor device 100 described in Embodiment 1 in that a dummy cell MCDB is provided in the layer LYR2. The dummy cell MCDB is electrically connected to a wiring WLDB.

The dummy cell MCDB includes a transistor TDB and a capacitor CSDB.

The dummy cell MCDB is a memory cell provided for reducing the influence of charges remaining in the capacitor CSA[i] when data is read from the memory cell MCA[i] in the memory cell array MCALA. The read operation of the memory cell MCA[i] in the memory cell array MCALA using the dummy cell MCDB will be described in Operation example 2 below.

One of a source and a drain of the transistor TDB is electrically connected to a first electrode of the capacitor CSDB, and a gate of the transistor TDB is electrically connected to the wiring WLDB. A second electrode of the capacitor CSDB is electrically connected to the wiring VC. The other of the source and the drain of the transistor TDB is electrically connected to the wiring BLB-1 via the wiring BLB.

The wiring VC is the wiring for supplying a potential to the second electrodes of the capacitors and is supplied with the GND potential.

<Operation Example 2>

Next, an operation example of the semiconductor device 200 is described with reference to FIG. 12.

Figure 12:
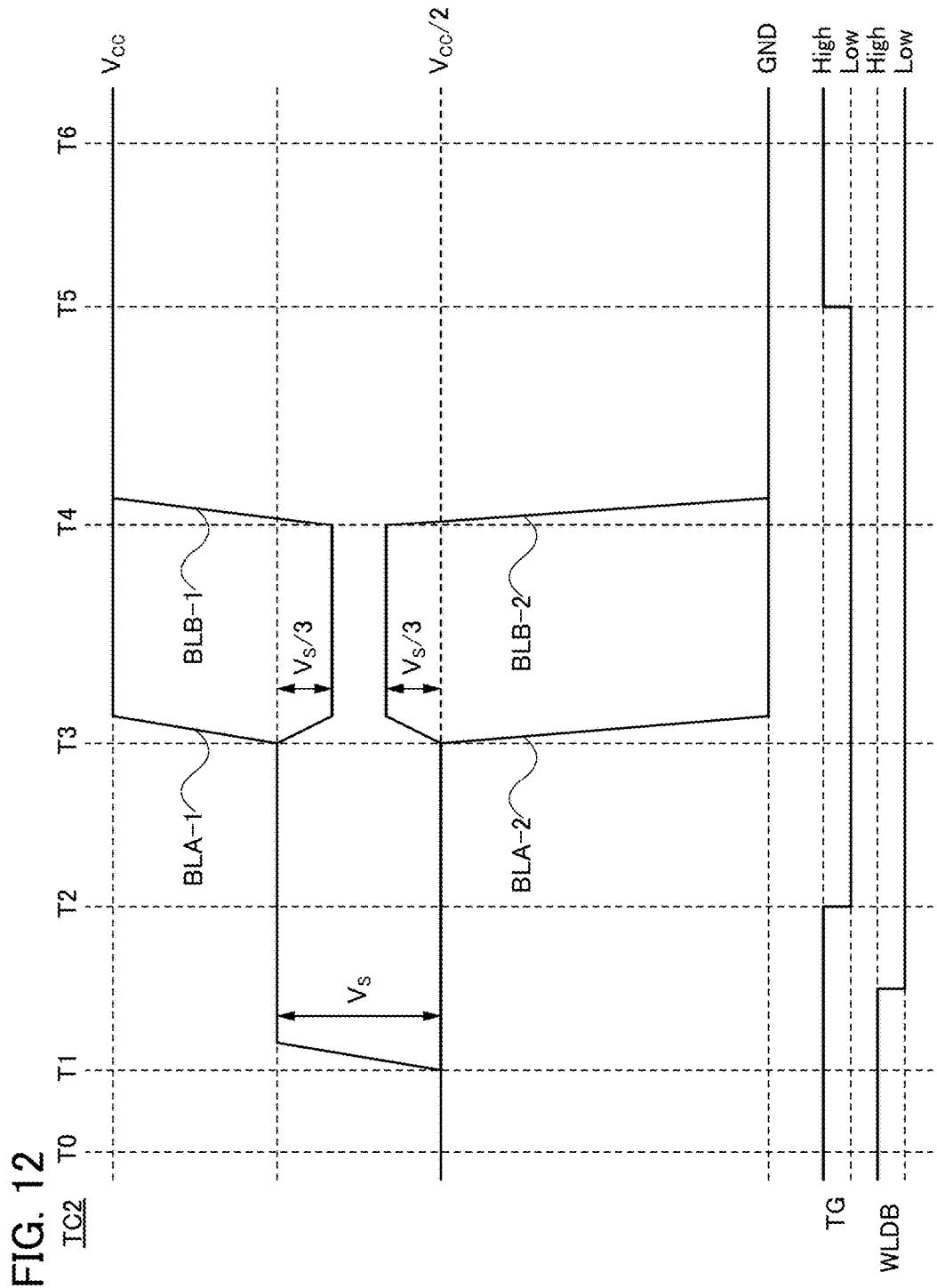
FIG. 12 is a timing chart showing an operation example of the semiconductor device shown in FIG. 11.

FIG. 12 is a timing chart showing the operation of the semiconductor device 200. In the operation, data "11" retained in the memory cell MCA[i] in the memory cell array MCALA is read.

In a timing chart TC2 shown in FIG. 12, potential changes of the wiring BLA-1, the wiring BLA-2, the wiring BLB-1, the wiring BLB-2, the wiring TG, and the wiring WLDB in a period of reading data "11" retained in the memory cell MCA[i] are shown.

At Time T0, a high-level potential is applied to the wiring TG, and the transistor Tr1 and the transistor Tr2 are turned on. In addition, a high-level potential is applied to the wiring WLDB, and the transistor TDB is turned on. In this state, the wiring BLA-1 and the wiring BLA-2 are precharged at the potential $V_{CC}/2$. That is, the potentials of the wiring BLA-1, the wiring BLA-2, the wiring BLB-1, the wiring BLB-2, and a potential hold portion of the dummy cell MCDB are each $V_{CC}/2$. Note that after the precharge, the wiring BLA-1, the wiring BLA-2, and the wiring BLB-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1 and BLB-2 is increased by Vs.

At Time T1, when data of the memory cell MCA[i] is read, the transistor TDB in the dummy cell MCDB is turned on, whereby charges held in the memory cell MCA[i] are moved to the potential hold portion of the dummy cell MCDB. That is, the potential Vs is retained also in the capacitor CSDB in the dummy cell MCDB. Thus, the influence of charges remaining in the capacitor CSA[i] when data is read from the memory cell MCA[i] can be reduced.

After the data reading from the memory cell MCA[i] is finished, a low-level potential is applied to the wiring WLA[i], and the transistor TA[i] is turned off. In addition, a low-level potential is applied to the wiring WLDB and the transistor TDB is turned off.

At Time T2, a low-level potential is applied to the wiring TG. Thus, the transistor Tr1 and the transistor Tr2 are turned off. At this time, the wiring BLA-1, the wiring BLA-2, the wiring BLB-1, and the wiring BLB-2 are held at the same potentials as before Time T2.

At Time T3, the sense amplifier 101 is made to operate. The sense amplifier 101 is a circuit which changes one of the potentials of the wirings BLA-1 and BLA-2 to Vcc and the other of the potentials of the wirings BLA-1 and BLA-2 to the GND potential. At this time, the potential of the wiring BLA-1 is amplified to Vcc because the potential of the wiring BLA-1 is higher than that of the wiring BLA-2. Meanwhile, the potential of the wiring BLA-2 is decreased to the GND potential. In this state, the high-order bit is read using the potential of the wiring BLA-1. Since the potential of the wiring BLA-1 is Vcc and higher than the reference potential, "1" can be read. Thus, the high-order bit can be read using the potential of the wiring BLA-1 between Time T3 and Time T4.

Furthermore, by the above-described operation of the sense amplifier, the potentials of the wirings BLB-1 and BLB-2 are changed through the cross-coupled capacitors CX1 and CX2. Specifically, the potential of the wiring BLB-2 electrically connected, via the capacitor CX1, to the wiring BLA-1 whose potential is increased to the potential Vcc is increased by $V_S/3$, and the potential of the wiring BLB-1 electrically connected, via the capacitor CX2, to the wiring BLA-2 whose potential is decreased to the GND potential is decreased by $V_S/3$.

At Time T4, the sense amplifier 102 is made to operate. The sense amplifier 102 is a circuit which changes one of the potentials of the wirings BLB-1 and BLB-2 to Vcc and the other of the potentials of the wirings BLB-1 and BLB-2 to the GND potential. The potential of the wiring BLB-1 is amplified to Vcc because the potential of the wiring BLB-1 is higher than that of the wiring BLB-2. Meanwhile, the potential of the wiring BLB-2 decreases to the GND potential. In this state, the low-order bit is read using the potential of the wiring BLB-1. Since the potential of the wiring BLB-1 is Vcc and higher than the reference potential, "1" can be read. Thus, the low-order bit can be read using the potential of the wiring BLB-1 between Time T4 and Time T5.

At Time T5, a high-level potential is applied to the wiring TG, and thus, the transistor Tr1 and the transistor Tr2 are turned on. After the transistor Tr1 is turned on, charges are redistributed between the wiring BLA-1 and the wiring BLB-1. The potentials of the wiring BLA-1 and the wiring BLB-1 after Time T5 become Vcc because the potentials of the wiring BLA-1 and the wiring BLB-1 are both Vcc immediately before Time T5. After the transistor Tr2 is turned on, charges are redistributed also between the wiring BLA-2 and the wiring BLB-2. The potentials of the wiring BLA-2 and the wiring BLB-2 after Time T5 become GND because the potentials of the wiring BLA-2 and the wiring BLB-2 are both GND immediately before Time T5.

After Time T6 at which the charge redistribution between the wiring BLA-1 and the wiring BLB-1 has been finished, a high-level potential is applied to the wiring WLA[i] in order to write the potentials of the wiring BLA-1 and the wiring BLB-1 to the data retention portion of the memory cell MCA[i]. Thus, the transistor TA[i] is turned on, and the potentials of the wiring BLA-1 and the wiring BLB-1, i.e., Vcc, are written.

By the above-described operation from Time T0 to Time T6, the data "11" retained in the memory cell MCA[i] can be read more accurately than in Embodiment 1.

Also in the case where data "10", "01", or "00" is retained in the memory cell MCA[i], charge distribution can be performed in a state where the influence of the capacitor CSA[i] is reduced by turning on the transistor TDB at the above-described timing. That is, the data "10", "01", or "00" retained in the memory cell MCA[i] can be read more accurately than in Embodiment 1.

<Modification Example 2 of Structure>

The structure example and the operation example of the semiconductor device 200 are described above, but one embodiment of the present invention is not limited thereto. For example, a read operation may be performed using a structure in which a memory cell array different from the memory cell array MCALA is connected to the wiring BLB-1 and the number of memory cells is increased.

The above-described structure in which the number of memory cells is increased is described with reference to FIG. 13. A semiconductor device 210 is different from the semiconductor device 110 in that a dummy cell MCDA and the dummy cell MCDB are provided in the layer LYR2. The dummy cell MCDA and the dummy cell MCDB are electrically connected to a wiring WLDA and the wiring WLDB, respectively.

The dummy cell MCDA includes a transistor TDA and a capacitor CSDA. The dummy cell MCDB includes the transistor TDB and the capacitor CSDB.

The dummy cell MCDB is provided for reducing the influence of charges remaining in the capacitor CSA[i] when data is read from the memory cell MCA[i] in the memory cell array MCALA. The dummy cell MCDA is provided for reducing the influence of charges remaining in the capacitor CSB[j] when data is read from the memory cell MCB[j] in the memory cell array MCALB.

One of a source and a drain of the transistor TDA is electrically connected to a first electrode of the capacitor CSDA, and a gate of the transistor TDA is electrically connected to the wiring WLDA. A second electrode of the capacitor CSDA is electrically connected to the wiring VC. One of the source and the drain of the transistor TDB is electrically connected to the first electrode of the capacitor CSDB, and the gate of the transistor TDB is electrically connected to the wiring WLDB. The second electrode of the capacitor CSDB is electrically connected to the wiring VC. The other of the source and the drain of the transistor TDA is electrically connected to the wiring BLA-1 via the wiring BLA. The other of the source and the drain of the transistor TDB is electrically connected to the wiring BLB-1 via the wiring BLB.

When data of the memory cell MCB[j] in the memory cell array MCALB is read, the dummy cell MCDA is operated in a manner similar to that of the dummy cell MCDB in Operation example 2.

This embodiment is not limited to the above-described structure. For example, the capacitors CA1, CA2, CB1, and CB2 need not be provided in the case where the parasitic capacitance of the wiring BLA-1, the parasitic capacitance of the wiring BLA-2, the parasitic capacitance of the wiring BLB-1, and the parasitic capacitance of the wiring BLB-2 are equal to the capacitance of the capacitor CA1, the capacitance of the capacitor CA2, the capacitance of the capacitor CB1, and the capacitance of the capacitor CB2, respectively, in the semiconductor device 200 and the semiconductor device 210. That is, when the parasitic capacitance of the wiring is taken into consideration and a circuit configuration using the parasitic capacitance of the wiring instead of using the capacitor is employed, the circuit area of the semiconductor device can be reduced.

In the above description in this embodiment, regarding the capacitors used in the semiconductor device 200 and the semiconductor device 210, the capacitor CA1 and the capacitor CA2 have the same capacitance, the capacitor CB1 and the capacitor CB2 have the same capacitance, the capacitor CX1 and the capacitor CX2 have the same capacitance, the capacitance of the capacitor CA1 is twice as large as the capacitance of the capacitor CB1, and the capacitance of the capacitor CA2 is twice as large as the capacitance of the capacitor CB2. However, one embodiment of the present invention is not limited thereto. For example, a structure may be employed in which the capacitor CA1 and the capacitor CA2 have the same capacitance, the capacitor CB1 and the capacitor CB2 have the same capacitance, the capacitance of the capacitor CB1 is twice as large as the capacitance of the capacitor CA1, and the capacitance of the capacitor CB2 is twice as large as the capacitance of the capacitor CA2. Alternatively, the capacitance of the capacitor CA1, the capacitance of the capacitor CA2, the capacitance of the capacitor CB1, the capacitance of the capacitor CB2, the capacitance of the capacitor CX1, and the capacitance of the capacitor CX2 may each be changed to an appropriate value to form a circuit in consideration of the influence of the storage capacitance of the memory cell subjected to data reading, the parasitic capacitance of the wiring, and the parasitic capacitance of the transistor, for example.

The transistors TA[1] to TA[m], the transistors TB[1] to TB[n], the transistor TDA, and the transistor TDB used in the semiconductor device 200 and the semiconductor device 210 are preferably OS transistors. In particular, oxide semiconductors included in their channel formation regions each preferably include indium, gallium, and zinc. The transistors including the oxide semiconductors have characteristics of an extremely low off-state current, and therefore, data degradation due to the leakage of current can be suppressed.

The transistor Tr1 and the transistor Tr2 in the semiconductor device 200 and the semiconductor device 210 can also be OS transistors. In that case, the movement of charges between the wiring BLA-1 and the wiring BLB-1 and the movement of charges between the wiring BLA-2 and the wiring BLB-2 can be suppressed.

Figure 13:
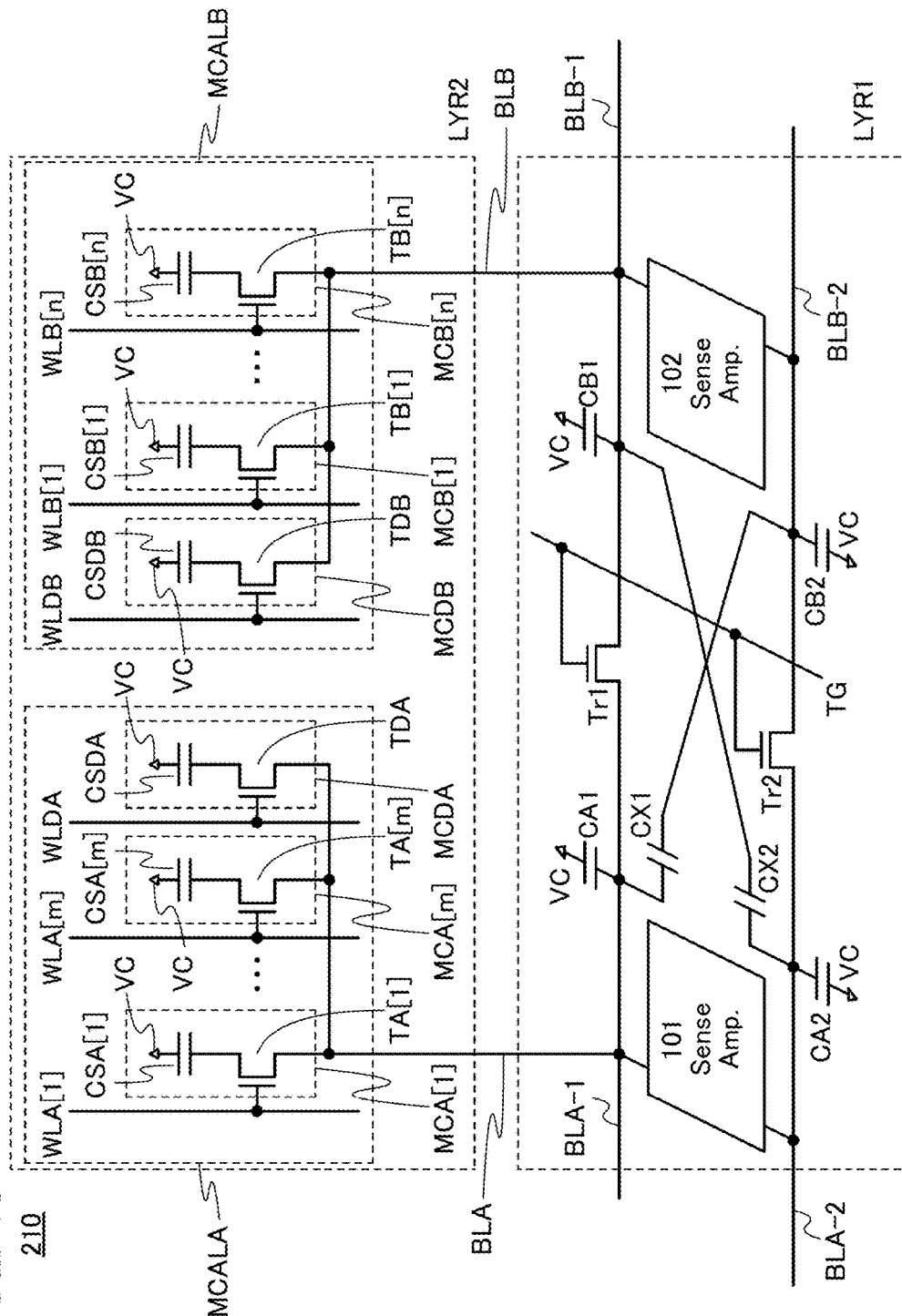
FIG. 13 is a circuit diagram showing an example of a semiconductor device.

Note that the structure of this embodiment is not limited to FIG. 11 or FIG. 13. The capacitors CA1, CA2, CB1, CB2, CX1, and CX2 in the layer LYR1 and the capacitors CSA[1] to CSA[m], the capacitor CSDA, the capacitors CSB[1] to CSB[n], and the capacitor CSDB in the layer LYR2 may be provided in a layer over the layer LYR2, for example. When such a structure is used, a manufacturing process of the semiconductor device 200 or the semiconductor device 210 can be made simpler, and the circuit area thereof can be reduced.

The capacitors CA1, CA2, CB1, CB2, CX1, and CX2 may be provided between the layer LYR1 and the layer LYR2 whereas the capacitors CSA[1] to CSA[m], the capacitor CSDA, the capacitors CSB[1] to CSB[n], and the capacitor CSDB are provided in a layer over the layer LYR2, for example. When such a structure is used, the circuit area of the semiconductor device 200 or the semiconductor device 210 can be reduced.

In the case where the channel formation regions of the transistors TA[1] to TA[m], the transistors TB[1] to TB[n], the transistor Tr1, the transistor Tr2, the transistor TDA, and the transistor TDB are formed using the same material, the transistor Tr1 and the transistor Tr2 may be provided in the layer LYR2, for example. When such a structure is used, a manufacturing process of the semiconductor device 200 can be made simpler.

Note that this embodiment can be combined with any of the other embodiments in this specification as appropriate.

Embodiment 3

In this embodiment, a structure example and operation examples that are different from those in Embodiments 1 and 2 are described.

<Structure Example 3>

Figure 14:
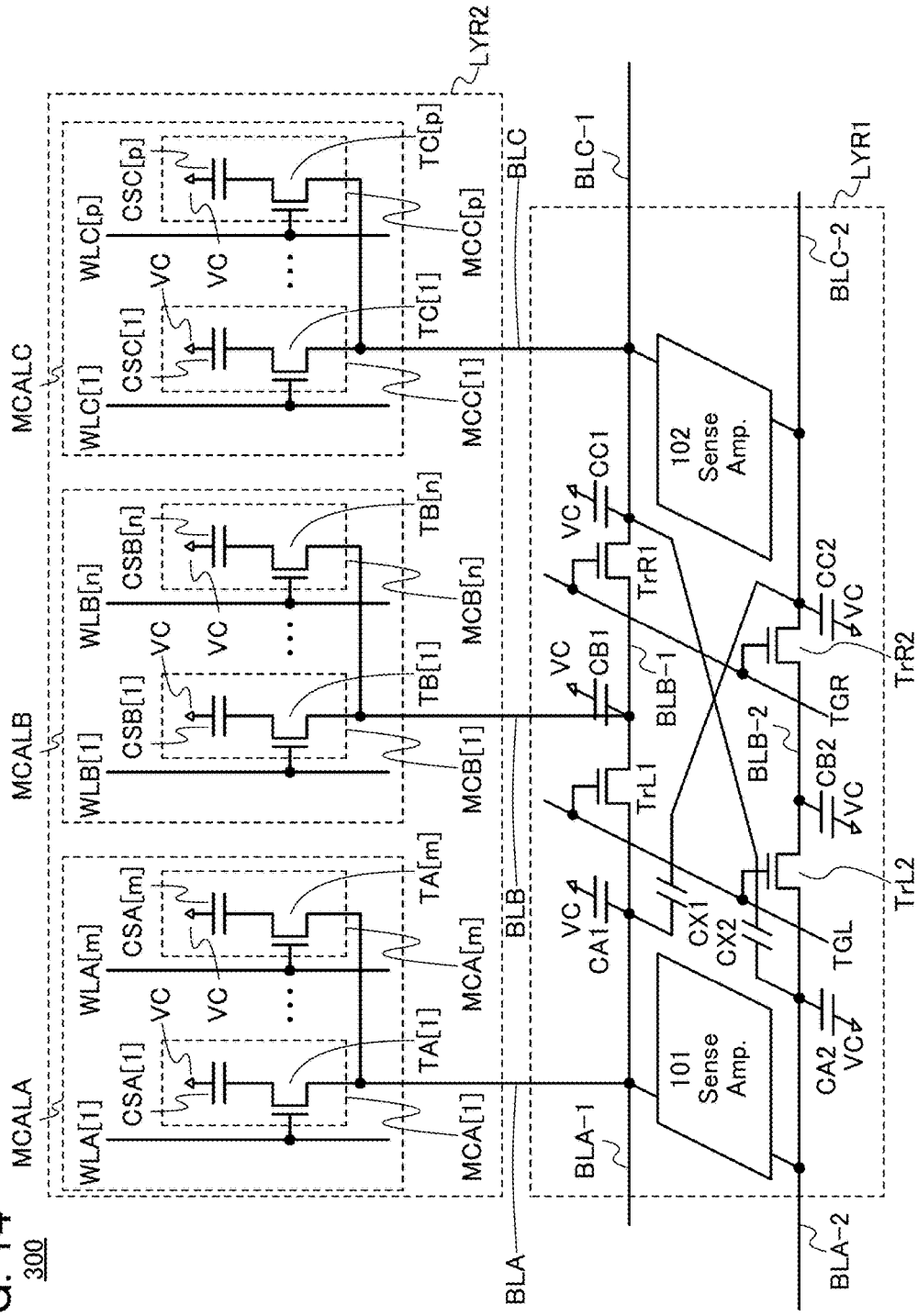
FIG. 14 is a circuit diagram showing an example of a semiconductor device.

FIG. 14 shows a structure example of a semiconductor device of one embodiment of the present invention. A semiconductor device 300 is a memory device in which a memory cell array and a read circuit are stacked and includes the layer LYR1 and the layer LYR2. The layer LYR1 includes the read circuit. The layer LYR2 includes a plurality of memory cells.

The read circuit includes the sense amplifier 101, the sense amplifier 102, the wiring BLA-1, the wiring BLA-2, the wiring BLB-1, the wiring BLB-2, a wiring BLC-1, a wiring BLC-2, the capacitor CAL the capacitor CA2, the capacitor CB1, the capacitor CB2, a capacitor CC1, a capacitor CC2, the capacitor CX1, the capacitor CX2, a transistor TrL1, a transistor TrR1, a transistor TrL2, and a transistor TrR2. The read circuit is electrically connected to a wiring TGL and a wiring TGR. Note that the capacitor CAL the capacitor CA2, the capacitor CB1, the capacitor CB2, the capacitor CC1, and the capacitor CC2 have the same capacitance, and the capacitor CX1 and the capacitor CX2 have the same capacitance.

The wiring BLA-1 is electrically connected to the first input/output terminal of the sense amplifier 101, the first electrode of the capacitor CAL the first electrode of the capacitor CX1, and one of a source and a drain of the transistor TrL1. The wiring BLA-2 is electrically connected to the second input/output terminal of the sense amplifier 101, the first electrode of the capacitor CA2, the first electrode of the capacitor CX2, and one of a source and a drain of the transistor TrL2. The wiring BLB-1 is electrically connected to the first electrode of the capacitor CB1, the other of the source and the drain of the transistor TrL1, and one of a source and a drain of the transistor TrR1. The wiring BLB-2 is electrically connected to the first electrode of the capacitor CB2, the other of the source and the drain of the transistor TrL2, and one of a source and a drain of the transistor TrR2. The wiring BLC-1 is electrically connected to the first input/output terminal of the sense amplifier 102, a first electrode of the capacitor CC1, the second electrode of the capacitor CX2, and the other of the source and the drain of the transistor TrR1. The wiring BLC-2 is electrically connected to the second input/output terminal of the sense amplifier 102, a first electrode of the capacitor CC2, the second electrode of the capacitor CX1, and the other of the source and the drain of the transistor TrR2. The wiring TGL is electrically connected to a gate of the transistor TrL1 and a gate of the transistor TrL2. The wiring TGR is electrically connected to a gate of the transistor TrR1 and a gate of the transistor TrR2. The second electrode of the capacitor CAL the second electrode of the capacitor CA2, the second electrode of the capacitor CB1, the second electrode of the capacitor CB2, a second electrode of the capacitor CC1, and a second electrode of the capacitor CC2 are electrically connected to the wiring VC.

The layer LYR2 includes the memory cell array MCALA, the memory cell array MCALB, and a memory cell MCALC. The memory cell array MCALA includes the memory cells MCA[1] to MCA[m] (m is an integer greater than or equal to 1). The memory cell array MCALB includes the memory cells MCB[1] to MCB[n] (n is an integer greater than or equal to 1). The memory cell array MCALC includes memory cells MCC[1] to MCC[p] (p is an integer greater than or equal to 1). The memory cell array MCALA is electrically connected to the wirings WLA[1] to WLA[m]. The memory cell array MCALB is electrically connected to the wirings WLB[1] to WLB[n]. The memory cell array MCALC is electrically connected to wirings WLC[1] to WLC[p].

The elements and the connection state in the memory cell MCA[i] (i is an integer greater than or equal to 1 and less than or equal to m) are the same as the elements and the connection state in the memory cell MCB[j] (j is an integer greater than or equal to 1 and less than or equal to n) and the elements and the connection state in the memory cell MCC[k] (k is an integer greater than or equal to 1 and less than or equal to p). The memory cell MCA[i] includes the transistor TA[i] and the capacitor CSA[i]. The memory cell MCB[j] includes the transistor TB[j] and the capacitor CSB[j]. The memory cell MCC[k] includes a transistor TC[k] and a capacitor CSC[k]. The one of the source and the drain of the transistor TA[i] is electrically connected to the first electrode of the capacitor CSA[i]. The gate of the transistor TA[i] is electrically connected to the wiring WLA[i]. The one of the source and the drain of the transistor TB[j] is electrically connected to the first electrode of the capacitor CSB[j]. The gate of the transistor TB[j] is electrically connected to the wiring WLB[j]. One of a source and a drain of the transistor TC[k] is electrically connected to a first electrode of the capacitor CSC[k], and a gate of the transistor TC[k] is electrically connected to the wiring WLC[k]. The second electrode of the capacitor CSA[i] is electrically connected to the wiring VC, the second electrode of the capacitor CSB[j] is electrically connected to the wiring VC, and a second electrode of the capacitor CSC[k] is electrically connected to the wiring VC.

The wiring BLA-1 is electrically connected to the other of the source and the drain of each of the transistors TA[1] to TA[m] via the wiring BLA. The wiring BLB-1 is electrically connected to the other of the source and the drain of each of the transistors TB[1] to TB[n] via the wiring BLB. The wiring BLC-1 is electrically connected to the other of the source and the drain of each of transistors TC[1] to TC[p] via a wiring BLC.

The wiring VC is the wiring for supplying a potential to the second electrodes of the capacitors and is supplied with the GND potential.

<Operation Example 3>

Figure 15:
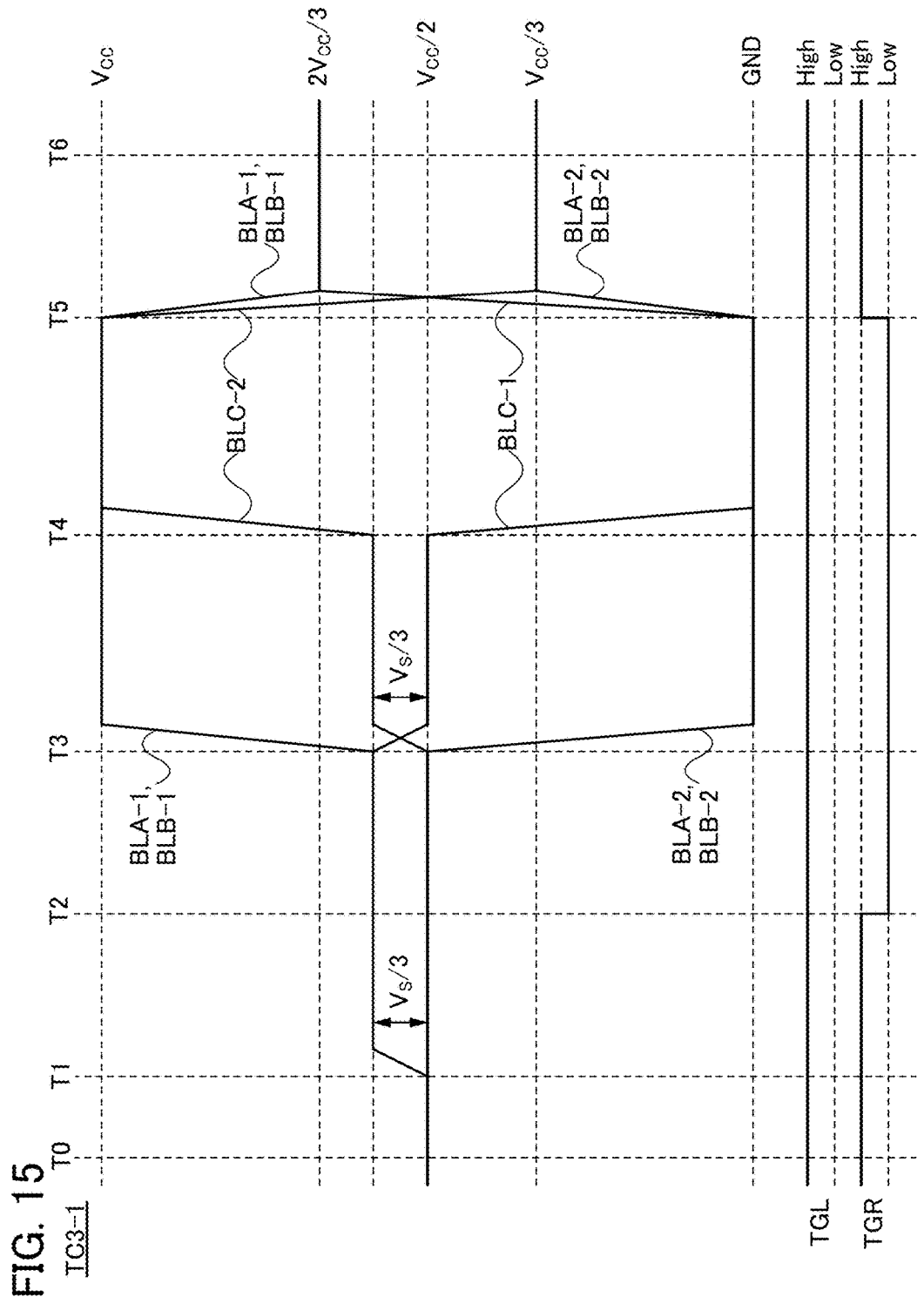
FIG. 15 is a timing chart showing an operation example of the semiconductor device shown in FIG. 14.
Figure 16:
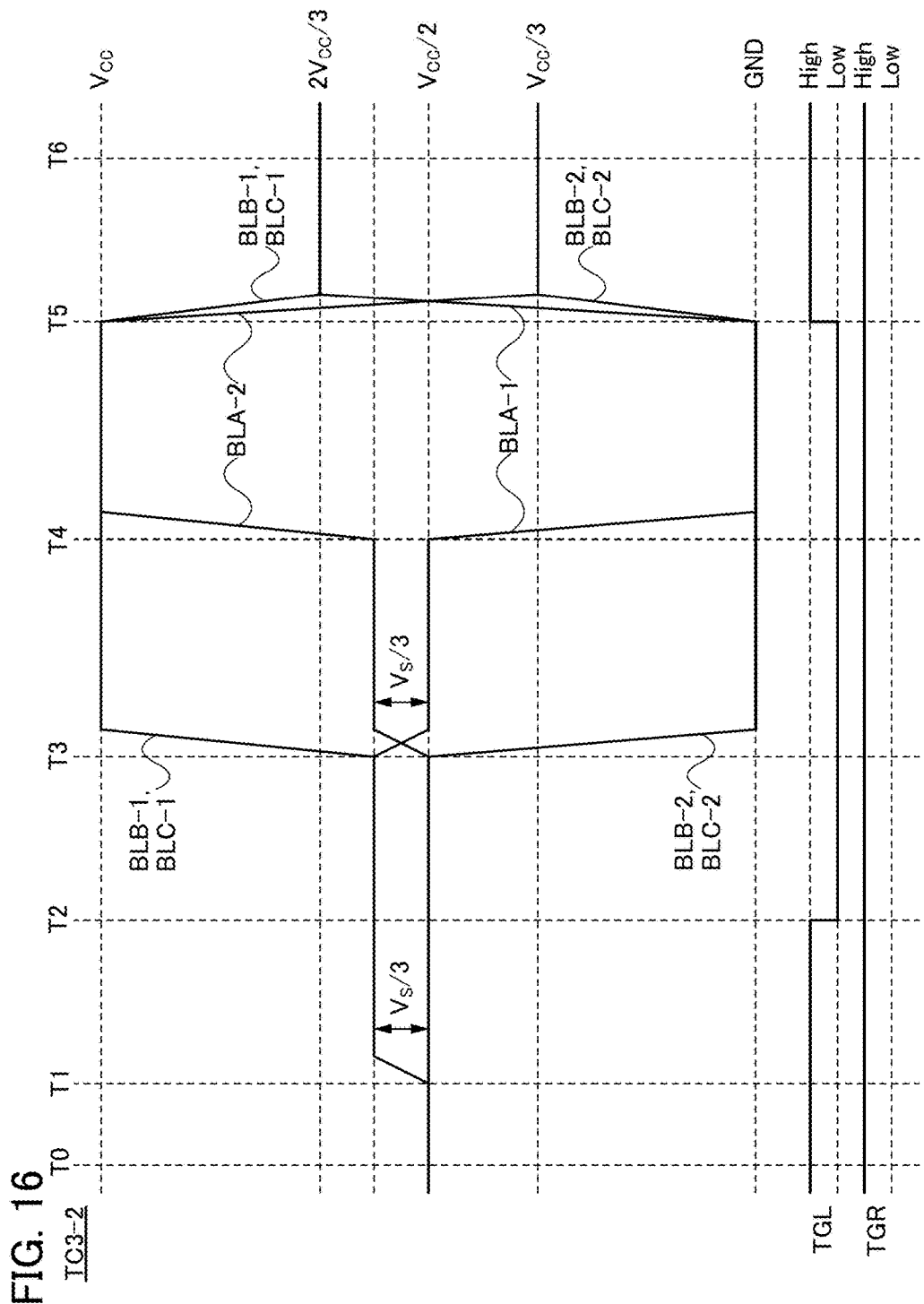
FIG. 16 is a timing chart showing an operation example of the semiconductor device shown in FIG. 14.

Next, operation examples of the semiconductor device 300 are described with reference to FIGS. 15 and 16. FIGS. 15 and 16 are timing charts each showing the operation of the semiconductor device 300.

<<Operation Example 3-1>>

A timing chart TC3-1 shown in FIG. 15 shows potential changes of the wiring BLA-1, the wiring BLA-2, the wiring BLB-1, the wiring BLB-2, the wiring BLC-1, the wiring BLC-2, the wiring TGL, and the wiring TGR in a period of reading data retained in the memory cell MCA[i] in the memory cell array MCALA. Note that data "10" is read in this operation example.

At Time T0, a high-level potential is applied to the wiring TGL, and the transistor TrL1 and the transistor TrL2 are turned on. In addition, a high-level potential is applied to the wiring TGR, and the transistor TrR1 and the transistor TrR2 are turned on. In this state, the wiring BLA-1 and the wiring BLA-2 are precharged at a potential $V_{CC}/2$. That is, the potentials of the wiring BLA-1, the wiring BLA-2, the wiring BLB-1, the wiring BLB-2, the wiring BLC-1, and the wiring BLC-2 are each $V_{CC}/2$. Note that after the precharge, the wiring BLA-1, the wiring BLB-1, the wiring BLC-1, the wiring BLA-2, the wiring BLB-2, and the wiring BLC-2 are brought into a floating state.

At Time T1, a high-level potential is applied to the wiring WLA[i] in order to read the data in the memory cell MCA[i]. Thus, the transistor TA[i] is turned on, and charges held in the memory cell MCA[i] are moved to the wiring BLA-1. By the charge movement, a potential of each of the wirings BLA-1, BLB-1, and BLC-1 is increased by $V_S/3$. After the data reading from the memory cell MCA[i] is finished, a low-level potential is applied to the wiring WLA[i], and the transistor TA[i] is turned off.

At Time T2, a low-level potential is applied to the wiring TGR. Thus, the transistor TrR1 and the transistor TrR2 are turned off. At this time, the wiring BLA-1, the wiring BLA-2, the wiring BLB-1, the wiring BLB-2, the wiring BLC-1, and the wiring BLC-2 are held at the same potentials as before Time T2.

At Time T3, the sense amplifier 101 is made to operate. At this time, the sense amplifier 101 is made to operate so as to change one of the potentials of the wirings BLA-1 and BLA-2 to Vcc and the other of the potentials of the wirings BLA-1 and BLA-2 to the GND potential. At this time, the potential of the wiring BLA-1 is amplified to Vcc because the potential of the wiring BLA-1 is higher than that of the wiring BLA-2. Meanwhile, the potential of the wiring BLA-2 is decreased to the GND potential. In this state, the high-order bit is read using the potential of the wiring BLA-1. Since the potential of the wiring BLA-1 is Vcc and higher than the reference potential, "1" can be read. Thus, the high-order bit can be read using the potential of the wiring BLA-1 between Time T3 and Time T4.

When the potentials of the wiring BLA-1 and the wiring BLA-2 are changed, the potentials of the wiring BLB-1 and the wiring BLB-2 are also changed concurrently because the transistor TrL1 and the transistor TrL2 are in an on state. That is, the potentials of the wiring BLA-1 and the wiring BLB-1 become Vcc, whereas the potentials of the wiring BLA-2 and the wiring BLB-2 become GND.

Furthermore, by the above-described operation of the sense amplifier, the potentials of the wirings BLC-1 and BLC-2 are changed through the cross-coupled capacitors CX1 and CX2. Specifically, the potential of the wiring BLC-2 electrically connected, via the capacitor CX1, to the wiring BLA-1 whose potential is increased to the potential Vcc is increased by $V_S/3$, and the potential of the wiring BLC-1 electrically connected, via the capacitor CX2, to the wiring BLA-2 whose potential is decreased to the GND potential is decreased by $V_S/3$.

At Time T4, the sense amplifier 102 is made to operate. At this time, the sense amplifier 102 is made to operate so as to change one of the potentials of the wirings BLC-1 and BLC-2 to Vcc and the other of the potentials of the wirings BLC-1 and BLC-2 to the GND potential. The potential of the wiring BLC-2 is amplified to Vcc because the potential of the wiring BLC-2 is higher than that of the wiring BLC-1. Meanwhile, the potential of the wiring BLC-1 is decreased to the GND potential. In this state, the low-order bit is read using the potential of the wiring BLC-1. Since the potential of the wiring BLC-1 is the GND potential and lower than the reference potential, "0" can be read. Thus, the low-order bit can be read using the potential of the wiring BLC-1 between Time T4 and Time T5.

At Time T5, a high-level potential is applied to the wiring TGR, and thus, the transistor TrR1 and the transistor TrR2 are turned on. By turning on the transistor TrR1, charges are redistributed between the wiring BLA-1 and the wiring BLB-1 at the potential Vcc and the wiring BLC-1 at the GND potential. The capacitor CA1, the capacitor CB1, and the capacitor CC1 have the same capacitance, and thus, the ratio of the sum of the capacitance of the capacitor CA1 and the capacitance of the capacitor CB1 to the capacitance of the capacitor CC1 is 2:1. That is, by the charge redistribution after turning on the transistor TrR1, the potentials of the wiring BLA-1, the wiring BLB-1, and the wiring BLC-1 each become $2V_{CC}/3$. Meanwhile, by turning on the transistor TrR2, charges are redistributed also between the wiring BLC-2 at the potential Vcc and the wiring BLA-2 and the wiring BLB-2 at the GND potential. The capacitor CA2, the capacitor CB2, and the capacitor CC2 have the same capacitance, and thus, the ratio of the sum of the capacitance of the capacitor CA2 and the capacitance of the capacitor CB2 to the capacitance of the capacitor CC2 is 2:1. That is, by the charge redistribution after turning on the transistor TrR2, the potentials of the wiring BLA-2, the wiring BLB-2, and the wiring BLC-2 each become $V_{CC}/3$.

After Time T6 at which the charge redistribution between the wiring BLA-1, the wiring BLB-1, and the wiring BLC-1 has been finished, a high-level potential is applied to the wiring WLA[i] in order to write the potentials of the wiring BLA-1, the wiring BLB-1, and the wiring BLC-1 to the data retention portion of the memory cell MCA[i]. Thus, the transistor TA[i] is turned on, and the potentials of the wiring BLA-1, the wiring BLB-1, and the wiring BLC-1, i.e., $2V_{CC}/3$, are written.

By the above-described operation from Time T0 to Time T6, the data "10" retained in the memory cell MCA[i] can be read.

Note that although an example of reading the data "10" is described in this operation example, data "11", "01", and "00" can also be read in a manner similar to that described above.

Note that in this operation example, the memory cell from which data is read is not limited to the memory cell MCA[i]. For example, data retained in the memory cell MCB[j] may be read instead of reading data retained in the memory cell MCA[i]. Also in the case where the memory cell MCB[j] is selected, the on/off of the transistor TrL1, the transistor TrL2, the transistor TrR1, and the transistor TrR2 is controlled in a manner similar to that described above, so that data of the memory cell MCB[j] can be read.

<<Operation Example 3-2>>

A timing chart TC3-2 shown in FIG. 16 shows potential changes of the wiring BLA-1, the wiring BLA-2, the wiring BLB-1, the wiring BLB-2, the wiring BLC-1, the wiring BLC-2, the wiring TGL, and the wiring TGR in a period of reading data retained in the memory cell MCC[p] in the memory cell array MCALC. Note that data "10" is read in this operation example.

At Time T0, a high-level potential is applied to the wiring TGL, and the transistor TrL1 and the transistor TrL2 are turned on. In addition, a high-level potential is applied to the wiring TGR, and the transistor TrR1 and the transistor TrR2 are turned on. In this state, the wiring BLA-1 and the wiring BLA-2 are precharged at a potential $V_{CC}/2$. That is, the potentials of the wiring BLA-1, the wiring BLA-2, the wiring BLB-1, the wiring BLB-2, the wiring BLC-1, and the wiring BLC-2 are each $V_{CC}/2$. Note that after the precharge, the wiring BLA-1, the wiring BLB-1, the wiring BLC-1, the wiring BLA-2, the wiring BLB-2, and the wiring BLC-2 are brought into a floating state.

At Time T1, a high-level potential is applied to the wiring WLC[p] in order to read the data in the memory cell MCC[p]. Thus, the transistor TC[p] is turned on, and charges held in the memory cell MCC[p] are moved to the wiring BLC-1. By the charge movement, a potential of each of the wirings BLA-1, BLB-1, and BLC-1 is increased by $V_S/3$. After the data reading from the memory cell MCC[p] is finished, a low-level potential is applied to the wiring WLC[p], and the transistor TC[p] is turned off.

At Time T2, a low-level potential is applied to the wiring TGL. Thus, the transistor TrL1 and the transistor TrL2 are turned off. At this time, the wiring BLA-1, the wiring BLA-2, the wiring BLB-1, the wiring BLB-2, the wiring BLC-1, and the wiring BLC-2 are held at the same potentials as before Time T2.

At Time T3, the sense amplifier 102 is made to operate. At this time, the sense amplifier 102 is made to operate so as to change one of the potentials of the wirings BLC-1 and BLC-2 to Vcc and the other of the potentials of the wirings BLC-1 and BLC-2 to the GND potential. At this time, the potential of the wiring BLC-1 is amplified to Vcc because the potential of the wiring BLC-1 is higher than that of the wiring BLC-2. Meanwhile, the potential of the wiring BLC-2 is decreased to the GND potential. In this state, the high-order bit is read using the potential of the wiring BLC-1. Since the potential of the wiring BLC-1 is Vcc and higher than the reference potential, "1" can be read. Thus, the high-order bit can be read using the potential of the wiring BLC-1 between Time T3 and Time T4.

When the potentials of the wiring BLC-1 and the wiring BLC-2 are changed, the potentials of the wiring BLB-1 and the wiring BLB-2 are also changed concurrently because the transistor TrR1 and the transistor TrR2 are in an on state. That is, the potentials of the wiring BLC-1 and the wiring BLB-1 become Vcc, whereas the potentials of the wiring BLC-2 and the wiring BLB-2 become GND.

Furthermore, by the above-described operation of the sense amplifier, the potentials of the wirings BLA-1 and BLA-2 are changed through the cross-coupled capacitors CX1 and CX2. Specifically, the potential of the wiring BLA-2 electrically connected, via the capacitor CX1, to the wiring BLC-1 whose potential is increased to the potential Vcc is increased by $V_S/3$, and the potential of the wiring BLA-1 electrically connected, via the capacitor CX2, to the wiring BLC-2 whose potential is decreased to GND is decreased by $V_S/3$.

At Time T4, the sense amplifier 101 is made to operate. At this time, the sense amplifier 101 is made to operate so as to change one of the potentials of the wirings BLA-1 and BLA-2 to Vcc and the other of the potentials of the wirings BLA-1 and BLA-2 to the GND potential. The potential of the wiring BLA-2 is amplified to Vcc because the potential of the wiring BLA-2 is higher than that of the wiring BLA-1. Meanwhile, the potential of the wiring BLA-1 is decreased to the GND potential. In this state, the low-order bit is read using the potential of the wiring BLA-1. Since the potential of the wiring BLA-1 is the GND potential and lower than the reference potential, "0" can be read. Thus, the low-order bit can be read using the potential of the wiring BLA-1 between Time T4 and Time T5.

At Time T5, a high-level potential is applied to the wiring TGL, and thus, the transistor TrL1 and the transistor TrL2 are turned on. By turning on the transistor TrL1, charges are redistributed between the wiring BLB-1 and the wiring BLC-1 at the potential Vcc and the wiring BLA-1 at the GND potential. The capacitor CA1, the capacitor CB1, and the capacitor CC1 have the same capacitance, and thus, the ratio of the sum of the capacitance of the capacitor CB1 and the capacitance of the capacitor CC1 to the capacitance of the capacitor CA1 is 2:1. That is, by the charge redistribution after turning on the transistor TrL1, the potentials of the wiring BLA-1, the wiring BLB-1, and the wiring BLC-1 each become $2V_{CC}/3$. Meanwhile, by turning on the transistor TrL2, charges are redistributed also between the wiring BLA-2 at the potential Vcc and the wiring BLB-2 and the wiring BLC-2 at the GND potential. The capacitor CA2, the capacitor CB2, and the capacitor CC2 have the same capacitance, and thus, the ratio of the sum of the capacitance of the capacitor CB2 and the capacitance of the capacitor CC2 to the capacitance of the capacitor CA2 is 2:1. That is, by the charge redistribution after turning on the transistor TrL2, the potentials of the wiring BLA-2, the wiring BLB-2, and the wiring BLC-2 each become $V_{CC}/3$.

After Time T6 at which the charge redistribution between the wiring BLA-1, the wiring BLB-1, and the wiring BLC-1 has been finished, a high-level potential is applied to the wiring WLC[p] in order to write the potentials of the wiring BLA-1, the wiring BLB-1, and the wiring BLC-1 to a data retention portion of the memory cell MCC[p]. Thus, the transistor TC[p] is turned on, and the potentials of the wiring BLA-1, the wiring BLB-1, and the wiring BLC-1, i.e., $2V_{CC}/3$, are written.

By the above-described operation from Time T0 to Time T6, the data "10" retained in the memory cell MCC[p] can be read.

Note that although an example of reading the data "10" is described in this operation example, data "11", "01", and "00" can also be read in a manner similar to that described above.

Note that in this operation example, the memory cell from which data is read is not limited to the memory cell MCC[p]. For example, data retained in the memory cell MCB[j] may be read instead of reading data retained in the memory cell MCC[p]. Also in the case where the memory cell MCB[j] is selected, the on/off of the transistor TrL1, the transistor TrL2, the transistor TrR1, and the transistor TrR2 is controlled in a manner similar to that described above, so that data of the memory cell MCB[j] can be read.

<Modification Example 3 of Structure>

The structure example and the operation examples of the semiconductor device 300 are described above, but one embodiment of the present invention is not limited thereto. For example, the capacitors CA1, CA2, CB1, and CB2 need not be provided in the case where the parasitic capacitance of the wiring BLA-1, the parasitic capacitance of the wiring BLA-2, the parasitic capacitance of the wiring BLB-1, the parasitic capacitance of the wiring BLB-2, the parasitic capacitance of the wiring BLC-1, and the parasitic capacitance of the wiring BLC-2 are equal to the capacitance of the capacitor CA1, the capacitance of the capacitor CA2, the capacitance of the capacitor CB1, the capacitance of the capacitor CB2, the capacitance of the capacitor CC1, and the capacitance of the capacitor CC2, respectively. That is, when the parasitic capacitance of the wiring is taken into consideration and a circuit configuration using the parasitic capacitance of the wiring instead of using the capacitor is employed, the circuit area of the semiconductor device can be reduced. Alternatively, the capacitance of the capacitor CA1, the capacitance of the capacitor CA2, the capacitance of the capacitor CB1, the capacitance of the capacitor CB2, the capacitance of the capacitor CC1, the capacitance of the capacitor CC2, the capacitance of the capacitor CX1, and the capacitance of the capacitor CX2 may each be changed to an appropriate value to form a circuit in consideration of the influence of the storage capacitance of the memory cell subjected to data reading, the parasitic capacitance of the wiring, and the parasitic capacitance of the transistor, for example.

The transistors TA[1] to TA[m], the transistors TB[1] to TB[n], and the transistors TC[1] to TC[p] used in the semiconductor device 300 are preferably OS transistors. In particular, oxide semiconductors included in their channel formation regions each preferably include indium, gallium, and zinc. The transistors including the oxide semiconductors have characteristics of an extremely low off-state current, and therefore, data degradation due to the leakage of current can be suppressed.

The transistor TrL1, the transistor TrL2, the transistor TrR1, and the transistor TrR2 can also be OS transistors as described above. In that case, the movement of charges between the wirings BLA-1 and BLB-1, between the wirings BLB-1 and BLC-1, between the wirings BLA-2 and BLB-2, and between the wirings BLB-2 and BLC-2 when the transistors TrL1, TrL2, TrR1, and TrR2 are off can be suppressed.

Note that the structure of this embodiment is not limited to FIG. 14. The capacitors CA1, CA2, CB1, CB2, CC1, CC2, CX1, and CX2 in the layer LYR1 and the capacitors CSA[1] to CSA[m], the capacitors CSB[1] to CSB[n], and the capacitors CSC[1] to CSC[p] in the layer LYR2 may be provided in a layer over the layer LYR2, for example. When such a structure is used, a manufacturing process of the semiconductor device 300 can be made simpler, and the circuit area thereof can be reduced.

The capacitors CA1, CA2, CB1, CB2, CC1, CC2, CX1, and CX2 may be provided between the layer LYR1 and the layer LYR2 whereas the capacitors CSA[1] to CSA[m], the capacitors CSB[1] to CSB[n], and the capacitors CSC[1] to CSC[p] are provided in a layer over the layer LYR2, for example. When such a structure is used, the circuit area of the semiconductor device 100 or the semiconductor device 300 can be reduced.

In the case where the channel formation regions of the transistors TA[1] to TA[m], the transistors TB[1] to TB[n], and the transistors TC[1] to TC[p] and channel formation regions of the transistors TrL1, TrL2, TrR1, and TrR2 are formed using the same material, the transistors TrL1, TrL2, TrR1, and TrR2 may be provided in the layer LYR2, for example. When such a structure is used, a manufacturing process of the semiconductor device 300 can be made simpler.

Note that this embodiment can be combined with any of the other embodiments in this specification as appropriate.

Embodiment 4

A configuration example of a memory device of one embodiment of the present invention will be described with reference to FIG. 17.

Figure 17:
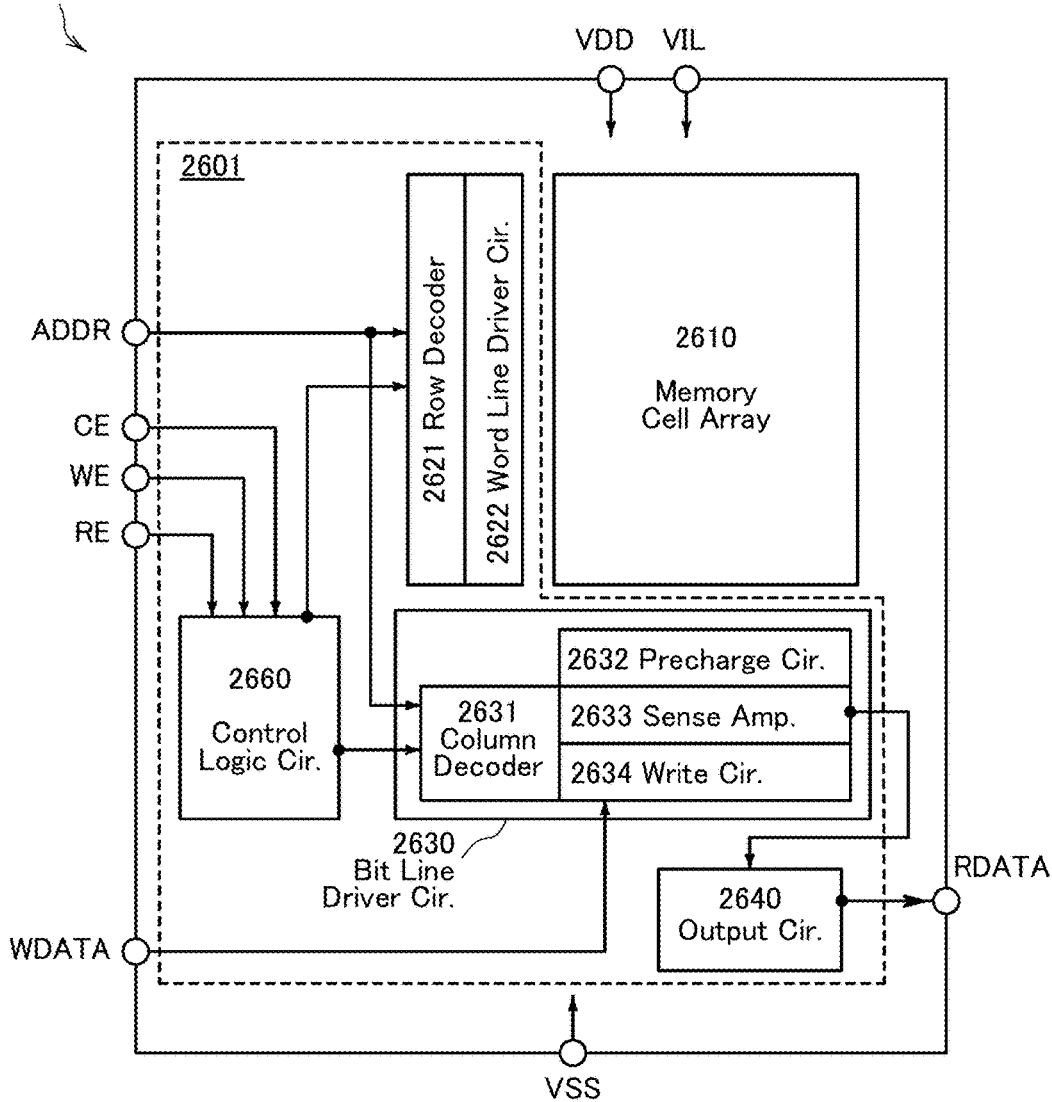
FIG. 17 is a block diagram showing an example of a memory device.

FIG. 17 illustrates a configuration example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wiring BLA, the wiring BLB, or the wiring BLC (not shown in FIG. 17) described in the above embodiment. The sense amplifier 2633 has a function of amplifying a data signal input from the wiring BLA, the wiring BLB, or the wiring BLC. The amplified data signal is output as a digital data signal RDATA from the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that whether each of the aforementioned circuits or signals is provided can be determined as appropriate and as needed.

When a p-channel Si transistor and a transistor including a channel formation region using an oxide semiconductor (preferably an oxide containing In, Ga, and Zn) described in Embodiment below are used in the memory device 2600, the memory device 2600 can be reduced in size. In addition, the memory device 2600 can be reduced in power consumption. Furthermore, the memory device 2600 can be increased in operation speed. In particular, by using only a p-channel transistor as the Si-transistor, manufacturing costs can be reduced.

Note that the configuration of this embodiment is not limited to that shown in FIG. 17. For example, when applied to Embodiment 1, 2, or 3, the configuration may be changed as appropriate so that, for example, the sense amplifier 2633 is provided under the memory cell array 2610.

Note that this embodiment can be combined with any of the other embodiments in this specification as appropriate.

Embodiment 5

Described in this embodiment is a central processor unit (CPU) using the semiconductor device shown in the above embodiments.

Figure 18:
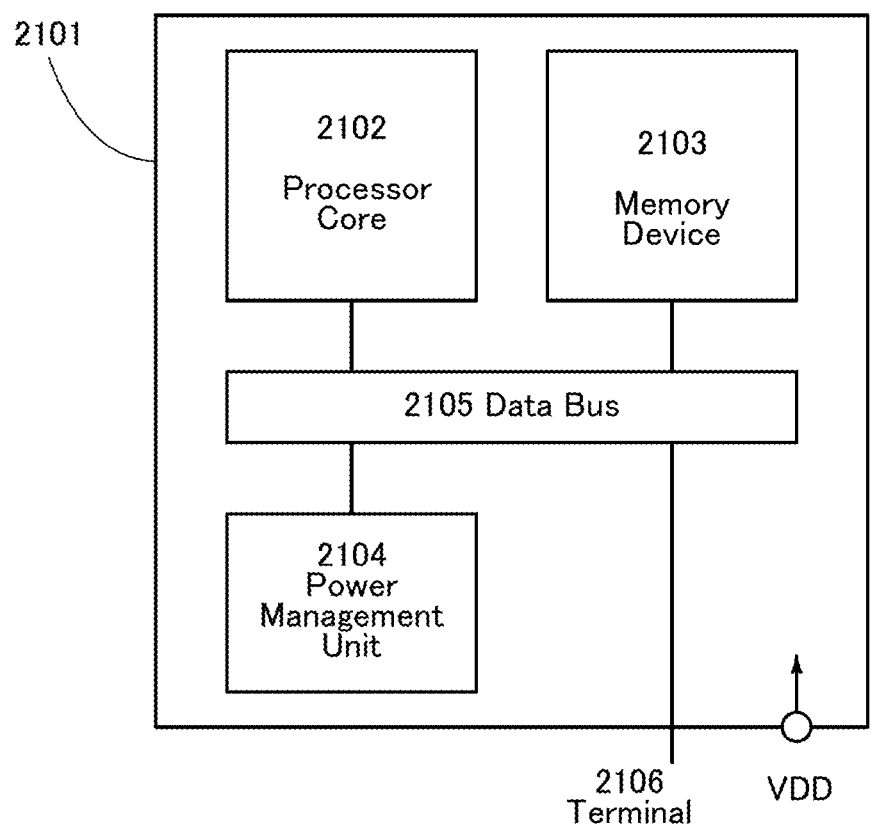
FIG. 18 is a block diagram showing an example of an electronic component.

FIG. 18 is a block diagram showing a configuration example of a CPU.

A CPU 2100 shown in FIG. 18 includes, over a substrate 2101, a processor core 2102, a memory device 2103, a power management unit (PMU) 2104, and a data bus 2105. As the substrate 2101, a semiconductor substrate, an SOI substrate, a glass substrate, or the like is used.

The processor core 2102 has a function of performing a variety of arithmetic operations such as four arithmetic operations and logic operations.

The memory device 2103 has a function of temporarily storing frequently used data, data used for arithmetic operations, data of arithmetic operation results, and the like during the operation of the CPU 2100. Thus, the memory device 2103 serves as a main memory or a cache memory of the CPU 2100.

The PMU 2104 receives an external voltage VSS and controls power supply to the processor core 2102, the memory device 2103, the PMU 2104, and other circuits.

Note that FIG. 18 does not show wirings through which power is supplied to each circuit from the PMU 2104. The external voltage VSS is not necessarily supplied to each circuit through the PMU 2104, and may be directly supplied to each circuit.

Data is communicated between the processor core 2102 and the memory device 2103 or the PMU 2104 through the data bus 2105. Note that when the CPU 2100 is started up, electric power is directly supplied to the processor core 2102 from the PMU 2104 in some cases.

The data bus 2105 is electrically connected to a terminal 2106 of the CPU 2100. When the CPU 2100 performs processing, a program code is input to the terminal 2106 and sent to the processor core 2102 through the data bus 2105; then, arithmetic operation is performed.

Alternatively, an internal circuit of the CPU 2100 may be electrically connected to the outside so that data is directly communicated without through the data bus 2105. For example, data may be directly transmitted to the PMU 2104 to control the processor core 2102.

The CPU 2100 is just an example with a simplified configuration, and an actual CPU may have various configurations depending on the application. For example, a CPU may have the following configuration: a plurality of cores, each of which includes the arithmetic circuit, operate in parallel. The number of bits that the CPU can process in an internal arithmetic circuit or a data bus can be, for example, 8, 16, 32, or 64.

As the memory device 2103, any of the semiconductor devices 100, 110, 200, 210, and 300 described in Embodiment 1 can be used. The use of the semiconductor devices 100, 110, 200, 210, and 300, which are multilevel memories, for the CPU 2100 contributes to a reduction in the size of the CPU.

Furthermore, by using OS transistors in the semiconductor devices 100, 110, 200, 210, and 300, the reading and writing operation speed can be increased, achieving a CPU with a high processing speed. In addition, the OS transistors have an extremely low off-state current and therefore consume less power, i.e., the power consumption of the CPU can be reduced.

Note that this embodiment can be combined with any of the other embodiments in this specification as appropriate.

Embodiment 6

Described in this embodiment are transistors of one embodiment of the disclosed invention.

Transistors according to one embodiment of the present invention each preferably include an nc-OS or a CAAC-OS, which are described in Embodiment 7.

<Structure Example 1 of Transistor>

Figure 19A:
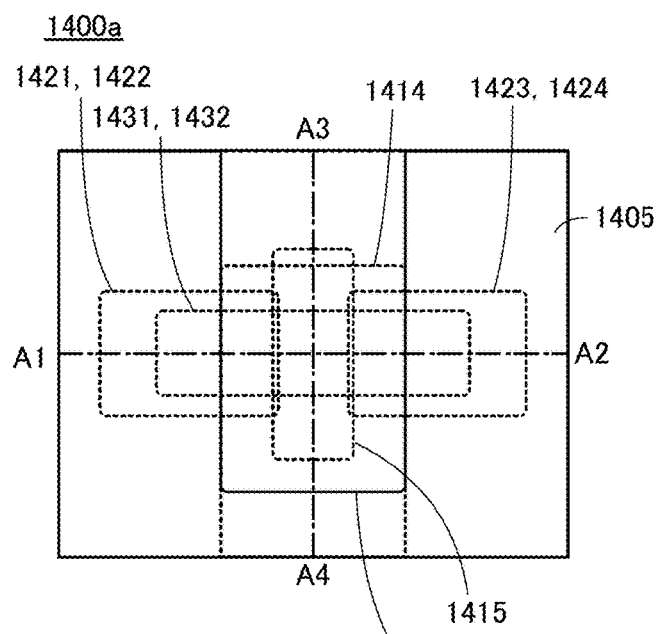
FIG. 19A is a top view and FIGS. 19B and 19C are cross-sectional views illustrating a structure example of a transistor.
Figure 19B:
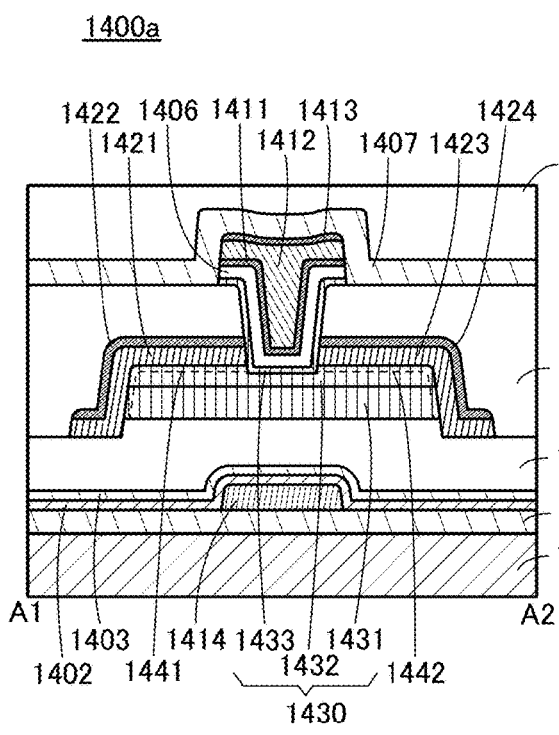
Figure 19C:
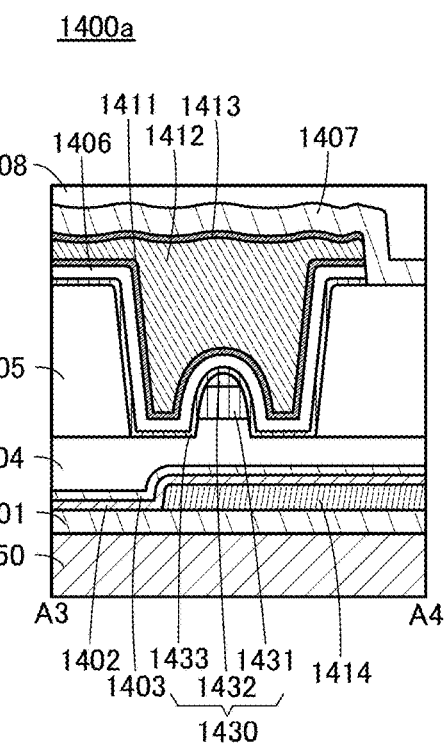

FIGS. 19A to 19C are a top view and cross-sectional views of a transistor 1400a. FIG. 19A is a top view, FIG. 19B is a cross-sectional view taken along dashed-dotted line A1-A2 in FIG. 19A, and FIG. 19C is a cross-sectional view taken along dashed-dotted line A3-A4 in FIG. 19A. Note that for simplification of the drawing, some components are not illustrated in the top view in FIG. 19A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 touching top and side surfaces of the metal oxide 1432, a conductive film 1423 also touching the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 touching the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423.

It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 19C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As shown in FIG. 19B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 20A:
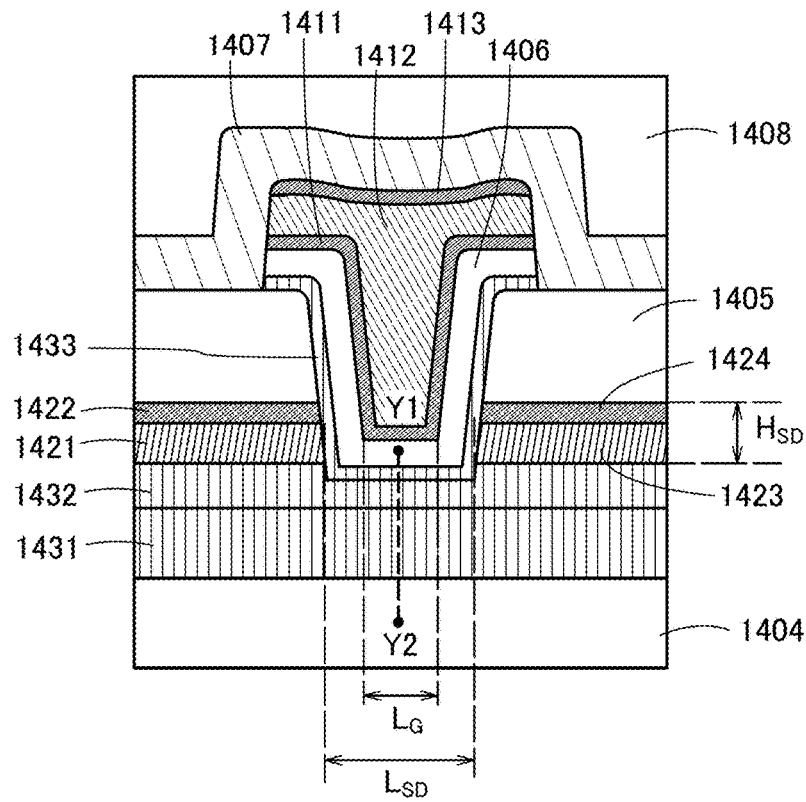
FIG. 20A is a cross-sectional view illustrating a structure example of a transistor and FIG. 20B is an energy band diagram of the transistor.

FIG. 20A is an enlarged view of the center of the transistor 1400a. In FIG. 20A, a width $L_G$ denotes the length of the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 20A, a width $L_{SD}$ denotes the length between the conductive films 1421 and 1423, i.e., the length between the source electrode and the drain electrode.

The width $L_{SD}$ is generally determined by the minimum feature size. As shown in FIG. 20A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 20A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described.

The transistor 1400a preferably has a low current (off-state current) flowing between a source and a drain in the non-conduction state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later.

The metal oxides 1431 and 1433 include, for example, one or more, or two or more elements other than oxygen included in the metal oxide 1432. Since the metal oxides 1431 and 1433 include one or more, or two or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with the above composition is preferably used. For example, In: M: Zn is preferably 1:3:2 or 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with the above composition is preferably used. For example, In: M: Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In: M: Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 20B:
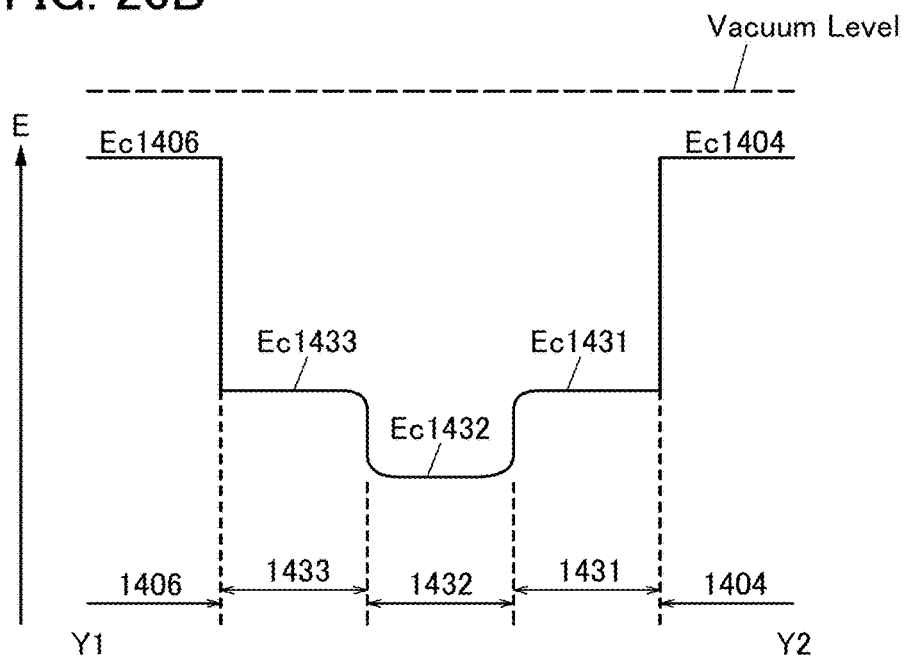

Next, the function and effect of the metal oxide 1430, which includes a stack of the metal oxides 1431 to 1433, are described with reference to the energy band diagram of FIG. 20B. FIG. 20B shows an energy band structure of a portion taken along dashed line Y1-Y2 in FIG. 20A, that is, the energy band structure of a channel formation region of the transistor 1400a and the vicinity thereof.

In FIG. 20B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity is an energy gap between the vacuum level and the bottom of the conduction band.

An indium gallium oxide has low electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 have a function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed. Alternatively, any one of the metal oxides 1431 to 1433 may be provided over or below the metal oxide 1431 or over or below the metal oxide 1433, i.e., a four-layer structure may be employed. Further alternatively, an n-layer structure (n is an integer of 5 or more) in which any one of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used in an oxygen introducing method. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 21A:
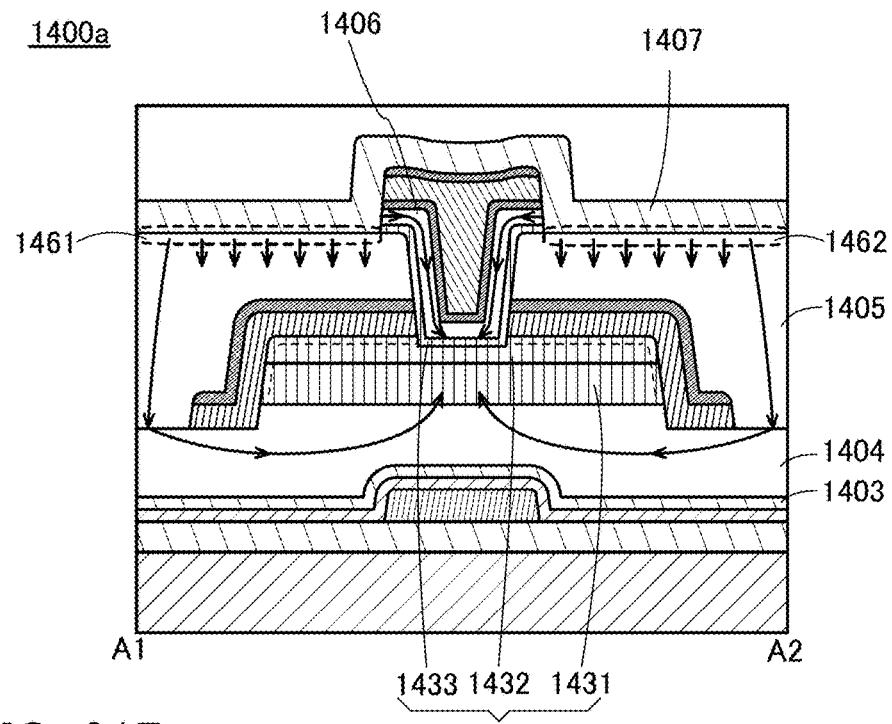
FIGS. 21A and 21B are cross-sectional views illustrating oxygen diffusion paths.
Figure 21B:
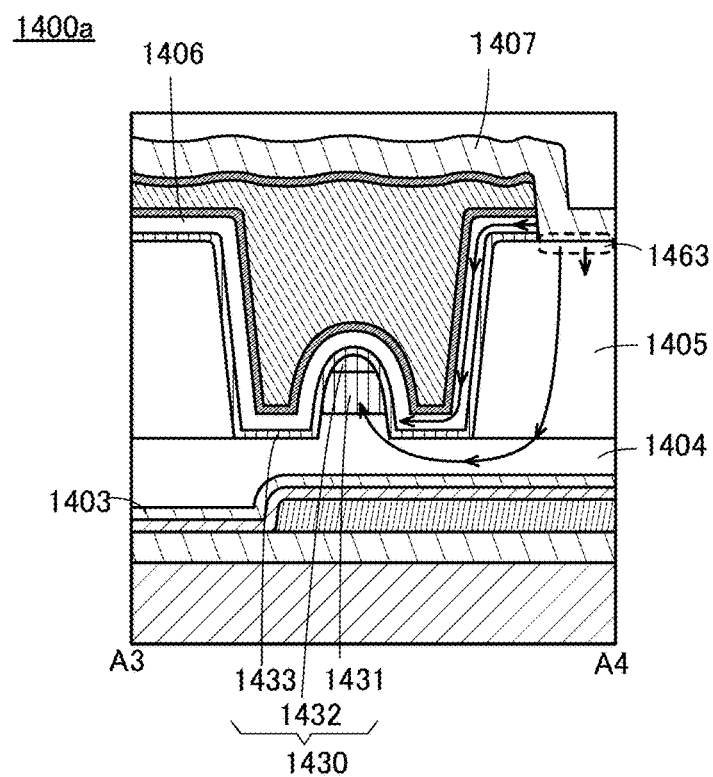

In schematic views of FIGS. 21A and 21B, oxygen added to the insulating films 1405 and 1406 in the formation of the insulating film 1407 is diffused in the insulating films through the second heat treatment and reaches the metal oxide 1430. In FIG. 21A, oxygen diffused in the cross-sectional view of FIG. 19B is indicated by arrows. In FIG. 21B, oxygen diffused in the cross-sectional view of FIG. 19C is indicated by arrows.

As shown in FIGS. 21A and 21B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted in the transistor 1400a shown in FIGS. 19A to 19C. An example of such a structure is shown in FIGS. 22A to 22C.

Figure 22A:
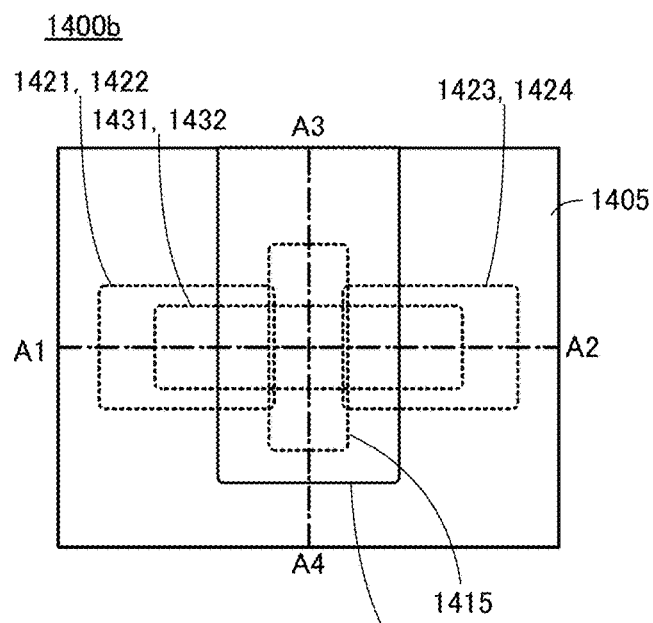
FIGS. 22A to 22C are a top view and cross-sectional views illustrating a structure example of a transistor.
Figure 22B:
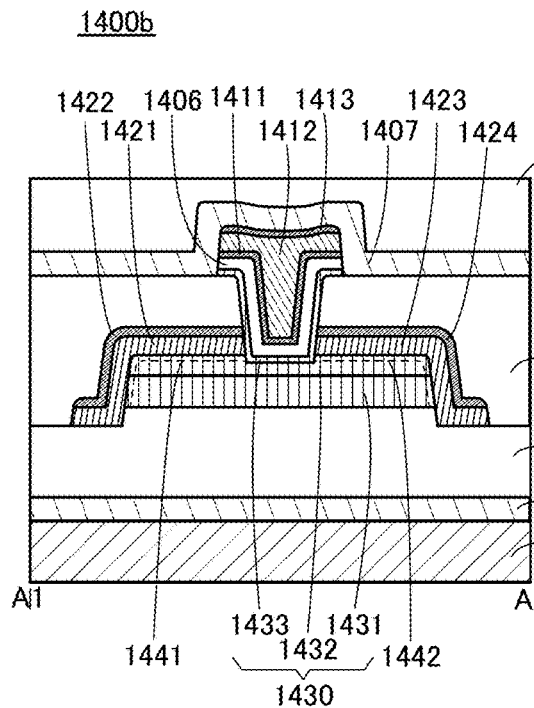
Figure 22C:
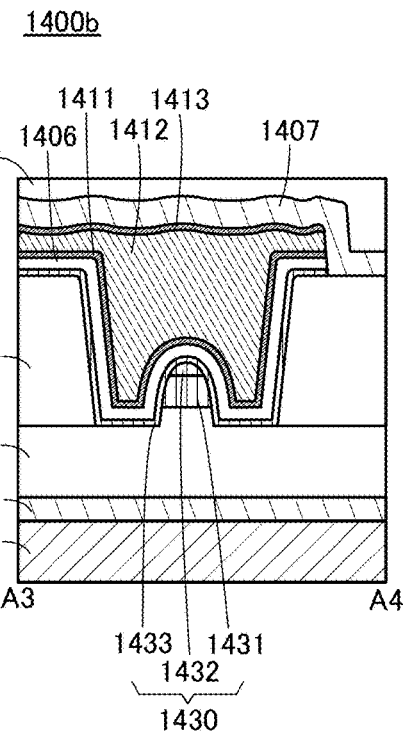

FIGS. 22A to 22C are a top view and cross-sectional views of a transistor 1400b. FIG. 22A is a top view. FIG. 22B is a cross-sectional view taken along dashed-dotted line A1-A2 in FIG. 22A and FIG. 22C is a cross-sectional view taken along dashed-dotted line A3-A4 in FIG. 22A. Note that for simplification of the drawing, some components are not illustrated in the top view in FIG. 22A. Note that the dashed-dotted line A1-A2 and the dashed-dotted line A3-A4 are sometimes referred to as a channel length direction of the transistor 1400b and a channel width direction of the transistor 1400b, respectively.

In the transistor 1400a shown in FIGS. 19A to 19C, parts of the conductive films 1421 and 1423 that overlap with the gate electrode (the conductive films 1411 to 1413) can be reduced in thickness. An example of such a structure is shown in FIGS. 23A to 23C.

Figure 23A:
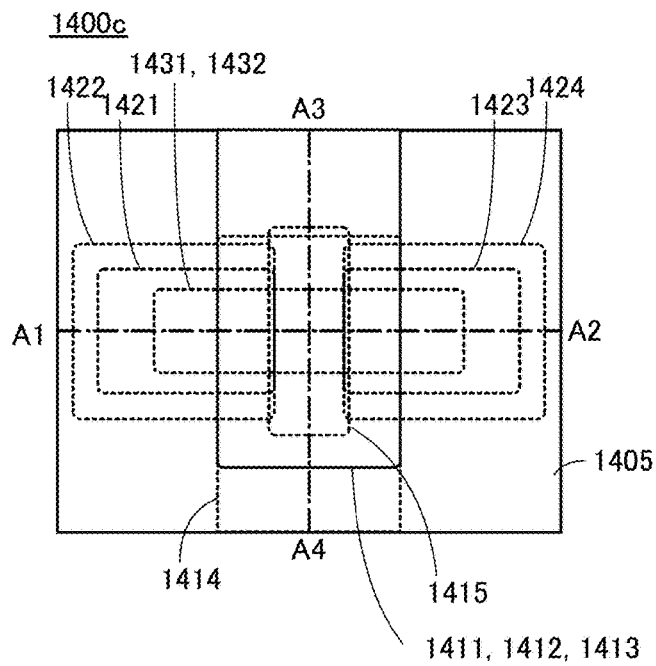
FIG. 23A is a top view and FIGS. 23B and 23C are cross-sectional views illustrating a structure example of a transistor.
Figure 23B:
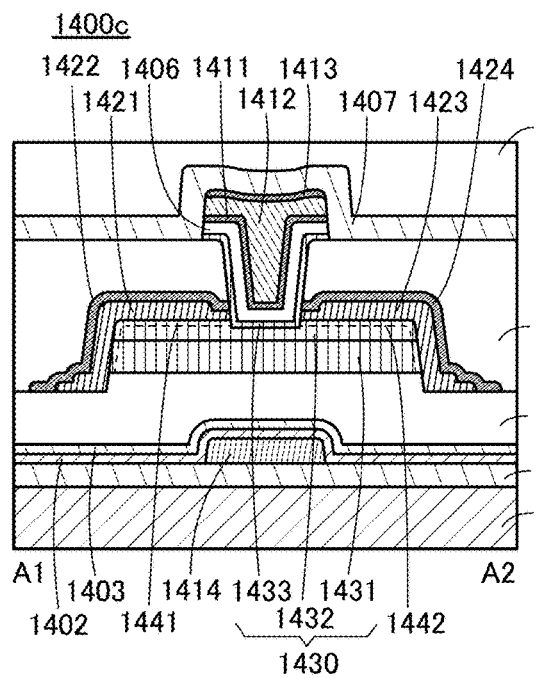
Figure 23C:
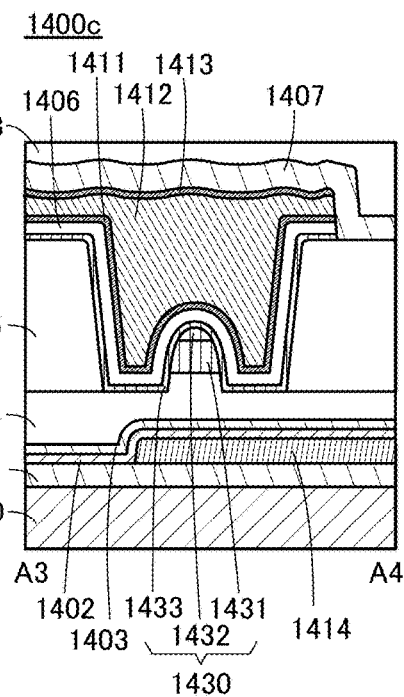

FIGS. 23A to 23C are a top view and cross-sectional views of a transistor 1400c. FIG. 23A is a top view. FIG. 23B is a cross-sectional view taken along dashed-dotted line A1-A2 in FIG. 23A and FIG. 23C is a cross-sectional view taken along dashed-dotted line A3-A4 in FIG. 23A. Note that for simplification of the drawing, some components are not illustrated in the top view in FIG. 23A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c shown in FIG. 23B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure shown in FIG. 23B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 3 of Transistor>

In the transistor 1400c shown in FIGS. 23A to 23C, the width of the metal oxides 1431 and 1432 can be increased in the A3-A4 direction. An example of such a structure is shown in FIGS. 24A to 24C.

Figure 24A:
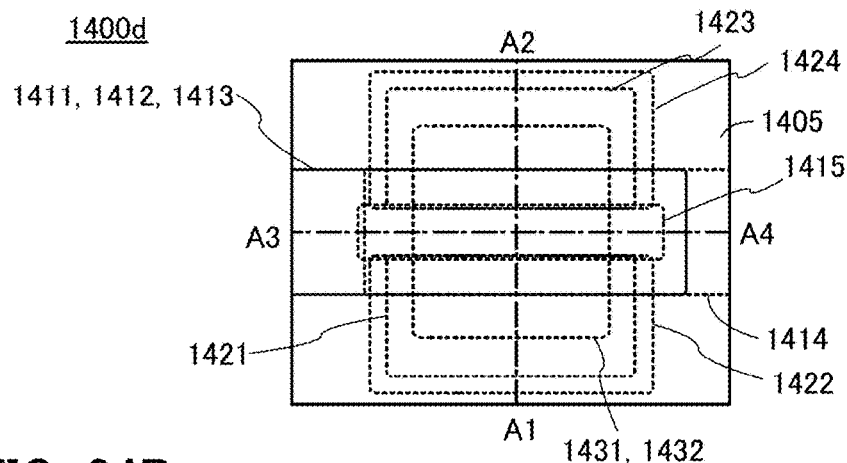
FIG. 24A is a top view and FIGS. 24B and 24C are cross-sectional views illustrating a structure example of a transistor.
Figure 24B:
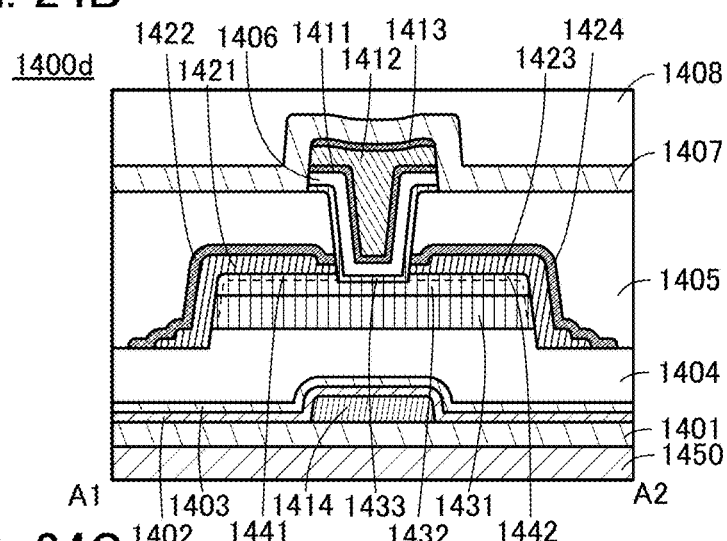
Figure 24C:
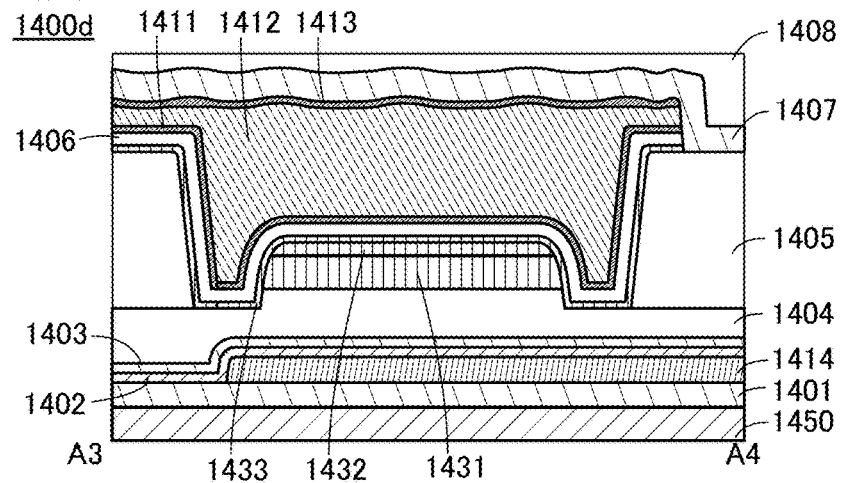

FIGS. 24A to 24C are a top view and cross-sectional views of a transistor 1400d. FIG. 24A is a top view. FIG. 24B is a cross-sectional view taken along dashed-dotted line A1-A2 in FIG. 24A and FIG. 24C is a cross-sectional view taken along dashed-dotted line A3-A4 in FIG. 24A. Note that for simplification of the drawing, some components are not illustrated in the top view in FIG. 24A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure shown in FIGS. 24A to 24C, can have an increased on-state current.

<Structure Example 4 of Transistor>

In the transistor 1400c shown in FIGS. 23A to 23C, a plurality of regions (fins) consisting of the metal oxides 1431 and 1432 may be provided in the A3-A4 direction. An example of such a structure is shown in FIGS. 25A to 25C.

Figure 25A:
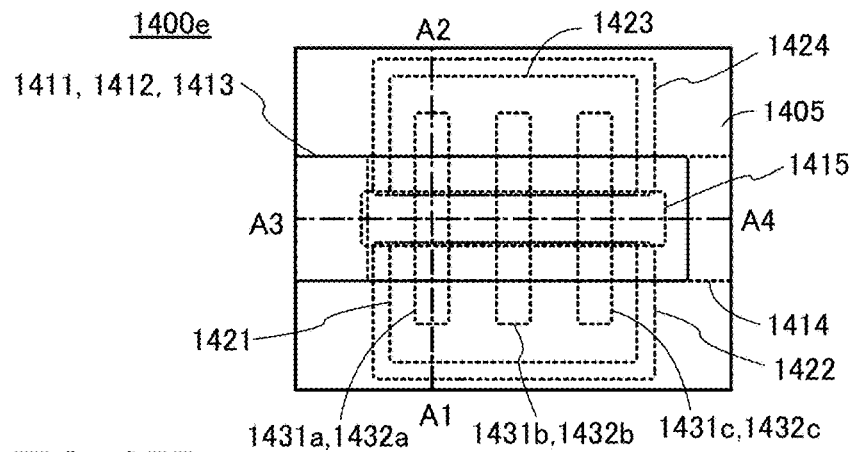
FIG. 25A is a top view and FIGS. 25B and 25C are cross-sectional views illustrating a structure example of a transistor.
Figure 25B:
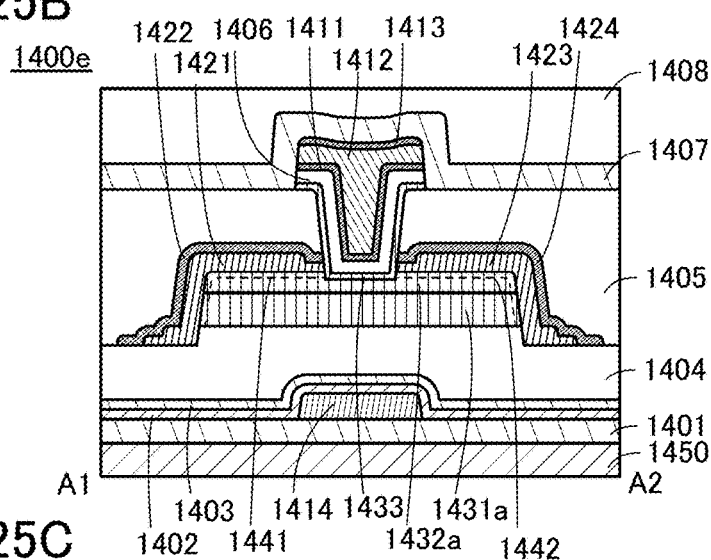
Figure 25C:
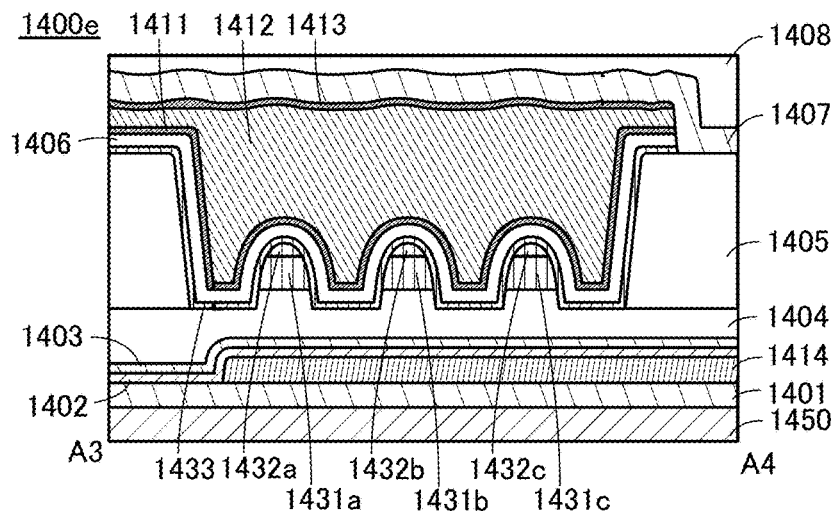

FIGS. 25A to 25C are a top view and cross-sectional views of a transistor 1400e. FIG. 25A is a top view. FIG. 25B is a cross-sectional view taken along dashed-dotted line A1-A2 in FIG. 25A and FIG. 25C is a cross-sectional view taken along dashed-dotted line A3-A4 in FIG. 25A. Note that for simplification of the drawing, some components are not illustrated in the top view in FIG. 25A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

<Structure Example 5 of Transistor>

Figure 26A:
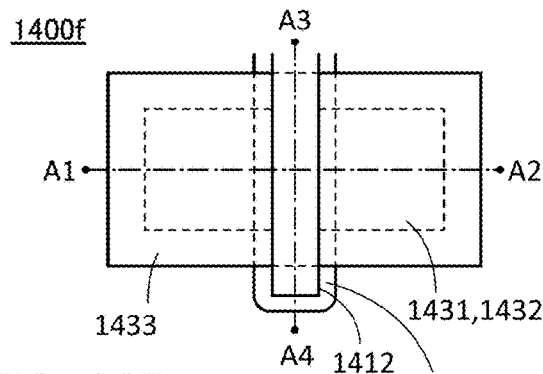
FIG. 26A is a top view and FIGS. 26B to 26D are cross-sectional views illustrating a structure example of a transistor.
Figure 26B:
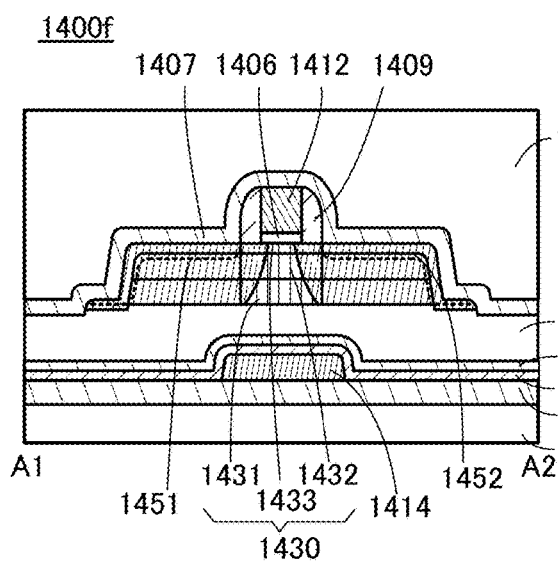
Figure 26C:
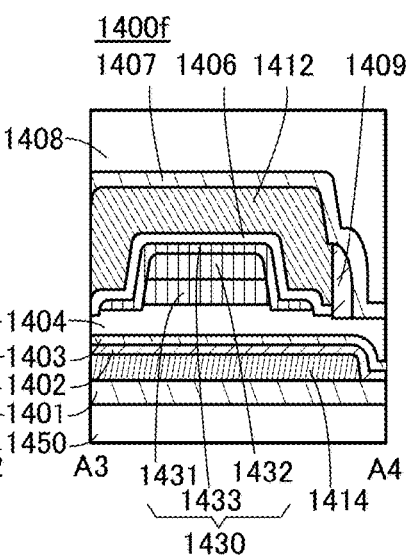

FIGS. 26A to 26D are a top view and cross-sectional views of a transistor 1400f. FIG. 26A is a top view of the transistor 1400f. FIG. 26B is a cross-sectional view taken along dashed-dotted line A1-A2 in FIG. 26A and FIG. 26C is a cross-sectional view taken along dashed-dotted line A3-A4 in FIG. 26A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407 and the insulating film 1408. The insulating film 1407 is covered with the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

Figure 26D:
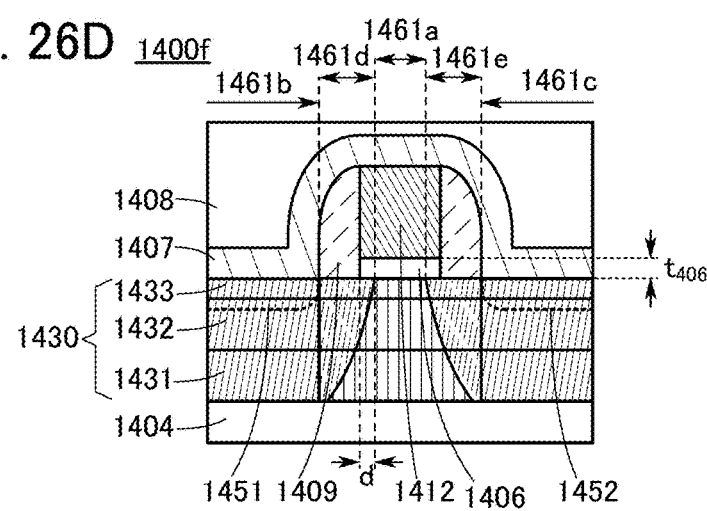

FIG. 26D is an enlarged view of part of FIG. 26B. As shown in FIG. 26D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 26D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 26D, the border between the regions 1461b and 1461d overlaps with the border between the side edges of the insulating films 1407 and 1409. The same applies to the border between the regions 1461c and 1461e. Here, part of the regions 1461d and 1461e preferably overlaps with part of a region (a channel formation region) where the metal oxide 1432 and the conductive film 1412 overlap with each other. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25t_{406}<d<t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as shown in FIG. 26D, the boundary between the regions 1461d and 1461a sometimes gets closer to the boundary between the regions 1461d and 1461b with the depth in the direction from the top surface of the metal oxide 1433 to the bottom surface of the metal oxide 1431. The distance d in that case is the distance between the boundary between the regions 1461d and 1461a which is closest to the inner part of the conductive film 1412 in the direction of the dashed-dotted line A1-A2 and the side edge of the conductive film 1412 at A1 side in the direction of the dashed-dotted line A1-A2. Also, the boundary between the regions 1461e and 1461a sometimes gets closer to the boundary between the regions 1461e and 1461c with the depth in the direction from the top surface of the metal oxide 1433 to the bottom surface of the metal oxide 1431. The distance d in that case is the distance between the boundary between the regions 1461e and 1461a which is closest to the inner part of the conductive film 1412 in the direction of the dashed-dotted line A1-A2 and the side edge of the conductive film 1412 at A2 side in the direction of the dashed-dotted line A1-A2.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

<Structure Example 6 of Transistor>

Figure 27A:
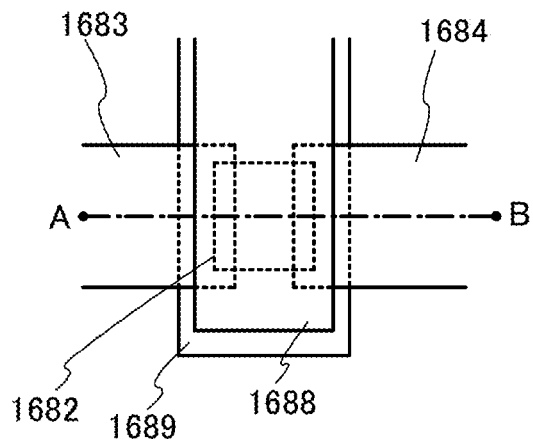
FIG. 27A is a top view and FIG. 27B is a cross-sectional view illustrating a structure example of a transistor.
Figure 27B:
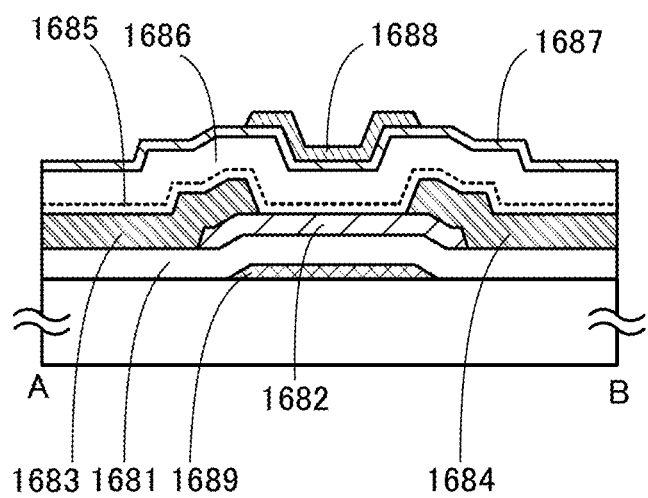

FIGS. 27A and 27B are a top view and a cross-sectional views of a transistor 1680. FIG. 27A is a top view, and FIG. 27B is a cross-sectional view taken along dashed-dotted line A-B in FIG. 27A. Note that for simplification of the drawing, some components are increased or reduced in size, or omitted in FIGS. 27A and 27B. Note that the dashed-dotted line A-B is sometimes referred to as a channel length direction.

The transistor 1680 shown in FIG. 27B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 19A to 19C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 is not necessarily provided.

The description of the metal oxide 1432 in FIGS. 19A to 19C can be referred to for the details of the semiconductor 1682. The semiconductor 1682 may be a single layer or a stack including a plurality of semiconductor layers.

The description of the conductive films 1421 to 1424 in FIGS. 19A to 19C can be referred to for the details of the conductive films 1683 and 1684.

The description of the insulating film 1406 in FIGS. 19A to 19C can be referred to for the details of the insulating film 1681.

The insulating films 1685 to 1687 are sequentially stacked over the semiconductor 1682 and the conductive films 1683 and 1684 in FIG. 27B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as shown in FIG. 27B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 7

In this embodiment, structure examples of a device that can be applied to the semiconductor devices 100, 110, 200, and 300 (hereinafter the semiconductor devices are referred to as semiconductor devices CD) shown in the above embodiments will be described with reference to FIGS. 28A and 28B, FIGS. 29A and 29B, FIGS. 30A and 30B, and FIGS. 31A and 31B.

<Cross-Sectional View 1>

Figure 28A:
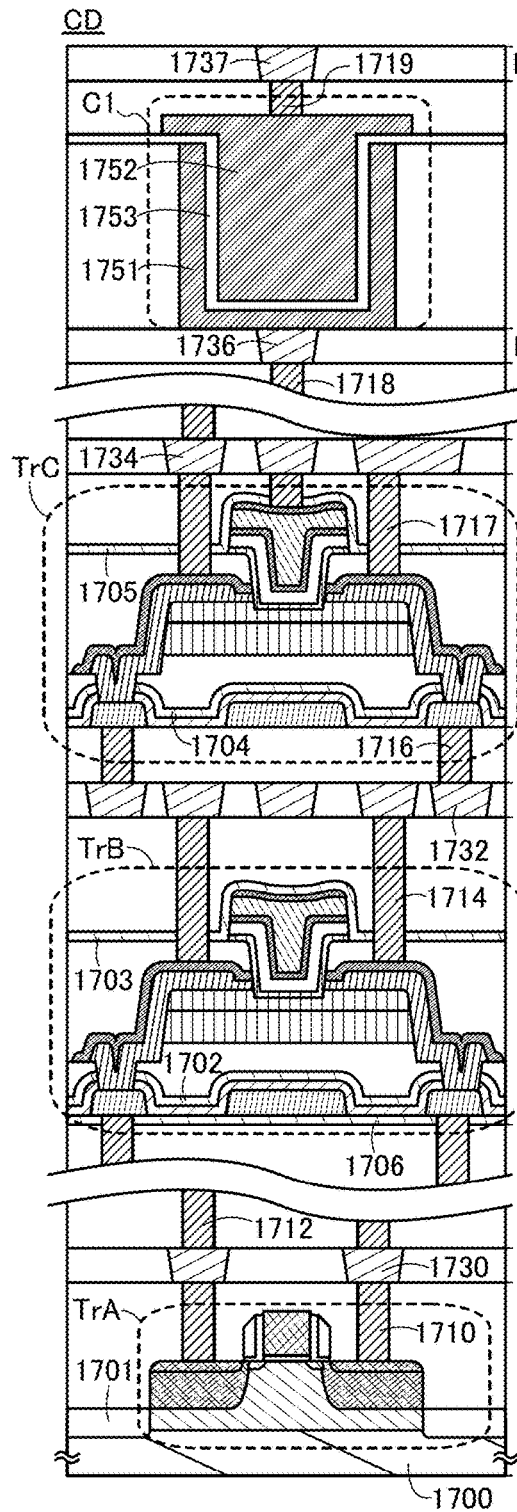
FIGS. 28A and 28B are cross-sectional views showing structure examples of a memory cell.
Figure 28B:
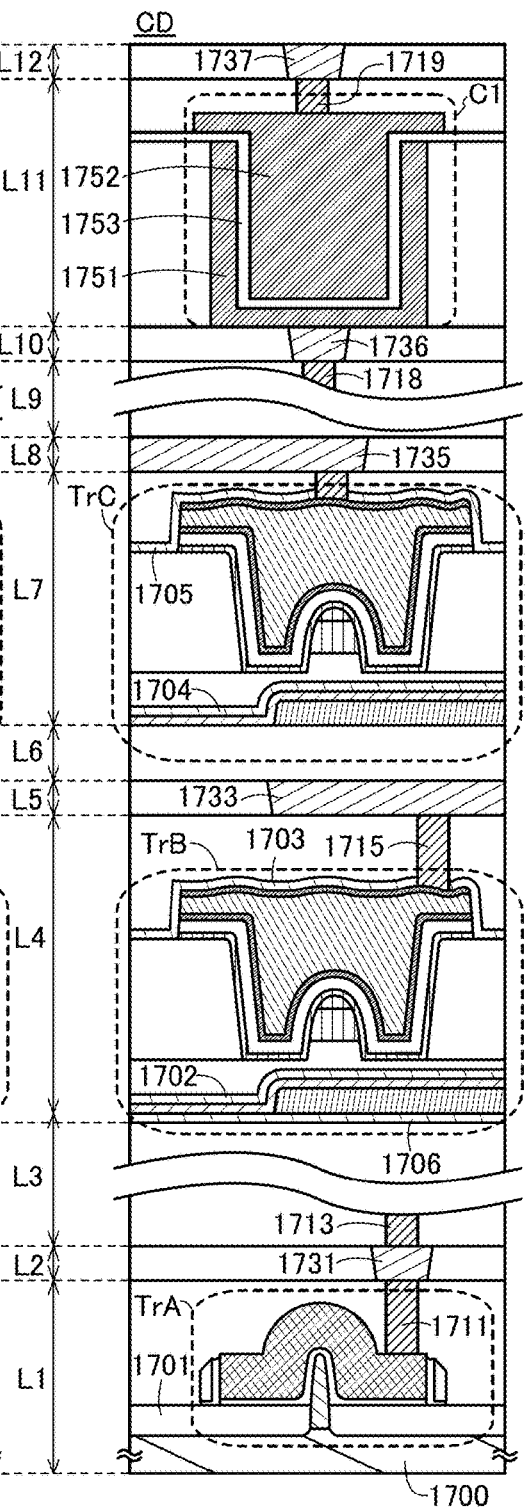

FIGS. 28A and 28B are cross-sectional views of part of the semiconductor device CD. FIG. 28A shows a cross section of transistors forming the memory cells MCA[1] to MCA[m], the memory cells MCB[1] to MCA[n], the memory cells MCC[1] to MCC[p], the dummy cell MCDA, and the dummy cell MCDB (hereinafter the cells are referred to as memory cells MC) of the semiconductor device CD in the channel length direction. FIG. 28B shows a cross section of the transistors forming the memory cells MC of the semiconductor device CD in the channel width direction.

The semiconductor device CD shown in FIGS. 28A and 28B includes layers L1 to L12 in order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not shown).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not shown).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulator 1753.

The layer L12 includes a plurality of wirings such as a wiring 1737.

The OS transistor shown in Embodiment 6 is preferably used as the transistors TrB and TrC. In FIGS. 28A and 28B, the transistor 1400c shown in FIGS. 23A and 23B is used as the transistors TrB and TrC.

The transistor TrA is preferably formed using a semiconductor material different from that for the transistors TrB and TrC. In FIGS. 28A and 28B, a Si transistor is used as the transistor TrA.

That is, the layer L1 and the layer L2 are preferably formed in the layer LYR1, and the layers L4 to L11 are preferably formed in the layer LYR2. The capacitor CAL the capacitor CA2, the capacitor CB1, and the capacitor CB2 in the layer LYR1 may be provided in the layer L11, not in the layers L1 and L2. In the case where OS transistors are used as the transistors Tr1 and Tr2 in the layer LYR1, the transistors Tr1 and Tr2 may be provided in the layers L4 to L7.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIGS. 28A and 28B, as an example, a single crystal silicon wafer is used as the substrate 1700.

Figure 30A:
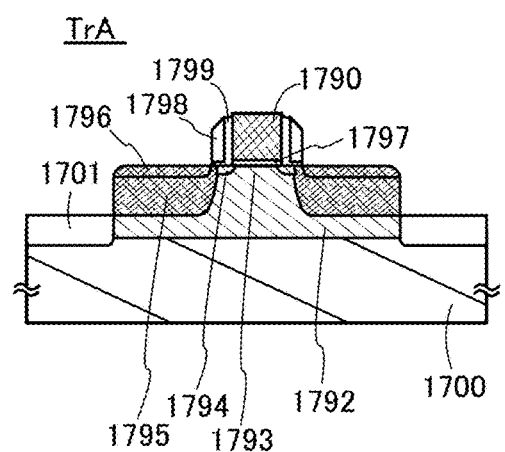
FIGS. 30A and 30B are cross-sectional views showing structure examples of a transistor.
Figure 30B:
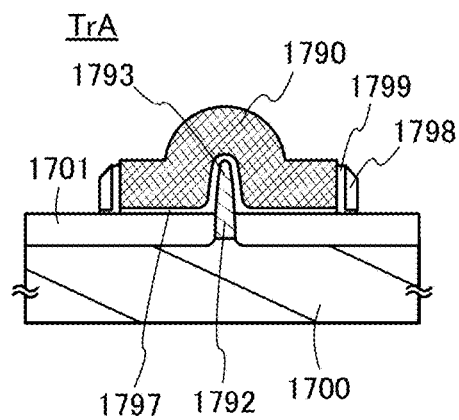

The transistor TrA is described in detail with reference to FIGS. 30A and 30B. FIG. 30A is a cross-sectional view of the transistor TrA in the channel length direction and FIG. 30B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like.

In the transistor TrA in FIG. 30B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 31A:
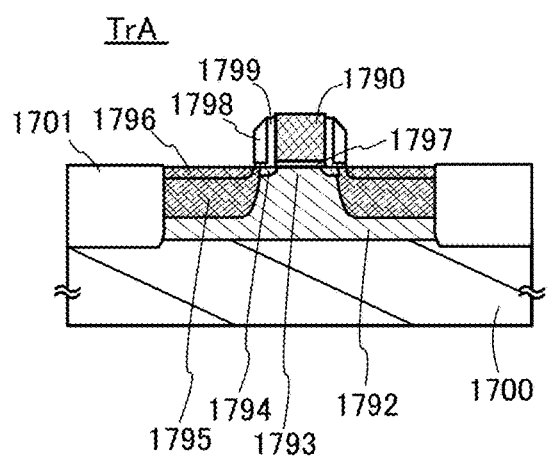
FIGS. 31A and 31B are cross-sectional views showing structure examples of a transistor.
Figure 31B:
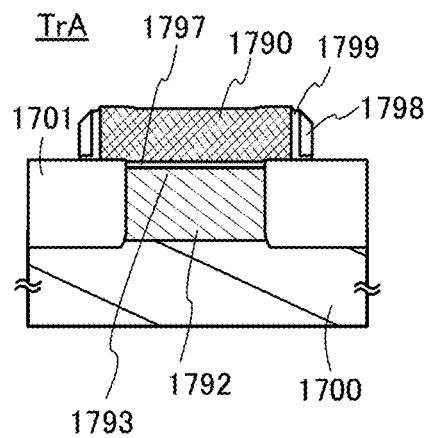

Note that the transistor TrA is not limited to the FIN-type transistor, and may be a planar-type transistor shown in FIGS. 31A and 31B. FIG. 31A is a cross-sectional view of the transistor TrA in the channel length direction and FIG. 31B is a cross-sectional view of the transistor TrA in the channel width direction. The reference numerals in FIGS. 31A and 31B are the same as those shown in FIGS. 30A and 30B.

In FIGS. 28A and 28B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 28A and 28B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

In the case where OS transistors are used as the transistors TA[1] to TA[m], the transistors TB[1] to TB[n], the transistors TC[1] to TC[p], the transistor TDA, and the transistor TDB described in Embodiments 1 to 3, the transistors TA[1] to TA[m], the transistors TB[1] to TB[n], the transistors TC[1] to TC[p], the transistor TDA, and the transistor TDB are preferably formed in the layer L4 or the layer L7.

In the case where Si transistors are used as the transistor Tr1, the transistor Tr2, the transistor TrL1, the transistor TrL2, the transistor TrR1, and the transistor TrR2 described in Embodiments 1 to 3, the transistor Tr1, the transistor Tr2, the transistor TrL1, the transistor TrL2, the transistor TrR1, and the transistor TrR2 are preferably formed in the layer L1.

In the case where OS transistors are used as the transistor Tr1, the transistor Tr2, the transistor TrL1, the transistor TrL2, the transistor TrR1, and the transistor TrR2 described in Embodiments 1 to 3, the transistor Tr1, the transistor Tr2, the transistor TrL1, the transistor TrL2, the transistor TrR1, and the transistor TrR2 are preferably formed in the layer L4 or the layer L7.

The capacitors CSA[1] to CSA[m], the capacitors CSB[1] to CSB[n], the capacitors CSC[1] to CSC[p], the capacitor CSDA, and the capacitor CSDB described in Embodiments 1 to 3 are preferably formed in the layer L11.

The capacitor CAL the capacitor CA2, the capacitor CB', the capacitor CB2, the capacitor CC1, and the capacitor CC2 described in Embodiments 1 to 3 are preferably formed in the layer L11.

In the case where a driver circuit around the semiconductor device CD is formed using an OS transistor, the OS transistor may be formed in the layer L4 or L7.

In the case where a driver circuit around the semiconductor device CD is formed using a Si transistor, the Si transistor may be formed in the layer L1.

With the structure shown in FIGS. 28A and 28B, the area occupied by the semiconductor device CD can be reduced, leading to higher integration of the memory cell.

Note that in the case where the semiconductor device CD shown in Embodiments 1 to 3 has the structure of FIGS. 28A and 28B, the numbers of the transistors (TrA, TrB, and TrC) and the capacitors (C1) are sometimes different from those shown in FIGS. 28A and 28B. In that case, the structure of FIGS. 28A and 28B can be changed as appropriate; for example, the numbers of the layers L4, L7, and L11 are increased or decreased, or an element is additionally provided in a layer.

<Cross-Sectional View 2>

All the OS transistors in the semiconductor device CD may be formed in the same layer. An example of such a case is shown in FIGS. 29A and 29B. Similarly to FIGS. 28A and 28B, FIG. 29A shows a cross section in a channel length direction of transistors included in the memory cells MC of the semiconductor device CD, and FIG. 29B shows a cross section in a channel width direction of the transistors included in the memory cells MC of the semiconductor device CD.

The cross-sectional views of FIGS. 29A and 29B are different from those of FIGS. 28A and 28B in that the layers L6 to L8 are omitted and the layer L9 is formed on the layer L5. For the other details in FIGS. 29A and 29B, the description of FIGS. 28A and 28B is referred to.

In the case where OS transistors are used as the transistors TA[1] to TA[m], the transistors TB[1] to TB[n], the transistors TC[1] to TC[p], the transistor TDA, and the transistor TDB described in Embodiments 1 to 3, the transistors TA[1] to TA[m], the transistors TB[1] to TB[n], the transistors TC[1] to TC[p], the transistor TDA, and the transistor TDB are preferably formed in the layer L4.

In the case where Si transistors are used as the transistor Tr1, the transistor Tr2, the transistor TrL1, the transistor TrL2, the transistor TrR1, and the transistor TrR2 described in Embodiments 1 to 3, the transistor Tr1, the transistor Tr2, the transistor TrL1, the transistor TrL2, the transistor TrR1, and the transistor TrR2 are preferably formed in the layer L1.

In the case where OS transistors are used as the transistor Tr1, the transistor Tr2, the transistor TrL1, the transistor TrL2, the transistor TrR1, and the transistor TrR2 described in Embodiments 1 to 3, the transistor Tr1, the transistor Tr2, the transistor TrL1, the transistor TrL2, the transistor TrR1, and the transistor TrR2 are preferably formed in the layer L4.

The capacitors CSA[1] to CSA[m], the capacitors CSB[1] to CSB[n], the capacitors CSC[1] to CSC[p], the capacitor CSDA, and the capacitor CSDB described in Embodiments 1 to 3 are preferably formed in the layer L11.

The capacitor CA1, the capacitor CA2, the capacitor CB1, the capacitor CB2, the capacitor CC1, and the capacitor CC2 described in Embodiments 1 to 3 are preferably formed in the layer L11.

In the case where a driver circuit around the semiconductor device CD is formed using an OS transistor, the OS transistor may be formed in the layer L4.

In the case where a driver circuit around the semiconductor device CD is formed using a Si transistor, the Si transistor may be formed in the layer L1.

With the structure shown in FIGS. 29A and 29B, the manufacturing process of the semiconductor device CD can be simplified.

Note that in the case where the semiconductor device CD shown in Embodiments 1 to 3 has the structure of FIGS. 29A and 29B, the numbers of the transistors (TrA, TrB, and TrC) and the capacitors (C1) are sometimes different from those shown in FIGS. 29A and 29B. In that case, the structure of FIGS. 29A and 29B may be changed as appropriate; for example, the numbers of the layers L4 and L11 are increased or decreased, and an element is additionally provided in a layer.

Note that this embodiment can be combined with any of the other embodiments in this specification as appropriate.

Embodiment 8

Described in this embodiment are structures of an oxide semiconductor film capable of being used for the OS transistors described in the above embodiments.

<Structure of Oxide Semiconductor>

Structures of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 32A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 32B, a peak is not clearly observed. In contrast, in the case where single crystal InGaZnO$_4$ is subjected to φ scan with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 32D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32E shows a diffraction pattern obtained in such a manner that an electron beam with a probe diameter of 300 nm is incident on the same sample in a direction perpendicular to the sample surface. As shown in FIG. 32E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 32E is considered to be derived from the (010) plane, the (100) plane, and the like of the InGaZnO$_4$ crystal. The second ring in FIG. 32E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 33A:
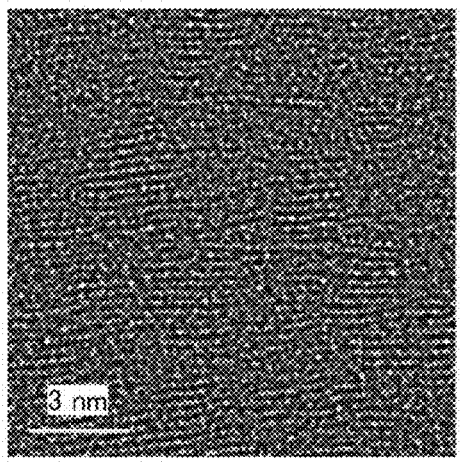
FIGS. 33A to 33E show a cross-sectional TEM image and plan-view TEM images of a CAAC-OS and images obtained through analysis thereof.

FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a C$_S$-corrected high-resolution TEM image. The C$_S$-corrected high-resolution TEM image can be observed with, for example, an atomic resolution analytical electron microscope JEM-ARM200F manufactured by JEOL Ltd.

FIG. 33A shows pellets in which metal atoms are arranged in a layered manner. FIG. 33A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 33B:
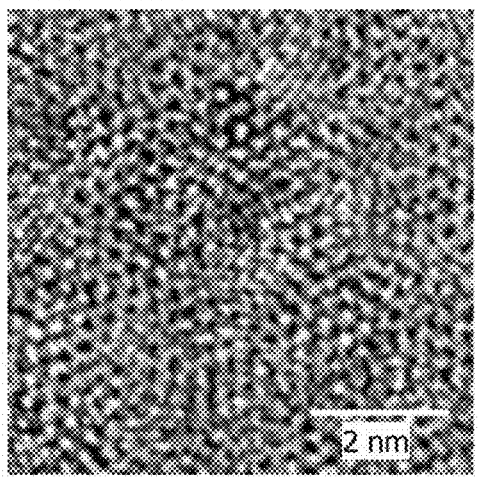
Figure 33C:
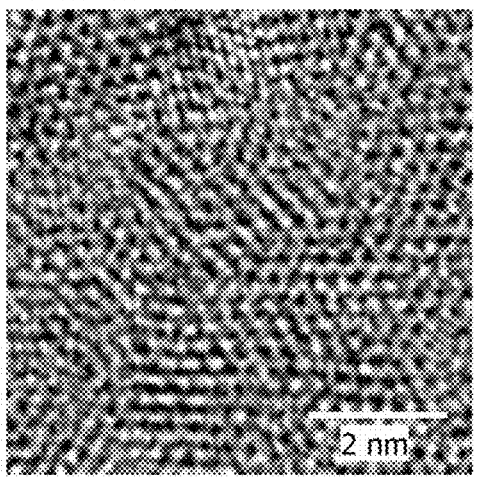
Figure 33D:
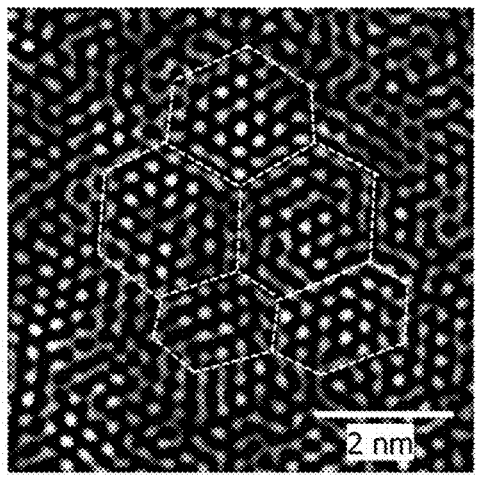
Figure 33E:
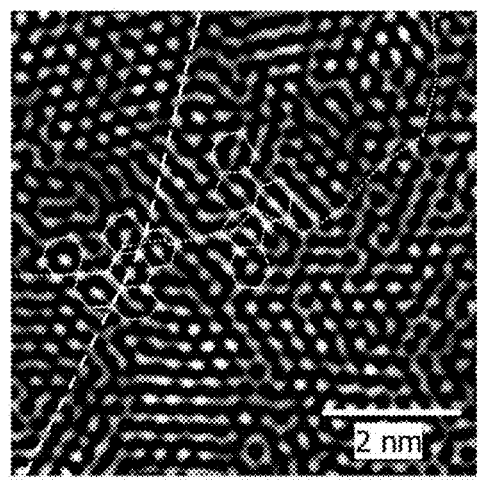

FIGS. 33B and 33C show C$_S$-corrected high-resolution TEM images of a plane of the CAAC-OS observed from a direction substantially perpendicular to the sample surface. FIGS. 33D and 33E are images obtained through image processing of FIGS. 33B and 33C. The method of image processing is as follows. The image in FIG. 33B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a C$_S$-corrected high-resolution TEM image from which a periodic component is extracted, and shows a lattice arrangement.

In FIG. 33D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 33E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, heptagon, and/or the like can be formed. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 34A:
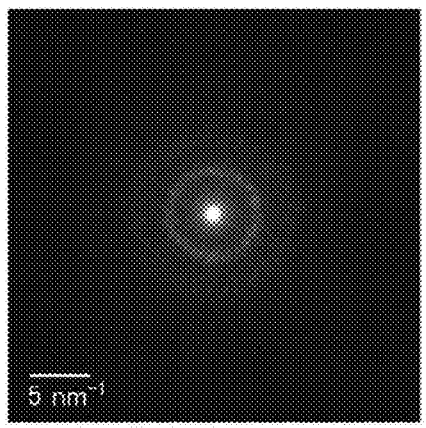
FIGS. 34A to 34D show electron diffraction patterns and a cross-sectional TEM image of an nc-OS.
Figure 34B:
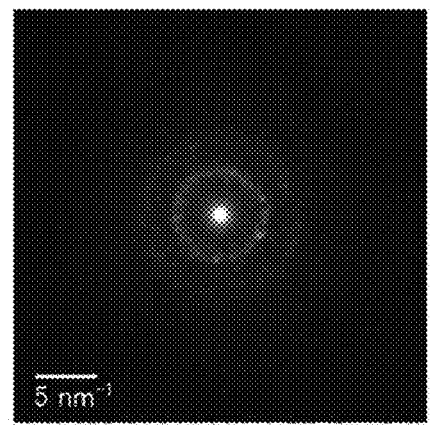

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 34A is observed. FIG. 34B shows a diffraction pattern obtained when an electron beam with a probe diameter of 1 nm is incident on the same sample. As shown in FIG. 34B, a plurality of spots are observed in a ring-like region. In other words, ordering in an nc-OS is not observed with an electron beam with a probe diameter of 50 nm but is observed with an electron beam with a probe diameter of 1 nm.

Figure 34C:
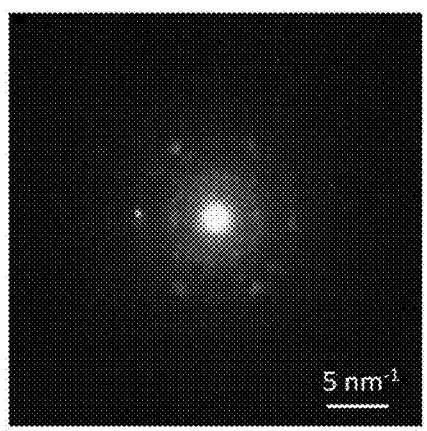

Furthermore, an electron diffraction pattern in which spots are arranged in an approximately hexagonal shape is observed in some cases as shown in FIG. 34C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 34D:
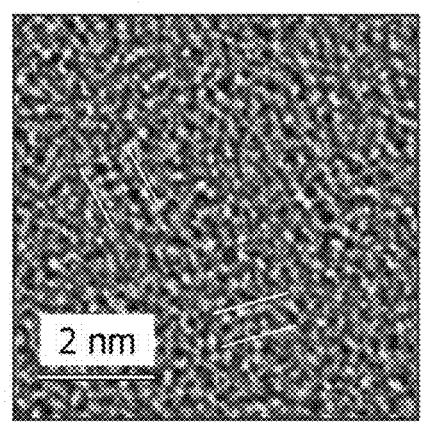

FIG. 34D shows a $C_S$-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 34D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 35A:
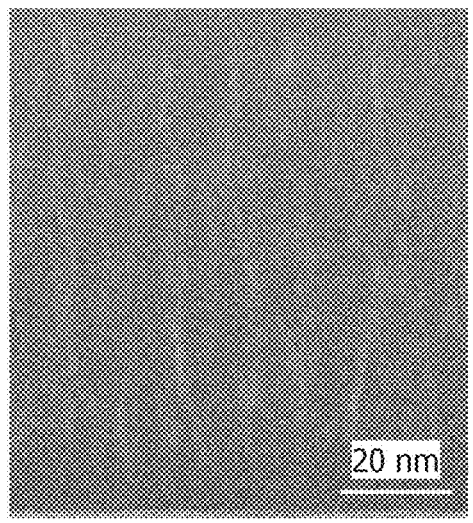
FIGS. 35A and 35B show cross-sectional TEM images of an a-like OS.
Figure 35B:
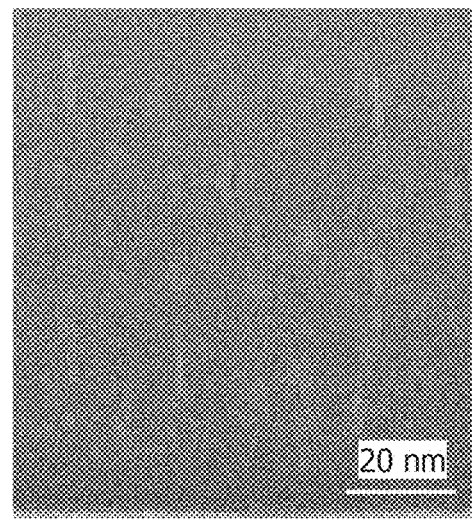

FIGS. 35A and 35B are high-resolution cross-sectional TEM images of an a-like OS. FIG. 35A is the high-resolution cross-sectional TEM image of the a-like OS at the start of the electron irradiation. FIG. 35B is the high-resolution cross-sectional TEM image of a-like OS after the electron ($e^-$) irradiation at $4.3 \times 10^8$ $e^-/nm^2$. FIGS. 35A and 35B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 36:
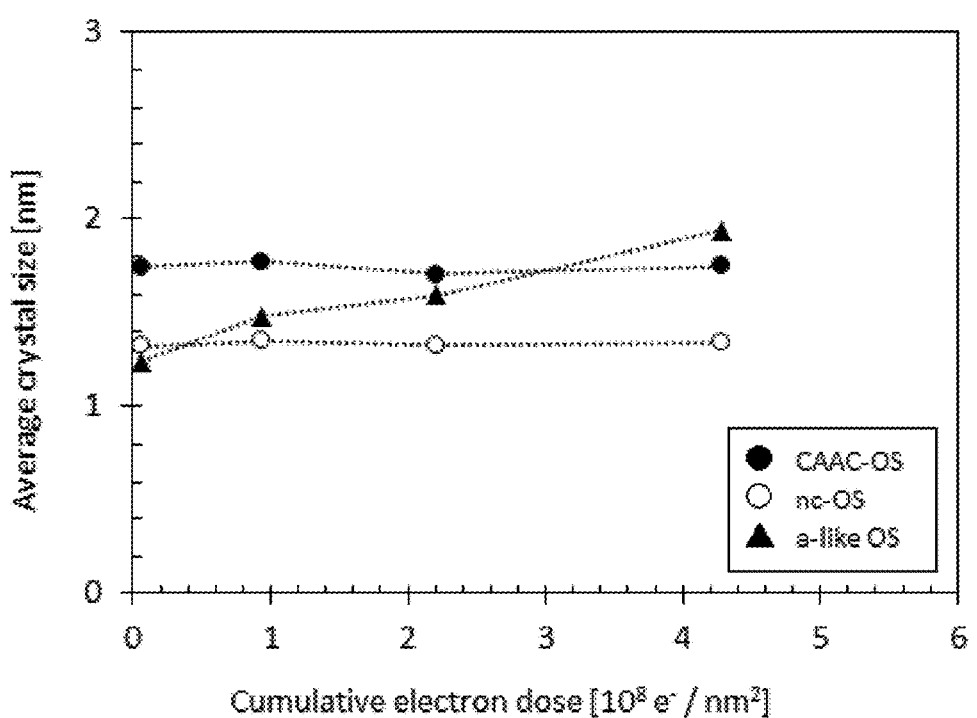
FIG. 36 shows a change of crystal parts of an In—Ga—Zn oxide owing to electron irradiation.

FIG. 36 shows change in the average size of crystal parts (at 22 points to 30 points) in each sample. Note that the crystal part size corresponds to the length of a lattice fringe. FIG. 36 indicates that the crystal part size in the a-like OS increases with an increase in the cumulative electron dose in obtaining TEM images, for example. As shown in FIG. 36, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 36, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In: Ga: Zn=1:1:1, the density of single crystal $InGaZnO_4$ with a rhombohedral crystal structure is 6.357 $g/cm^3$. Accordingly, in the case of the oxide semiconductor having an atomic ratio of In: Ga: Zn=1:1:1, the density of the a-like OS is higher than or equal to 5.0 $g/cm^3$ and lower than 5.9 $g/cm^3$. For example, in the case of the oxide semiconductor having an atomic ratio of In: Ga:

Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the concentration of impurity in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the concentration of impurity or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the Id-Vg characteristics of the transistor can be regarded as a substantially intrinsic semiconductor. Furthermore, an oxide semiconductor that has a high electron affinity and thus has a narrow bandgap so as to increase the density of thermally excited electrons (carriers) can be regarded as a substantially intrinsic semiconductor. Note that a transistor using an oxide semiconductor with higher electron affinity has lower threshold voltage.

The aforementioned oxide semiconductor with an increased carrier density has somewhat n-type conductivity; thus, it can be referred to as a "Slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Note that this embodiment can be combined with any of the other embodiments in this specification as appropriate.

Embodiment 9

In this embodiment, application examples of the semiconductor device described in the above embodiments to an electronic component and to an electronic device including the electronic component will be described with reference to FIGS. 37A and 37B and FIG. 38A to 38F.

<Electronic Component>

Figure 37A:
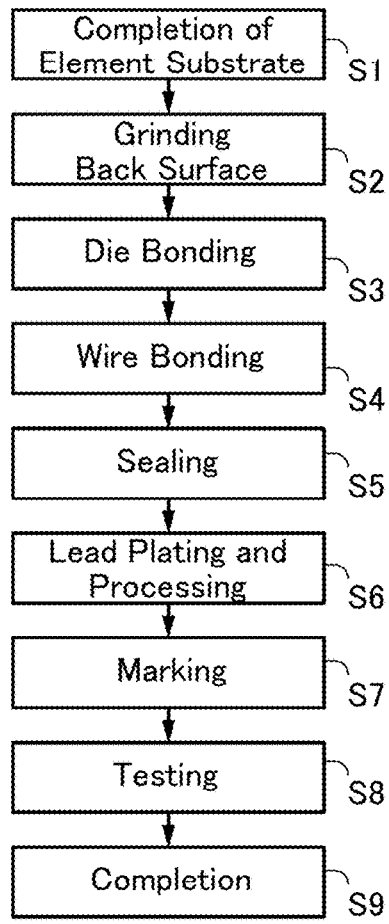
FIG. 37A is a flow chart showing an example of a method for manufacturing an electronic component.

FIG. 37A shows an example in which the semiconductor device described in the above embodiments is used to manufacture an electronic component. Note that the electronic component is also referred to as a semiconductor package or an IC package. This electronic component has various standards and names depending on the direction and the shape of terminals. Therefore, an example of the electronic component will be described in this embodiment.

A semiconductor device including the transistors shown in Embodiment 1 is completed through an assembly process (post-process) of integrating detachable components on a printed board.

The post-process can be completed through the steps in FIG. 37A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5).

Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component includes the semiconductor device described in the above embodiments. Thus, a highly reliable electronic component can be obtained.

Figure 37B:
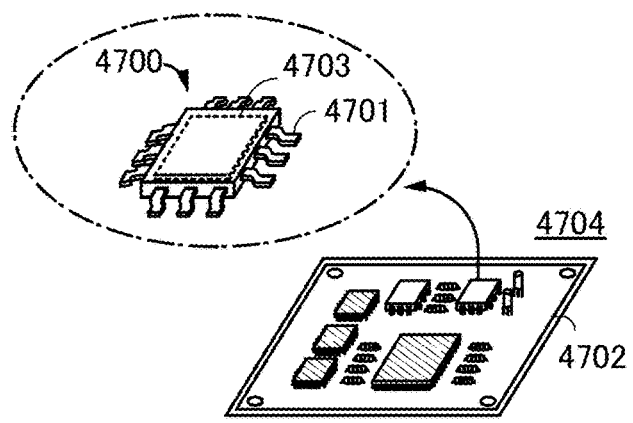
FIG. 37B is a perspective view showing an example of an electronic component.

FIG. 37B is a perspective schematic diagram illustrating a quad flat package (QFP) as an example of the completed electronic component. An electronic component 4700 in FIG. 37B includes a lead 4701 and a circuit portion 4703. The electronic component 4700 in FIG. 37B is mounted on a printed board 4702, for example. A plurality of electronic components 4700 which are combined and electrically connected to each other over the printed board 4702 can be mounted on an electronic device. A completed circuit board 4704 is provided in an electronic device or the like.

<Electronic Device>

Next, electronic devices including the aforementioned electronic component will be described.

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), vending machines, and medical devices. FIGS. 38A to 38F illustrate specific examples of these electronic devices.

Figure 38A:
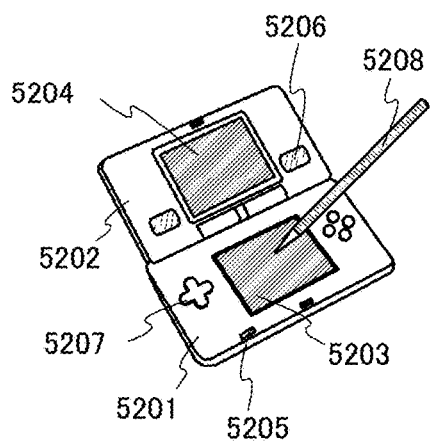
FIGS. 38A to 38F show electronic devices of one embodiment of the present invention.

FIG. 38A illustrates a portable game machine which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 38A has the two display portions 5203 and 5204, the number of display portions included in a portable game machine is not limited to two.

Figure 38B:
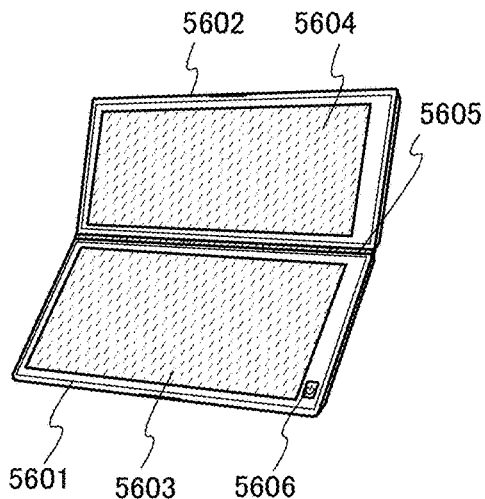

FIG. 38B illustrates a portable information terminal which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as the first display portion 5603 and/or the second display portion 5604. Note that the position input function can be added by providing a touch panel in a display device. Alternatively, the position input function can be added by providing a photoelectric conversion element called a photosensor in a pixel portion of a display device.

Figure 38C:
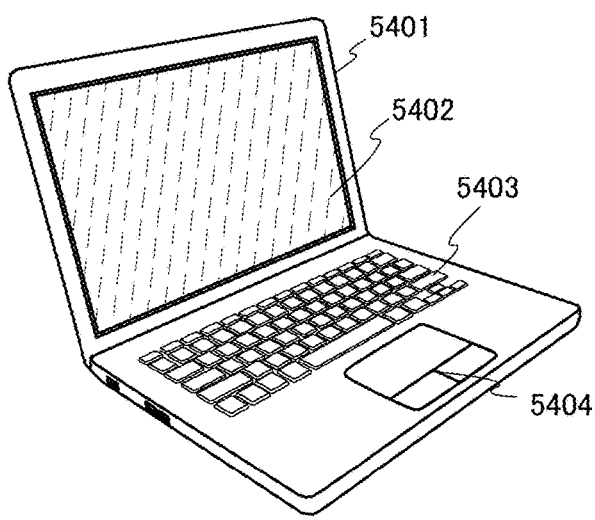

FIG. 38C illustrates a laptop personal computer which includes a housing 5401, a display portion 5402, a keyboard 5403, a pointing device 5404, and the like. The semiconductor device of one embodiment of the present invention can be used for a variety of integrated circuits included in laptop personal computers.

Figure 38D:
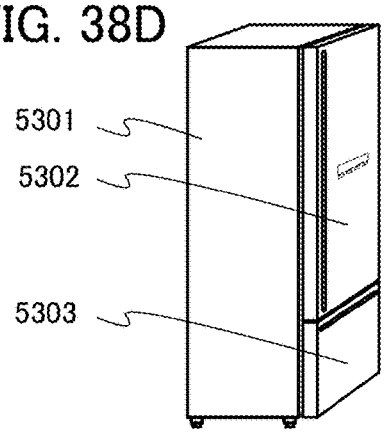

FIG. 38D illustrates an electric refrigerator-freezer which includes a housing 5301, a refrigerator door 5302, a freezer door 5303, and the like. The semiconductor device of one embodiment of the present invention can be used for a variety of integrated circuits included in electric refrigerator-freezers.

Figure 38E:
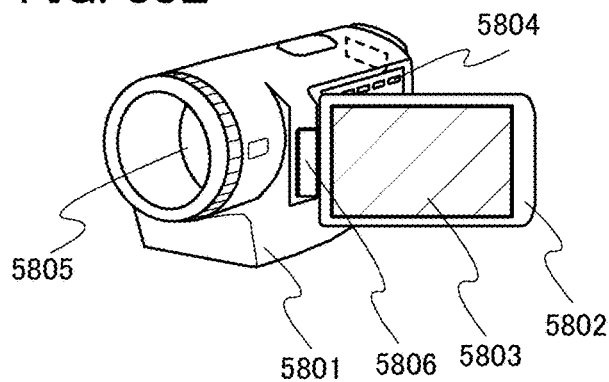

FIG. 38E illustrates a video camera which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 38F:
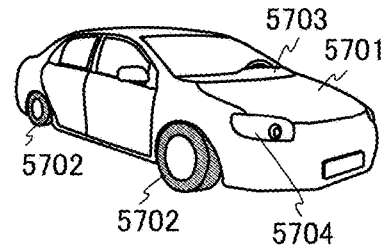
Figure 39A:
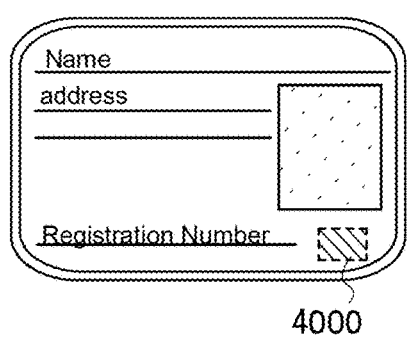
FIGS. 39A to 39F are perspective views each illustrating a usage example of an RFID tag.
Figure 39B:
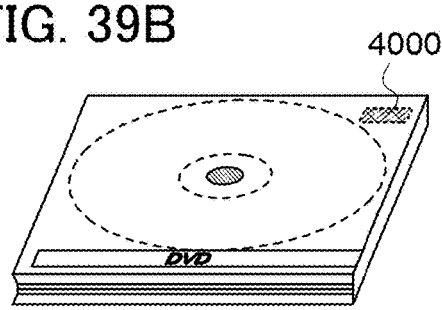
Figure 39C:
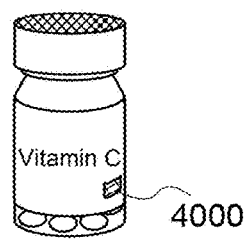
Figure 39D:
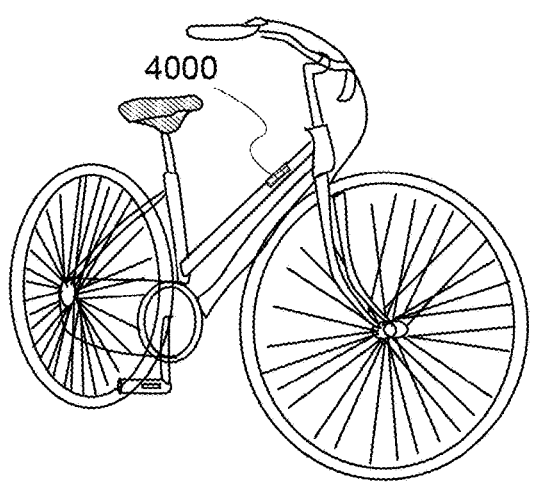
Figure 39E:
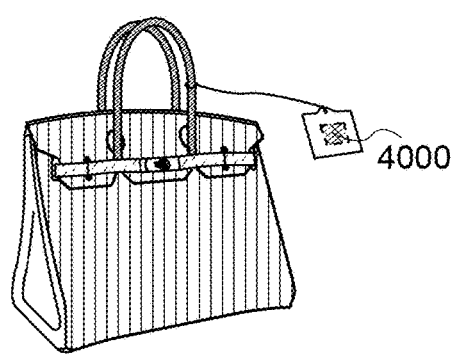
Figure 39F:
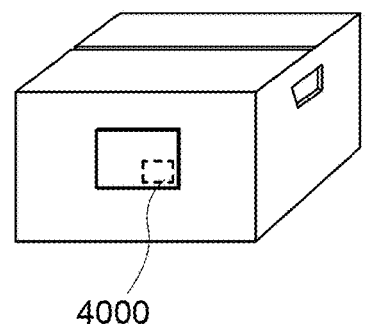

FIG. 38F illustrates a car which includes a car body 5701, wheels 5702, a dashboard 5703, lights 5704, and the like. The semiconductor device of one embodiment of the present invention can be used for a variety of integrated circuits included in cars.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element using a carbon nanotube, a liquid crystal element, electronic ink, an electrowetting element, an electrophoretic element, a display element using microelectromechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by an electric or magnetic effect may be included. Examples of a display device using an EL element include an EL display. Examples of a display device using electron emitters include a field emission display (FED), and an SED-type flat panel display (SED: surface-conduction electron-emitter display). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink, Electronic Liquid Powder (registered trademark), or electrophoretic elements include electronic paper. Examples of a display device using a quantum dot in each pixel include a quantum dot display. Note that the quantum dots may be provided in part of a backlight, instead of being used as a display element. With the use of the quantum dots, an image with high color purity can be displayed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display device using MEMS, a dry agent may be provided in a space where a display element is sealed (or between an element substrate over which the display element is placed and a counter substrate opposed to the element substrate, for example). With the dry agent, malfunction or degradation of the MEMS or the like due to moisture can be prevented.

Note that this embodiment can be combined with any of the other embodiments in this specification as appropriate.

Embodiment 10

In this embodiment, application examples of an RF tag that can include the memory device of one embodiment of the present invention will be described with reference to FIGS. 39A to 39F. The RF tag is widely used and can be provided for, for example, products such as bills, coins, securities, bearer bonds, documents (e.g., driver's licenses or resident's cards, see FIG. 39A), recording media (e.g., DVD or video tapes, see FIG. 39B), packaging containers (e.g., wrapping paper or bottles, see FIG. 39C), vehicles (e.g., bicycles, see FIG. 39D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 39E and 39F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

(Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be omitted in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention described above, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is exaggerated for description convenience in some cases; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a microelectromechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of the effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is possible.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-096294 filed with Japan Patent Office on May 11, 2015, and Japanese Patent Application serial no. 2015-097665 filed with Japan Patent Office on May 12, 2015, the entire contents of which are hereby incorporated by reference.

What is claimed is:

1. A semiconductor device comprising:
    a circuit; and
    a first memory cell,
    wherein the circuit includes a first transistor, a second transistor, first to sixth capacitors, first to fourth wirings, a first sense amplifier, and a second sense amplifier,
    wherein the first sense amplifier includes a first input/output terminal and a second input/output terminal,
    wherein the second sense amplifier includes a third input/output terminal and a fourth input/output terminal,
    wherein the first memory cell is over the first sense amplifier and the second sense amplifier,
    wherein the first wiring is electrically connected to a first electrode of the first capacitor, one of a source and a drain of the first transistor, a first electrode of the fifth capacitor, and the first input/output terminal,
    wherein the second wiring is electrically connected to a first electrode of the second capacitor, one of a source and a drain of the second transistor, a first electrode of the sixth capacitor, and the second input/output terminal,
    wherein the third wiring is electrically connected to a first electrode of the third capacitor, the other of the source and the drain of the first transistor, a second electrode of the sixth capacitor, and the third input/output terminal,
    wherein the fourth wiring is electrically connected to a first electrode of the fourth capacitor, the other of the source and the drain of the second transistor, a second electrode of the fifth capacitor, and the fourth input/output terminal, and
    wherein the first memory cell is electrically connected to the first wiring.

2. The semiconductor device according to claim 1, further comprising a first dummy cell,
    wherein the first dummy cell has the same structure as the first memory cell,
    wherein the first dummy cell is over the first sense amplifier and the second sense amplifier, and
    wherein the first dummy cell is electrically connected to the third wiring.

3. The semiconductor device according to claim 1, further comprising a second memory cell,
    wherein the second memory cell has the same structure as the first memory cell,
    wherein the second memory cell is over the first sense amplifier and the second sense amplifier, and
    wherein the second memory cell is electrically connected to the third wiring.

4. The semiconductor device according to claim 3, further comprising a first dummy cell and a second dummy cell,
    wherein the first dummy cell and the second dummy cell each have the same structure as the first memory cell,
    wherein the first dummy cell and the second dummy cell are over the first sense amplifier and the second sense amplifier,
    wherein the first dummy cell is electrically connected to the third wiring, and
    wherein the second dummy cell is electrically connected to the first wiring.

5. The semiconductor device according to claim 1,
    wherein the first transistor and the second transistor are over the first sense amplifier and the second sense amplifier, and
    wherein at least one of the first transistor and the second transistor includes an oxide semiconductor in a channel formation region.

6. The semiconductor device according to claim 1,
    wherein at least one of the first transistor and the second transistor includes silicon in a channel formation region.

7. The semiconductor device according to claim 3,
    wherein the first memory cell and the second memory cell each include a seventh capacitor, and
    wherein the first to seventh capacitors are over the first sense amplifier and the second sense amplifier.

8. A semiconductor device comprising:
    a circuit; and
    first to third memory cells,
    wherein the circuit includes first to fourth transistors, first to eighth capacitors, first to sixth wirings, a first sense amplifier, and a second sense amplifier,
    wherein the first sense amplifier includes a first input/output terminal and a second input/output terminal,
    wherein the second sense amplifier includes a third input/output terminal and a fourth input/output terminal,
    wherein the first to third memory cells are over the first sense amplifier and the second sense amplifier,
    wherein the first wiring is electrically connected to a first electrode of the first capacitor, one of a source and a drain of the first transistor, a first electrode of the seventh capacitor, and the first input/output terminal,
    wherein the second wiring is electrically connected to a first electrode of the second capacitor, one of a source and a drain of the second transistor, a first electrode of the eighth capacitor, and the second input/output terminal,
    wherein the third wiring is electrically connected to a first electrode of the third capacitor, the other of the source and the drain of the first transistor, and one of a source and a drain of the third transistor,
    wherein the fourth wiring is electrically connected to a first electrode of the fourth capacitor, the other of the source and the drain of the second transistor, and one of a source and a drain of the fourth transistor,
    wherein the fifth wiring is electrically connected to a first electrode of the fifth capacitor, the other of the source and the drain of the third transistor, a second electrode of the eighth capacitor, and the third input/output terminal,
    wherein the sixth wiring is electrically connected to a first electrode of the sixth capacitor, the other of the source and the drain of the fourth transistor, a second electrode of the seventh capacitor, and the fourth input/output terminal,
    wherein the first memory cell is electrically connected to the first wiring, wherein the second memory cell is electrically connected to the third wiring, and wherein the third memory cell is electrically connected to the fifth wiring.

9. The semiconductor device according to claim 8, wherein the first to fourth transistors are over the first sense amplifier and the second sense amplifier, and wherein at least one of the first to fourth transistors includes an oxide semiconductor in a channel formation region.

10. The semiconductor device according to claim 8, wherein at least one of the first to fourth transistors includes silicon in a channel formation region.

11. The semiconductor device according to claim 8, wherein the first to third memory cells each include a ninth capacitor, and wherein the first to ninth capacitors are over the first sense amplifier and the second sense amplifier.

12. The semiconductor device according to claim 8, wherein the first to third memory cells each include a fifth transistor, and wherein the fifth transistor includes an oxide semiconductor in a channel formation region.

13. An electronic component comprising:

the semiconductor device according to claim 8, and a processor core.

\* \* \* \* \*